(12) United States Patent
Togo et al.

(10) Patent No.: US 11,967,626 B2
(45) Date of Patent: Apr. 23, 2024

(54) FIELD EFFECT TRANSISTORS WITH GATE FINS AND METHOD OF MAKING THE SAME

(71) Applicant: SANDISK TECHNOLOGIES LLC, San Jose, CA (US)

(72) Inventors: Mitsuhiro Togo, Yokkaichi (JP); Takashi Kobayashi, Yokkaichi (JP); Sudarshan Narayanan, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 304 days.

(21) Appl. No.: 17/474,699

(22) Filed: Sep. 14, 2021

(65) Prior Publication Data
US 2023/0079098 A1    Mar. 16, 2023

(51) Int. Cl.
| | | |
|---|---|---|
| H01L 29/00 | (2006.01) | |
| H01L 21/306 | (2006.01) | |
| H01L 21/308 | (2006.01) | |
| H01L 29/40 | (2006.01) | |
| H01L 29/423 | (2006.01) | |
| H10B 41/41 | (2023.01) | |
| H10B 43/40 | (2023.01) | |

(52) U.S. Cl.
CPC .... *H01L 29/4236* (2013.01); *H01L 21/30608* (2013.01); *H01L 21/308* (2013.01); *H01L 29/401* (2013.01); *H01L 29/42376* (2013.01); *H10B 41/41* (2023.02); *H10B 43/40* (2023.02)

(58) Field of Classification Search
CPC .......... H01L 29/4236; H01L 29/42376; H01L 29/4238
See application file for complete search history.

(56) References Cited

U.S. PATENT DOCUMENTS

| | | |
|---|---|---|
| 6,303,448 B1 | 10/2001 | Chang et al. |
| 6,358,800 B1 | 3/2002 | Tseng |
| 7,400,013 B1 | 7/2008 | Ariyoshi |
| 7,576,389 B2 | 8/2009 | Tanaka |
| 8,288,231 B1 | 10/2012 | Liao et al. |
| 8,552,492 B2 | 10/2013 | Sanada et al. |
| 8,859,367 B2 | 10/2014 | Mathew et al. |

(Continued)

FOREIGN PATENT DOCUMENTS

WO    WO2020-263338 A1    12/2020

OTHER PUBLICATIONS

International Search Report and Written Opinion of the International Searching Authority for International Patent Application No. PCT/US2022/028601, dated Sep. 13, 2022, 14 pages.

(Continued)

*Primary Examiner* — Reema Patel
(74) *Attorney, Agent, or Firm* — THE MARBURY LAW GROUP PLLC

(57) ABSTRACT

A field effect transistor includes at least one line trench extending downward from a top surface of a channel region which laterally surrounds or underlies the at least one line trench, a gate dielectric contacting all surfaces of the at least one line trench and including a planar gate dielectric portion that extends over an entirety of a top surface of the channel region, a gate electrode, a source region, and a drain region.

3 Claims, 38 Drawing Sheets

(56) References Cited

U.S. PATENT DOCUMENTS

| | | | |
|---|---|---|---|
| 9,859,422 | B2 | 1/2018 | Nishikawa et al. |
| 10,115,735 | B2 | 10/2018 | Amano et al. |
| 10,224,407 | B2 | 3/2019 | Chowdhury et al. |
| 10,256,099 | B1 | 4/2019 | Akaiwa et al. |
| 10,355,017 | B1 | 7/2019 | Nakatsuji et al. |
| 10,355,100 | B1 | 7/2019 | Ueda et al. |
| 10,770,459 | B2 | 9/2020 | Iwata et al. |
| 10,910,020 | B1 | 2/2021 | Kodate et al. |
| 11,004,974 | B1 | 5/2021 | Takimoto |
| 2002/0060339 | A1 | 5/2002 | Maruoka |
| 2004/0149680 | A1 | 8/2004 | Ohmi |
| 2005/0035425 | A1 | 2/2005 | Ohmi |
| 2005/0040499 | A1 | 2/2005 | Ohmi |
| 2006/0017099 | A1 | 1/2006 | Paik |
| 2006/0183286 | A1 | 8/2006 | Lee |
| 2007/0264771 | A1 | 11/2007 | Ananthan et al. |
| 2008/0128800 | A1 | 6/2008 | Song et al. |
| 2009/0163010 | A1 | 6/2009 | Oh et al. |
| 2009/0273029 | A1 | 11/2009 | Tien et al. |
| 2010/0078757 | A1 | 4/2010 | Eun |
| 2011/0109828 | A1 | 5/2011 | Kim et al. |
| 2011/0180869 | A1* | 7/2011 | Sanada ............... H01L 29/7834 257/334 |
| 2015/0243748 | A1 | 8/2015 | Pulugurtha et al. |
| 2016/0071974 | A1* | 3/2016 | Laven ................ H01L 29/0696 257/334 |
| 2016/0351709 | A1 | 12/2016 | Nishikawa et al. |
| 2018/0247954 | A1 | 8/2018 | Amano et al. |
| 2018/0248013 | A1 | 8/2018 | Chowdhury et al. |
| 2018/0286960 | A1 | 10/2018 | Huo et al. |
| 2018/0331118 | A1 | 11/2018 | Amano |
| 2019/0081170 | A1* | 3/2019 | Kumagai ............ H01L 27/088 |
| 2019/0296012 | A1 | 9/2019 | Iwata et al. |
| 2021/0249523 | A1 | 8/2021 | Ghani et al. |

OTHER PUBLICATIONS

U.S. Appl. No. 16/809,798, filed Mar. 5, 2020, SanDisk Technologies, LLC.
U.S. Appl. No. 16/901,091, filed Jun. 15, 2020, SanDisk Technologies, LLC.
U.S. Appl. No. 17/007,761, filed Aug. 28, 2020, SanDisk Technologies, LLC.
U.S. Appl. No. 17/007,823, filed Aug. 31, 2020, SanDisk Technologies, LLC.
U.S. Appl. No. 17/063,084, filed Oct. 5, 2020, SanDisk Technologies, LLC.
U.S. Appl. No. 17/063,145, filed Oct. 5, 2020, SanDisk Technologies, LLC.
U.S. Appl. No. 17/063,182, filed Oct. 5, 2020, SanDisk Technologies, LLC.
U.S. Appl. No. 17/188,271, filed Mar. 1, 2021, SanDisk Technologies, LLC.
U.S. Appl. No. 17/316,015, filed May 10, 2021, SanDisk Technologies, LLC.
U.S. Appl. No. 17/316,079, filed May 10, 2021, SanDisk Technologies, LLC.
U.S. Appl. No. 17/348,305, filed Jun. 15, 2021, SanDisk Technologies, LLC.
U.S. Appl. No. 17/348,328, filed Jun. 15, 2021, SanDisk Technologies, LLC.
U.S. Appl. No. 17/362,034, filed Jun. 29, 2021, SanDisk Technologies, LLC.
U.S. Appl. No. 17/362,121, filed Jun. 29, 2021, SanDisk Technologies, LLC.
Togo, M. et al., "Field Effect Transistors With Gate Fins And Method Of Making The Same," U.S. Appl. No. 17/474,760, filed Sep. 14, 2021.
USPTO Office Communication, Non-Final Office Action for U.S. Appl. No. 17/474,760, dated Jul. 28, 2023, 22 pages.
USPTO Office Communication, Non-Final Office Action for U.S. Appl. No. 17/474,760, dated Dec. 7, 2023, 25 pages.

* cited by examiner

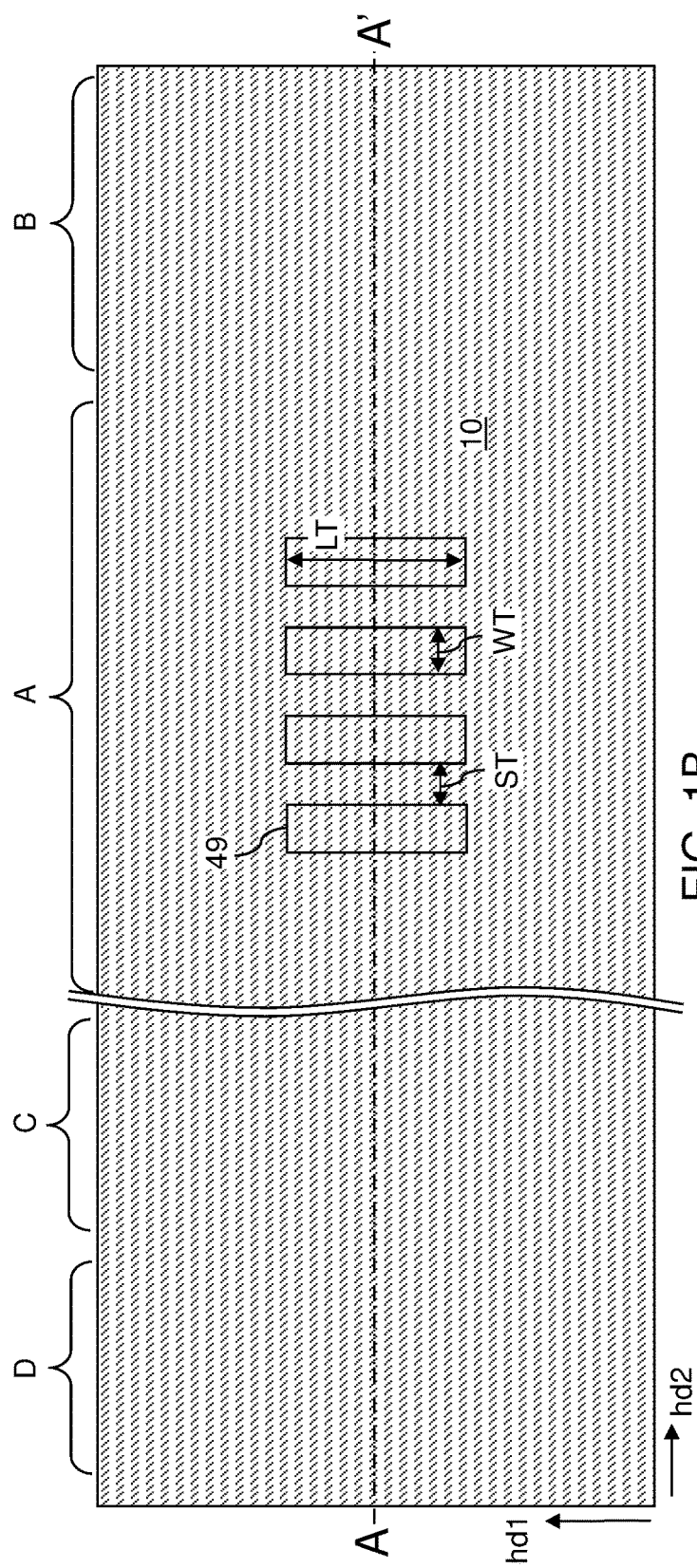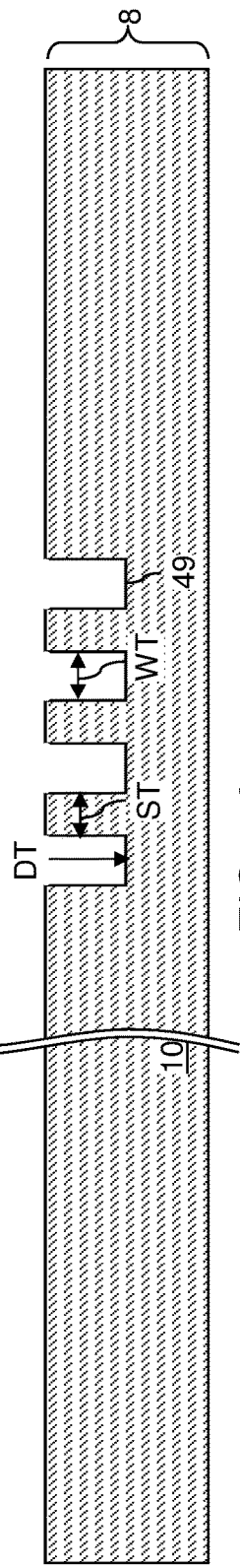
FIG. 1B
FIG. 1A

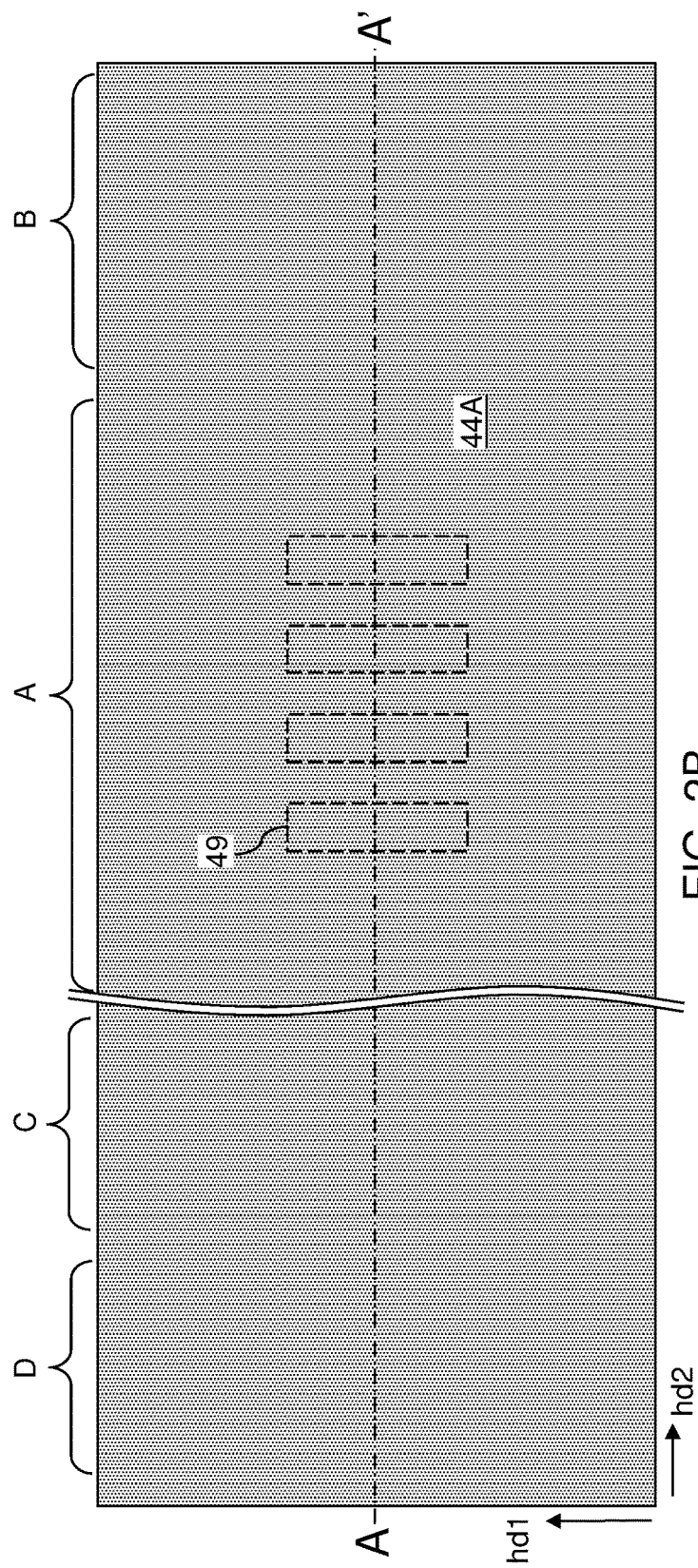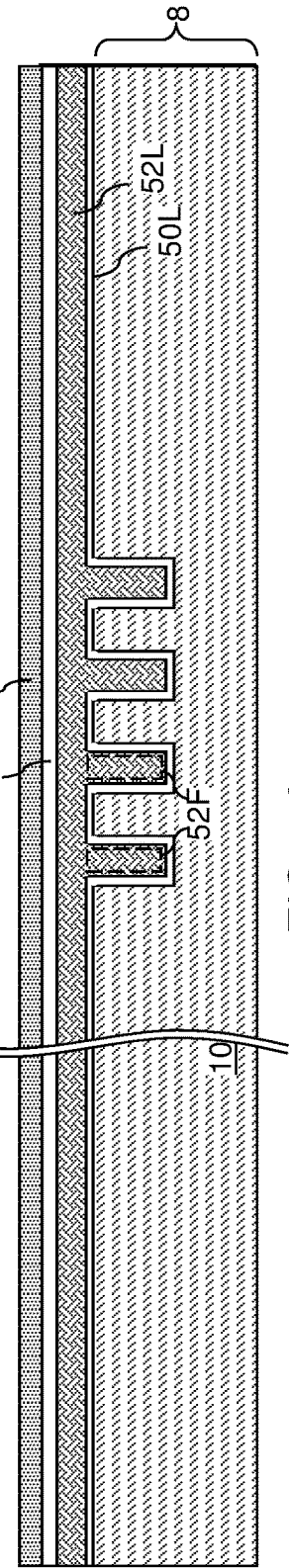

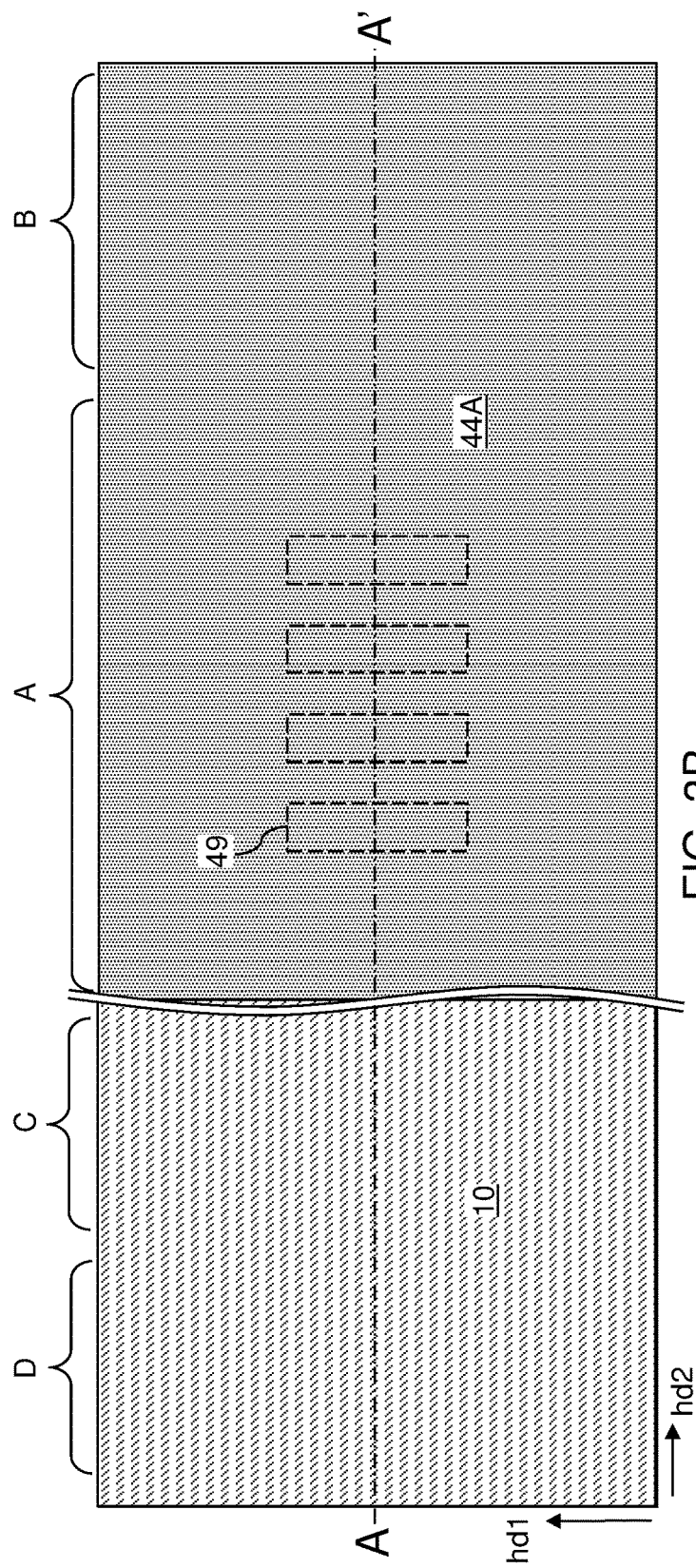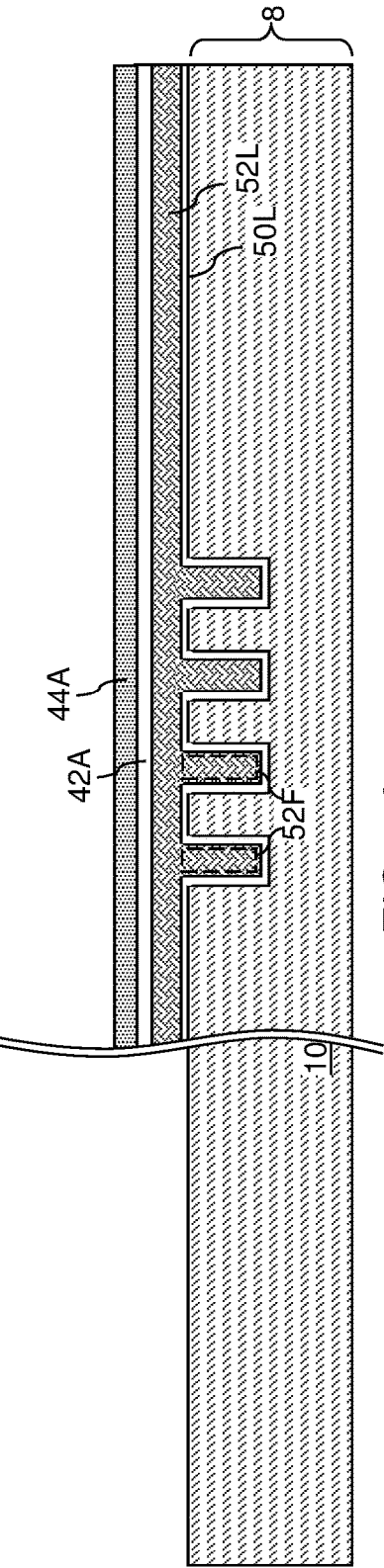

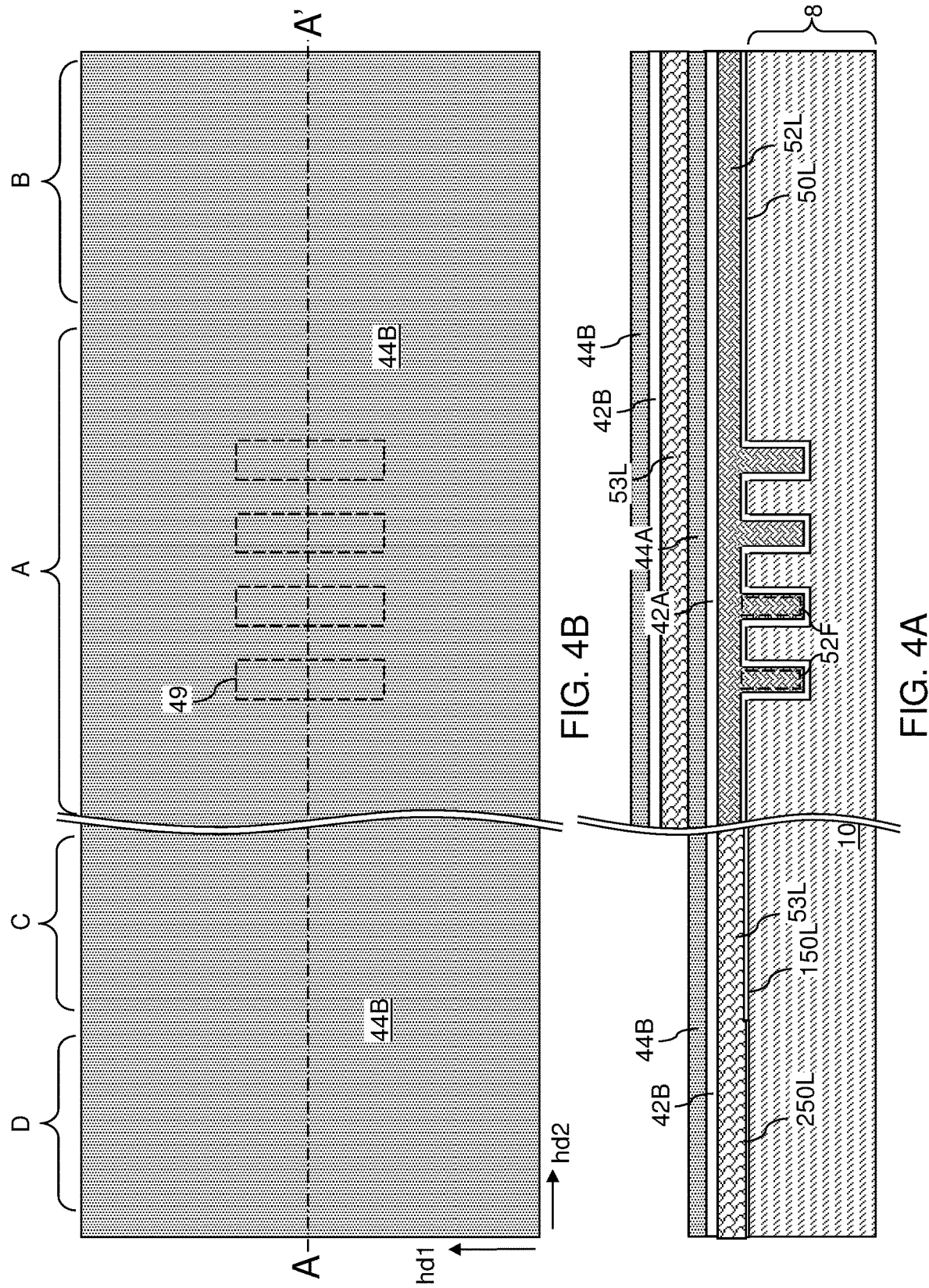

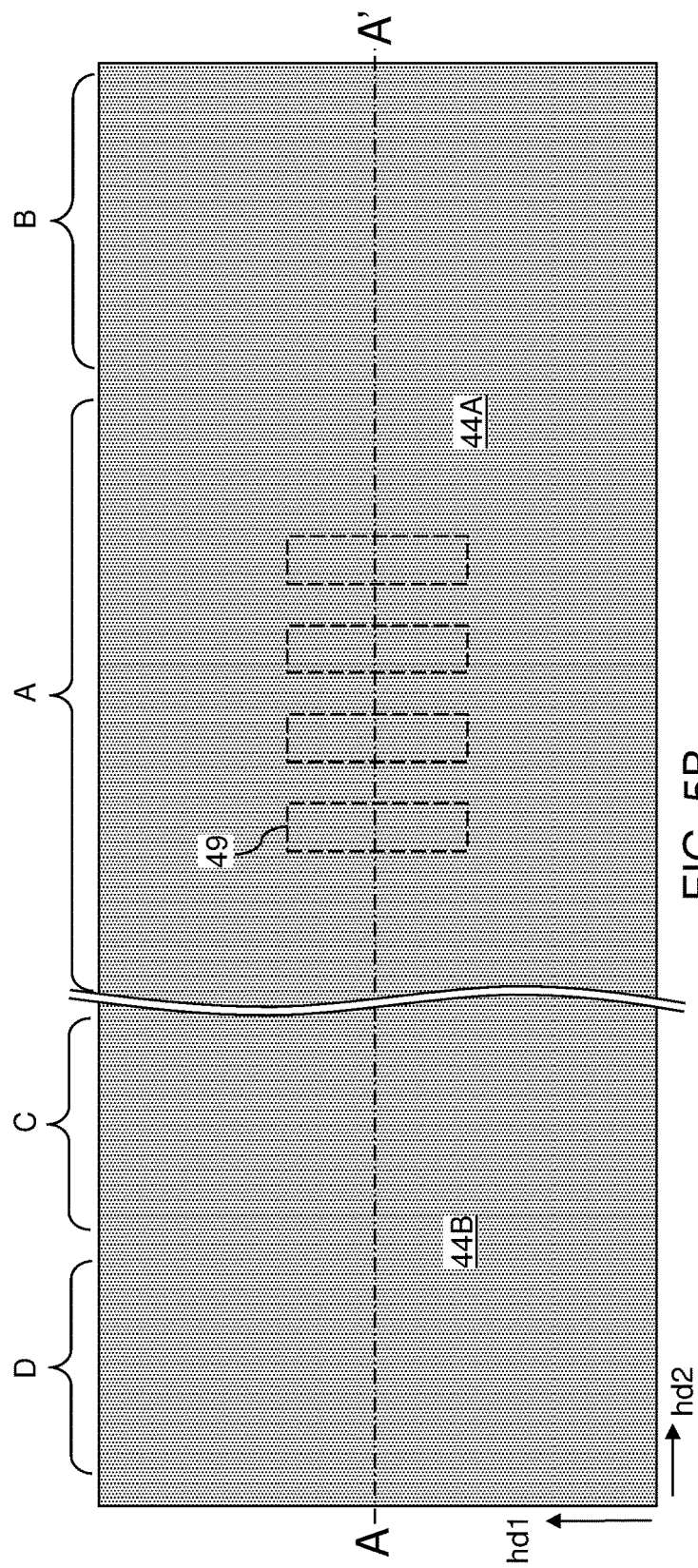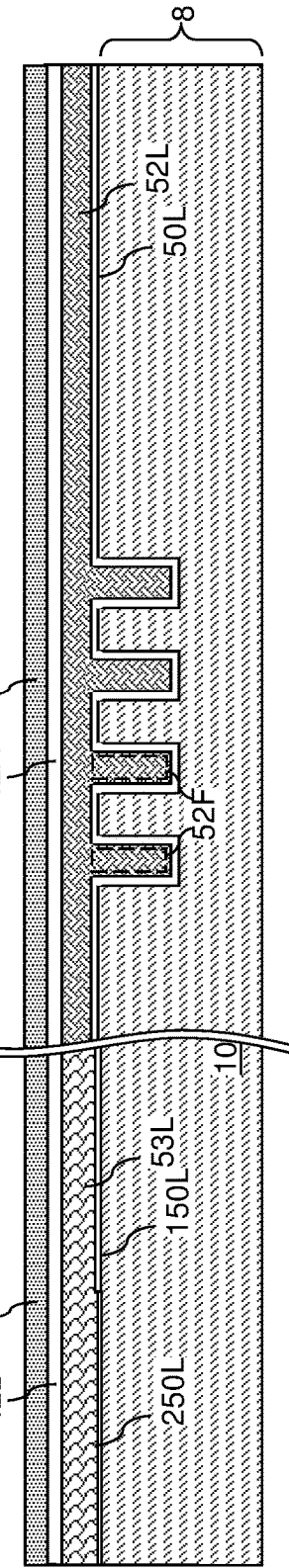

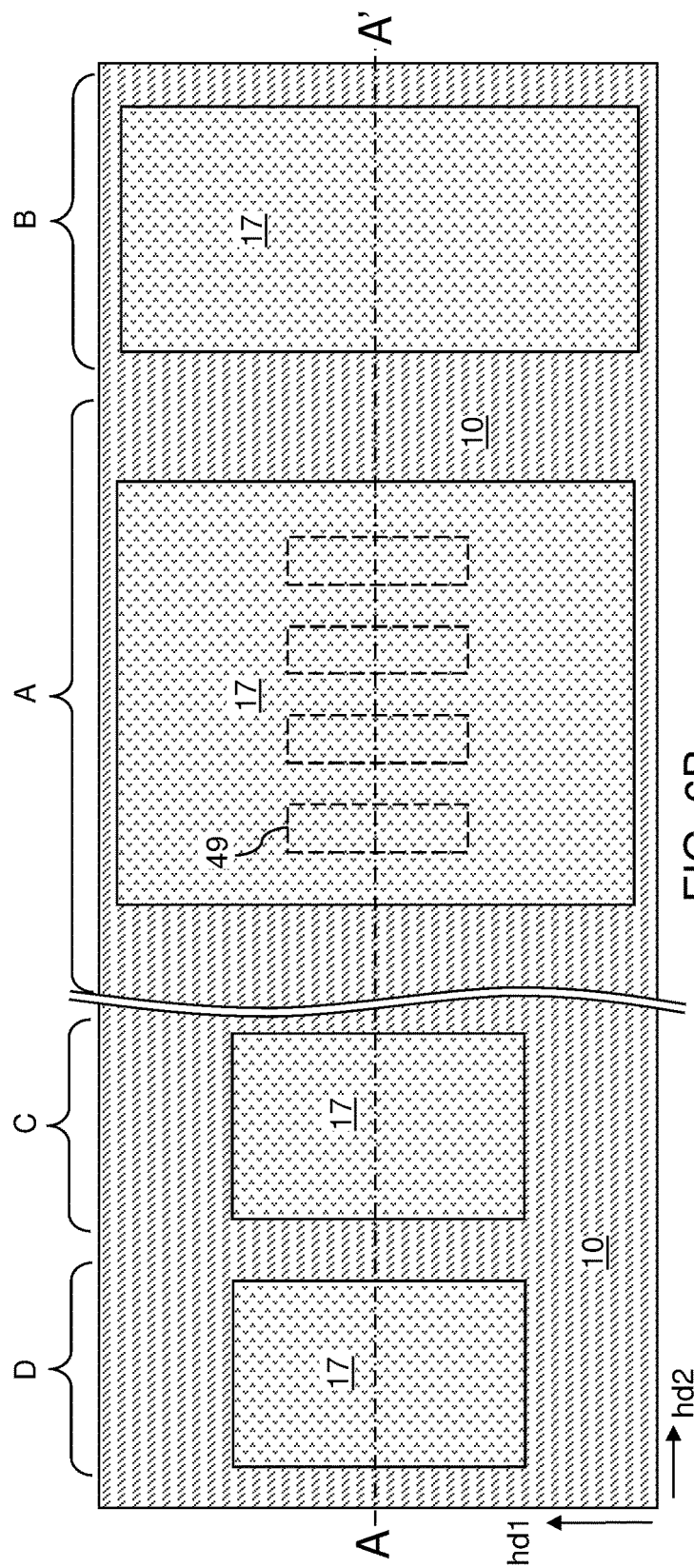
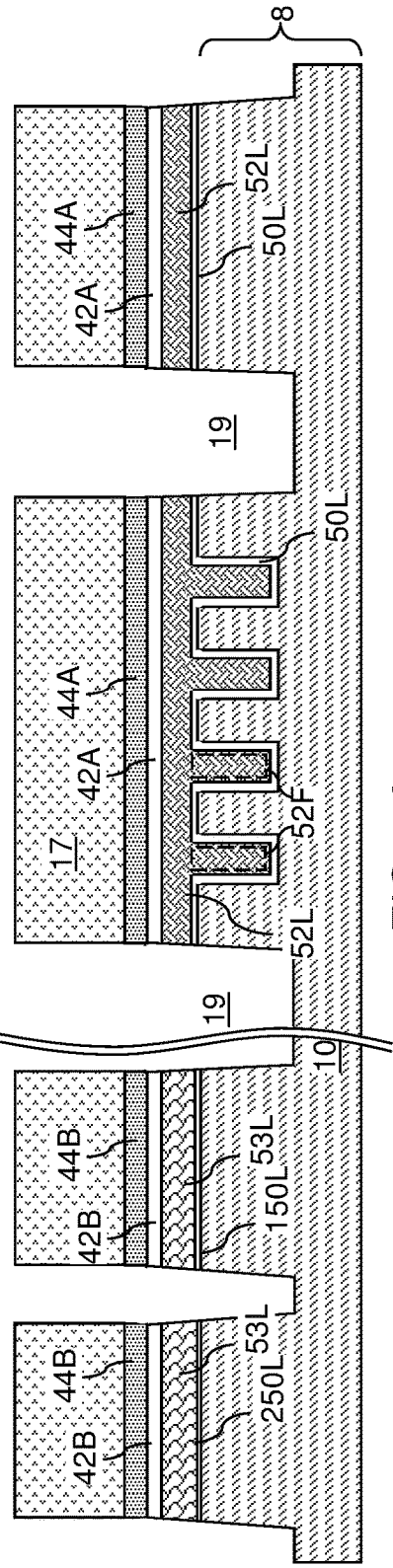
FIG. 6B
FIG. 6A

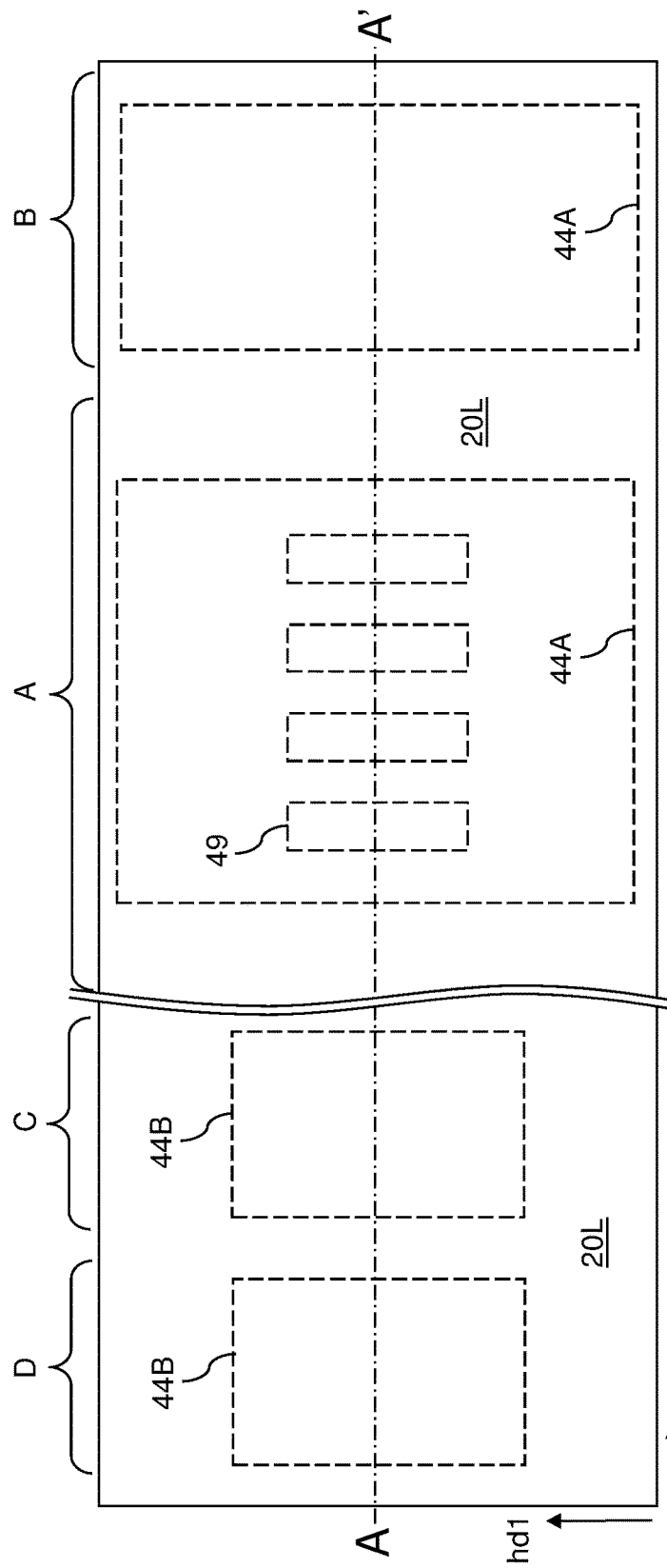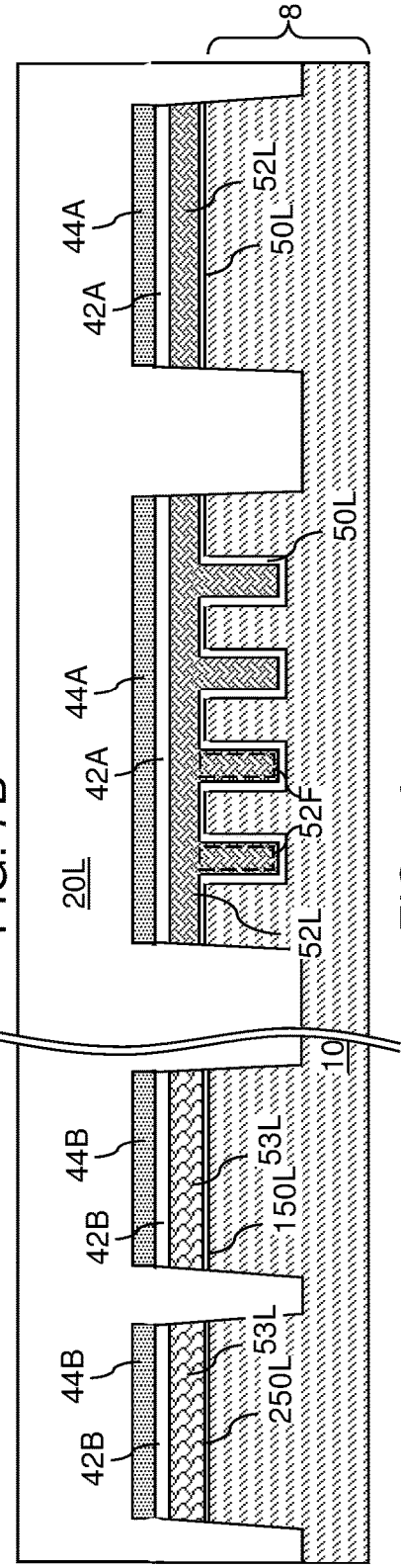

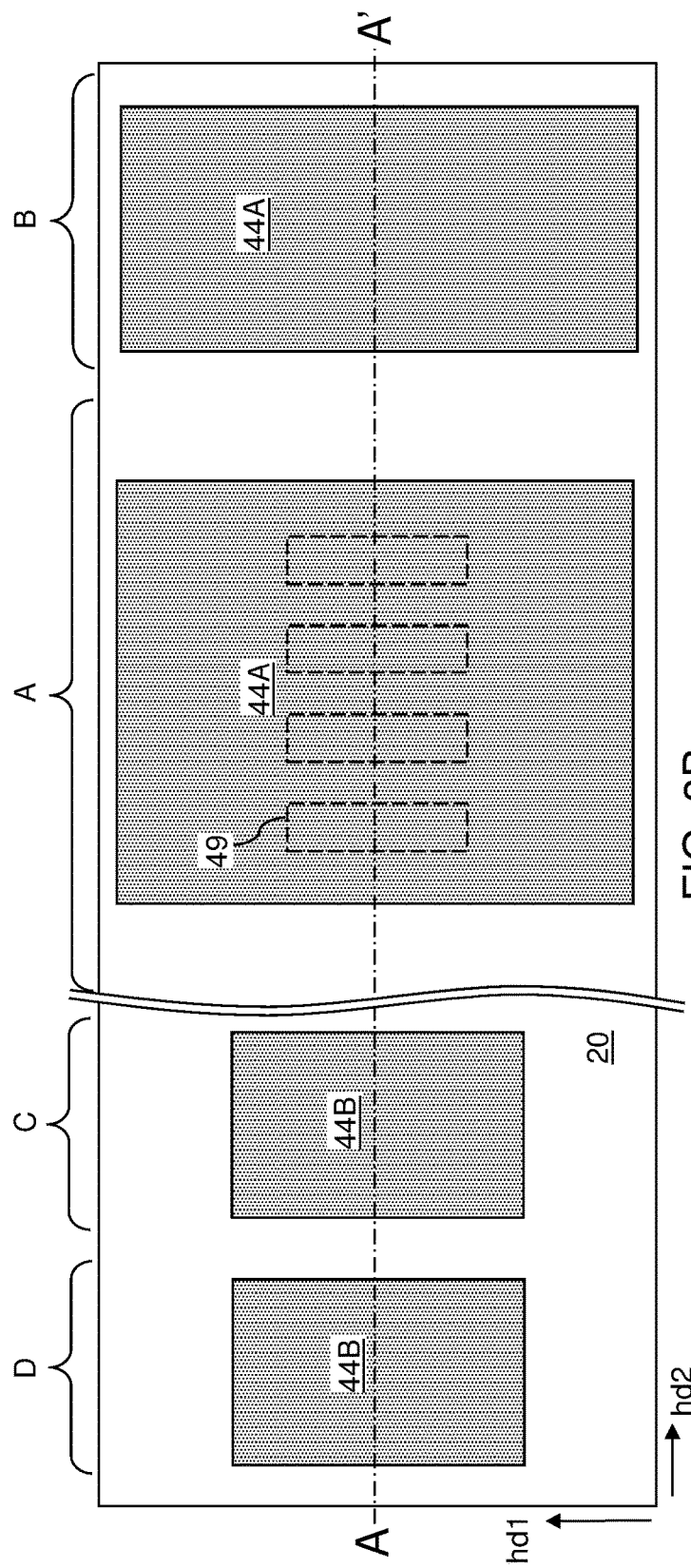
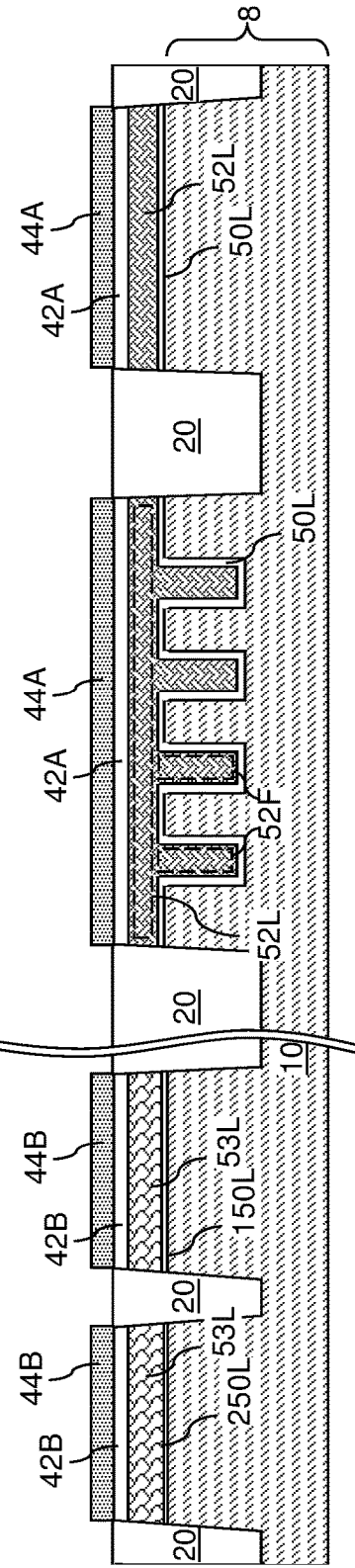
FIG. 8B
FIG. 8A

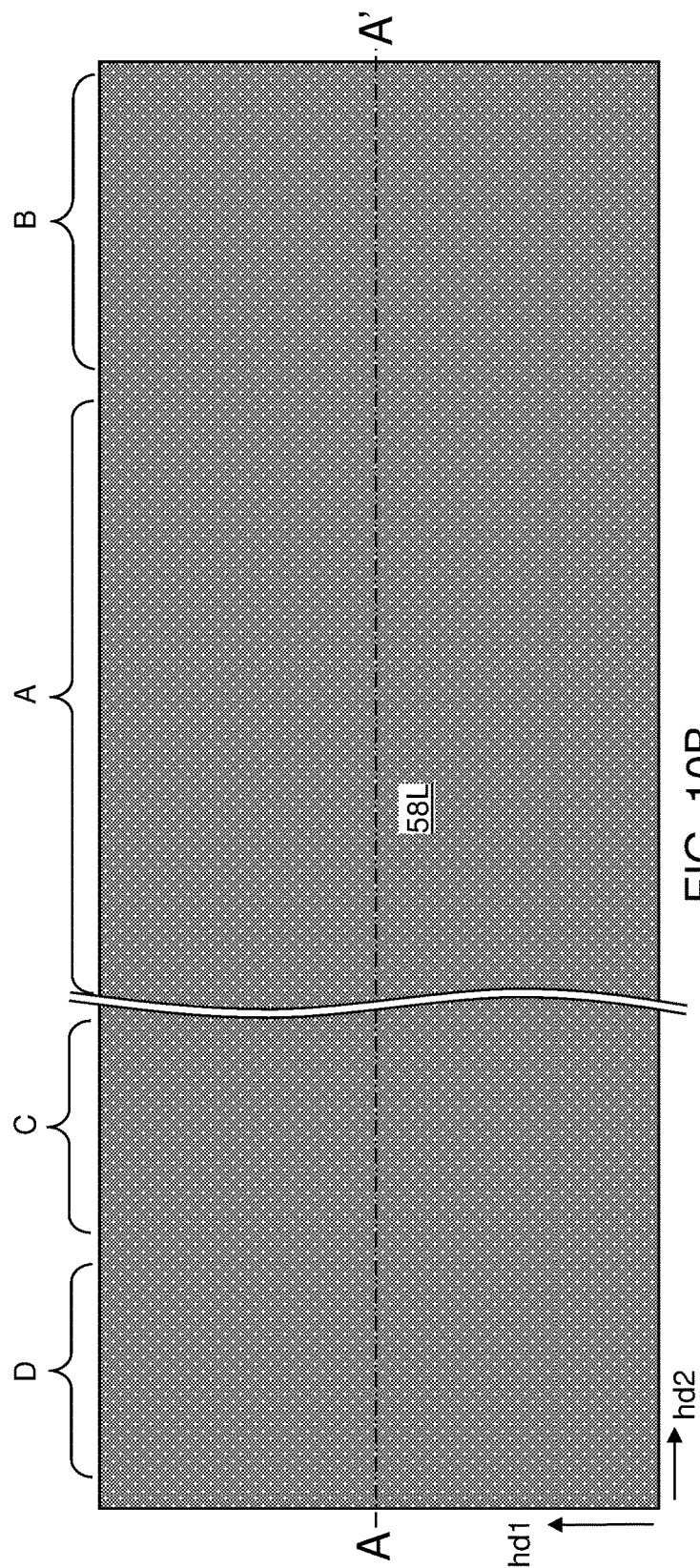
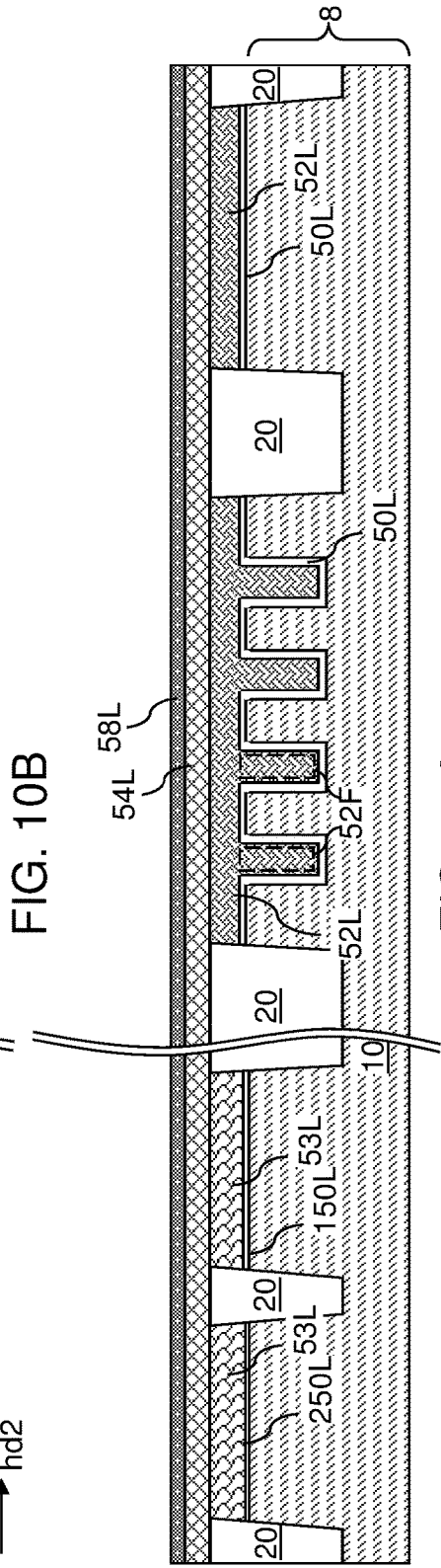

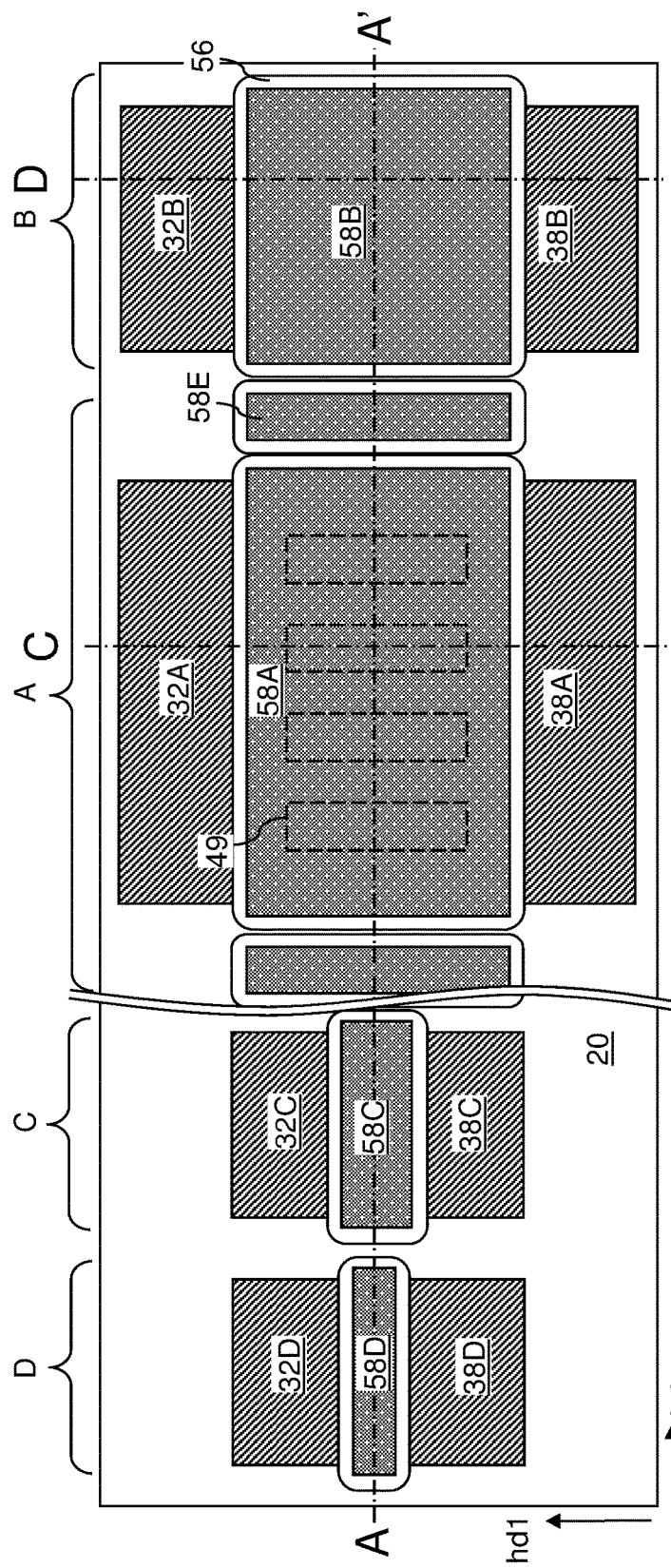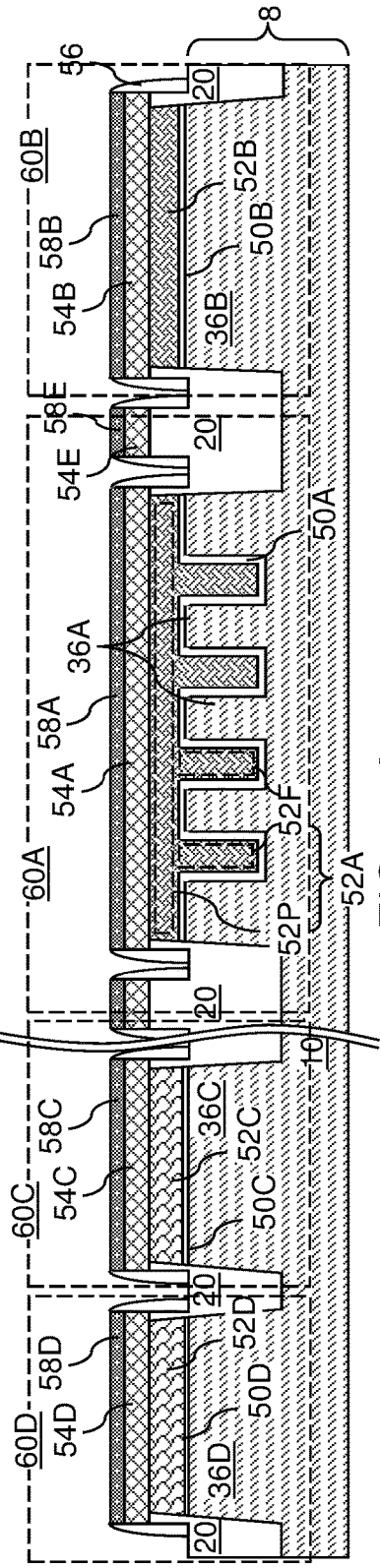

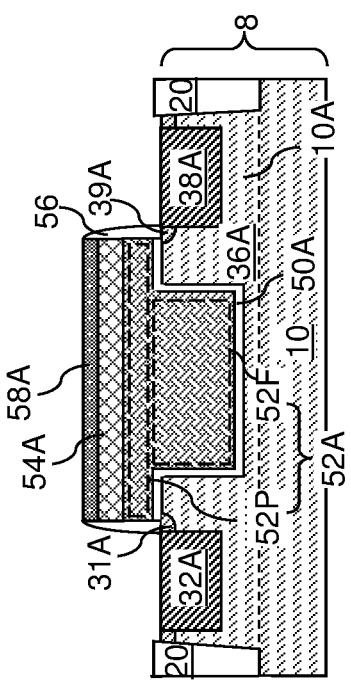
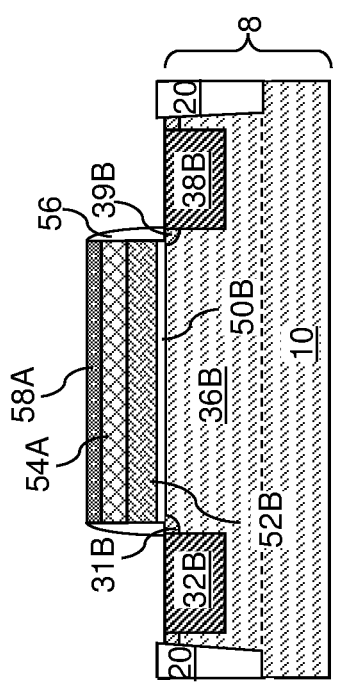
FIG. 12C
FIG. 12D

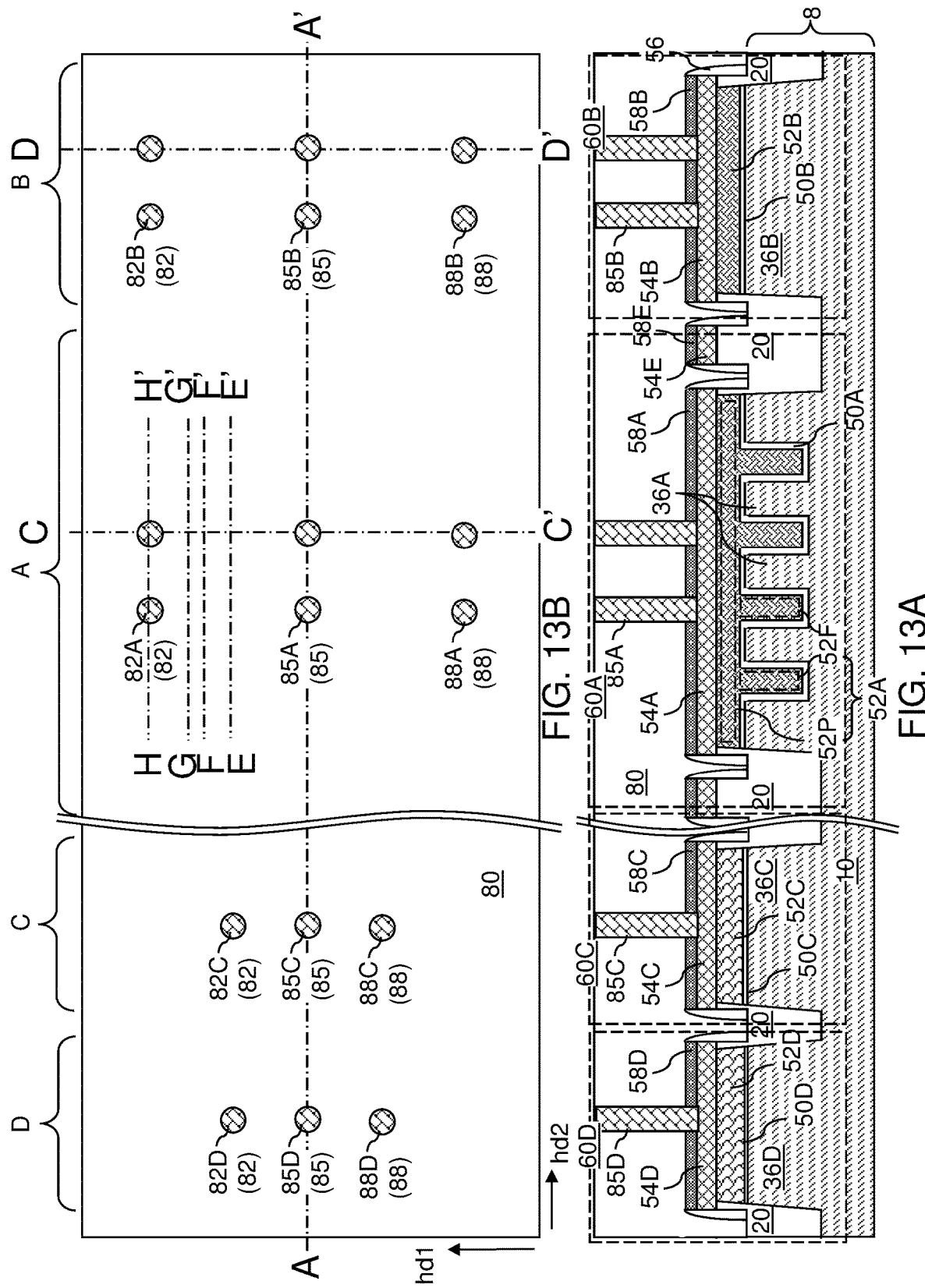

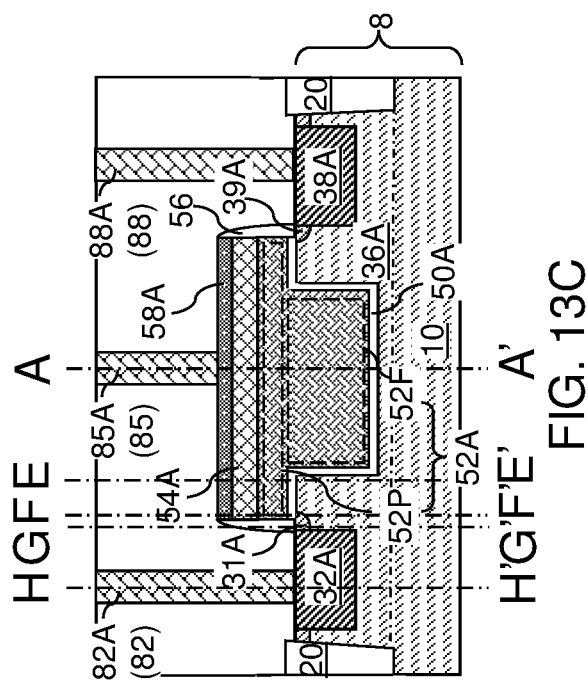
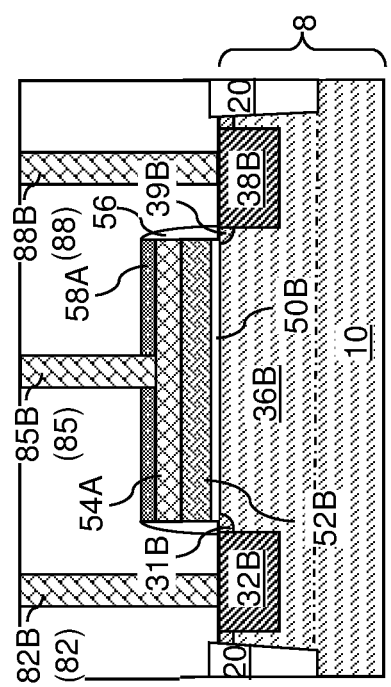
FIG. 13C
FIG. 13D

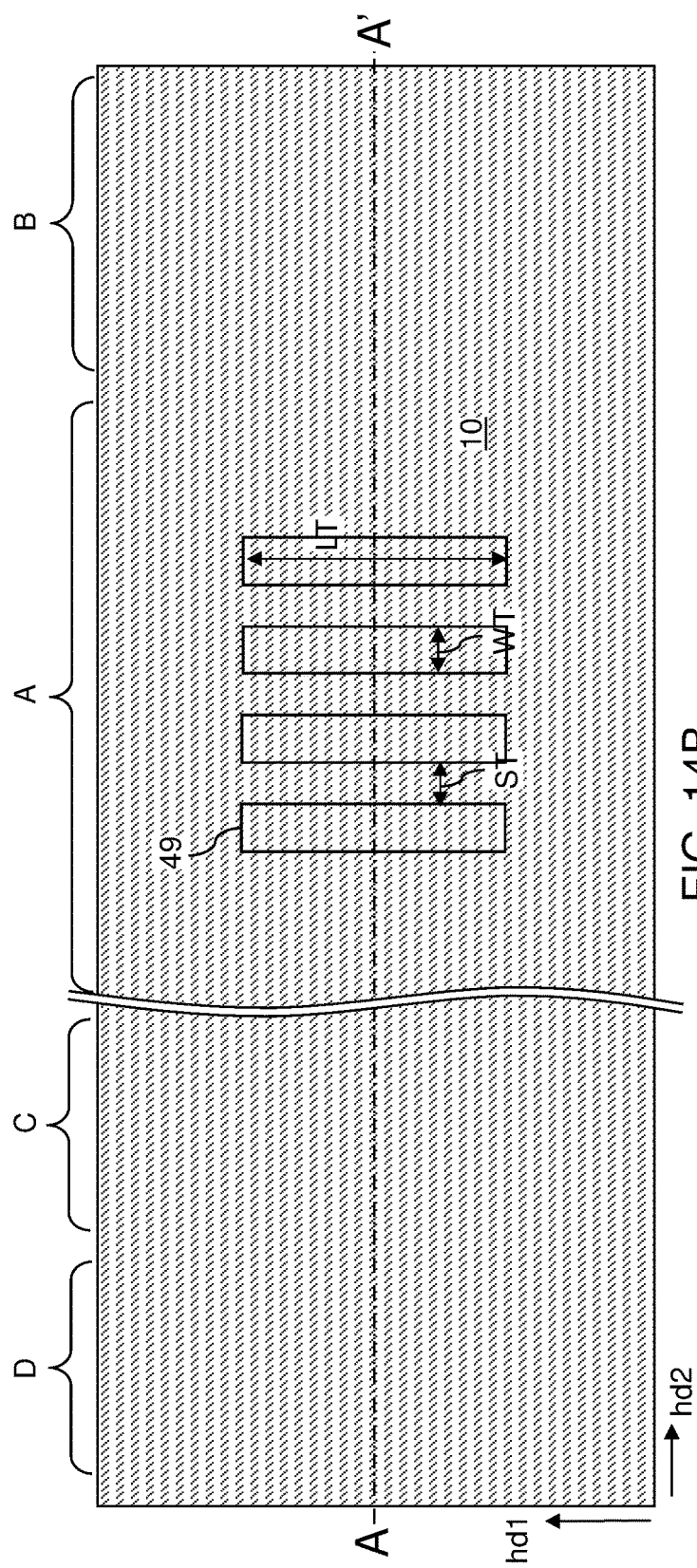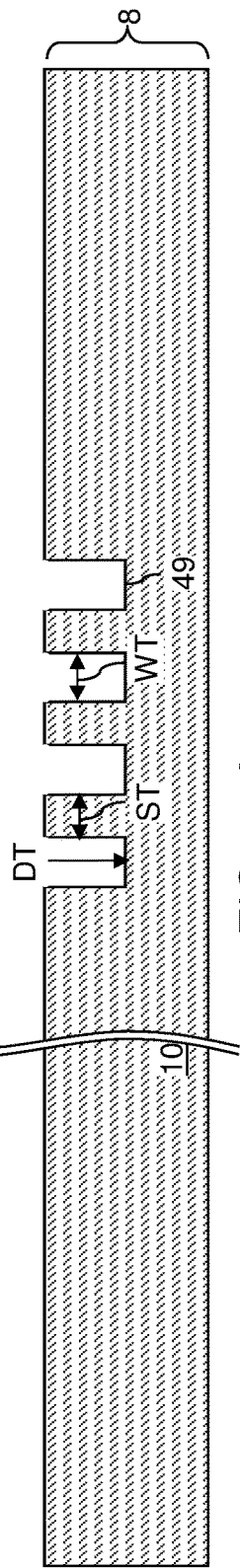
FIG. 14B
FIG. 14A

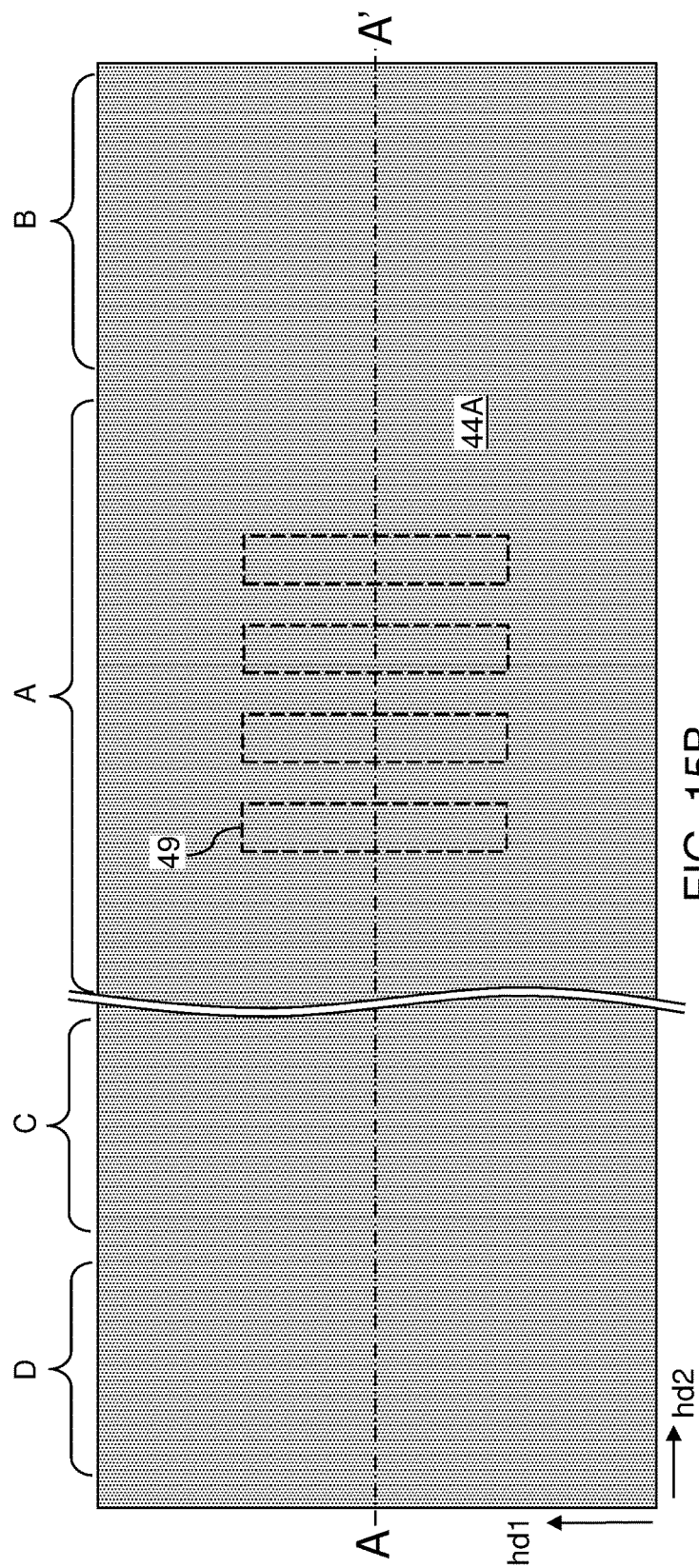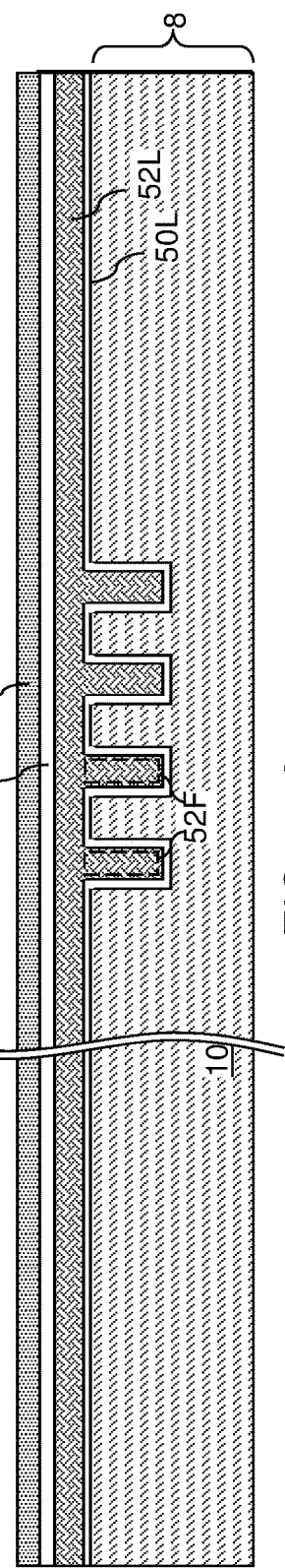

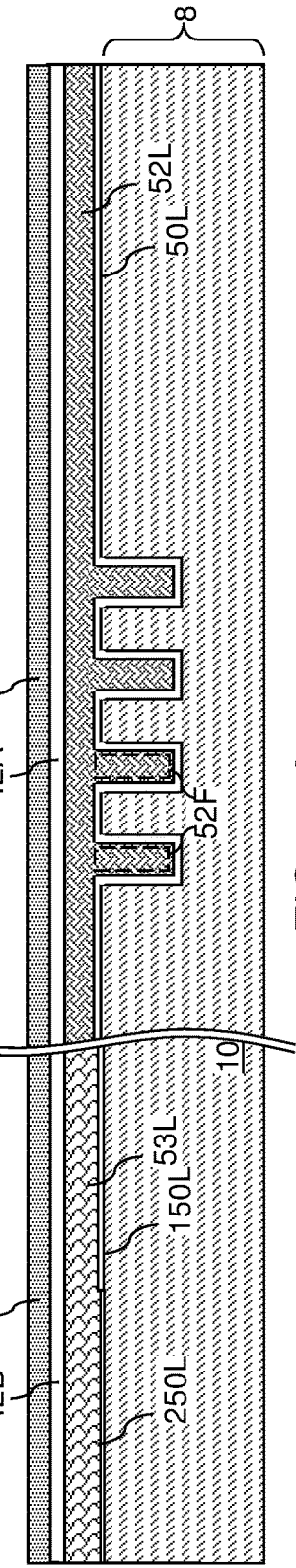
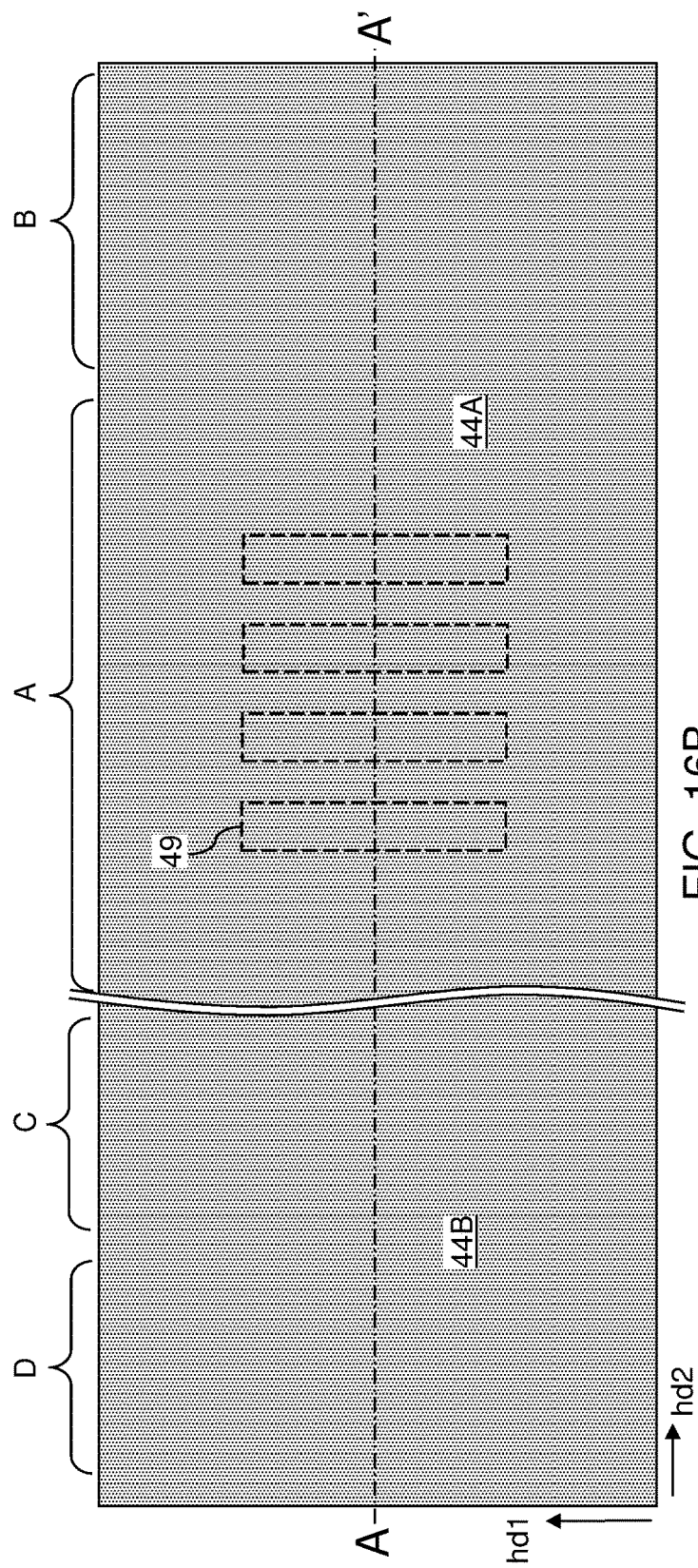

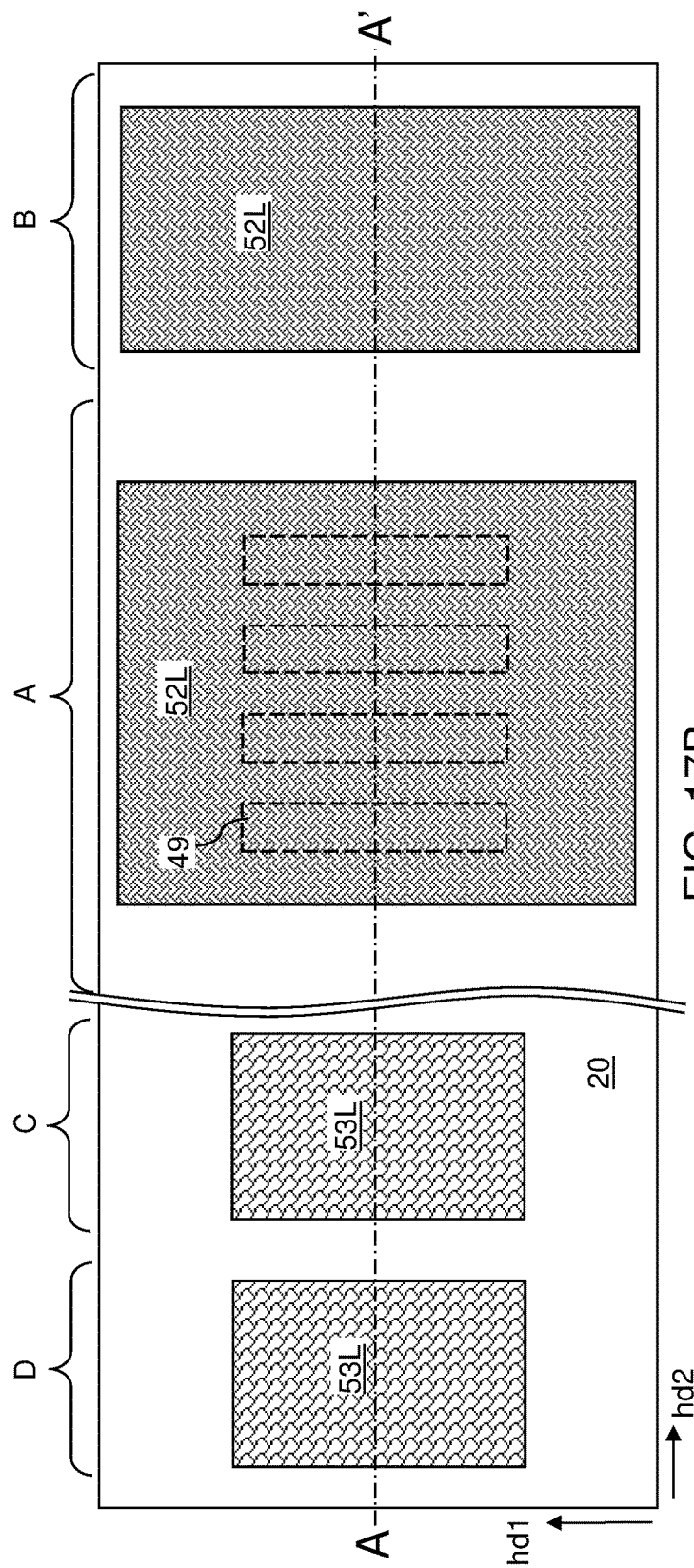
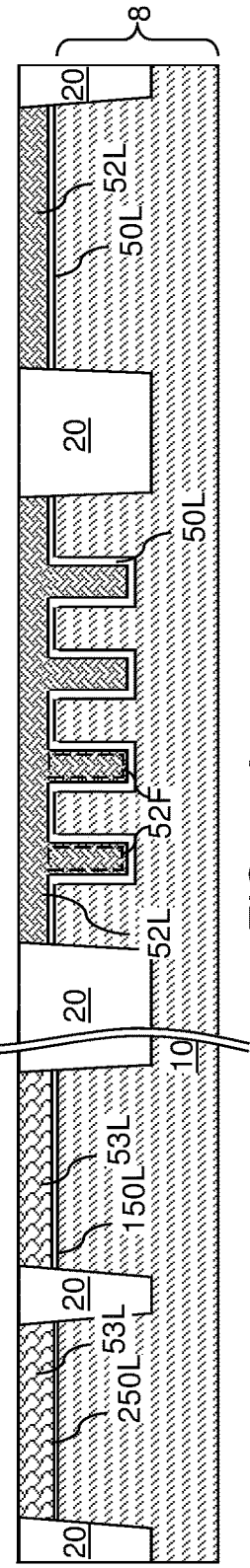
FIG. 17B
FIG. 17A

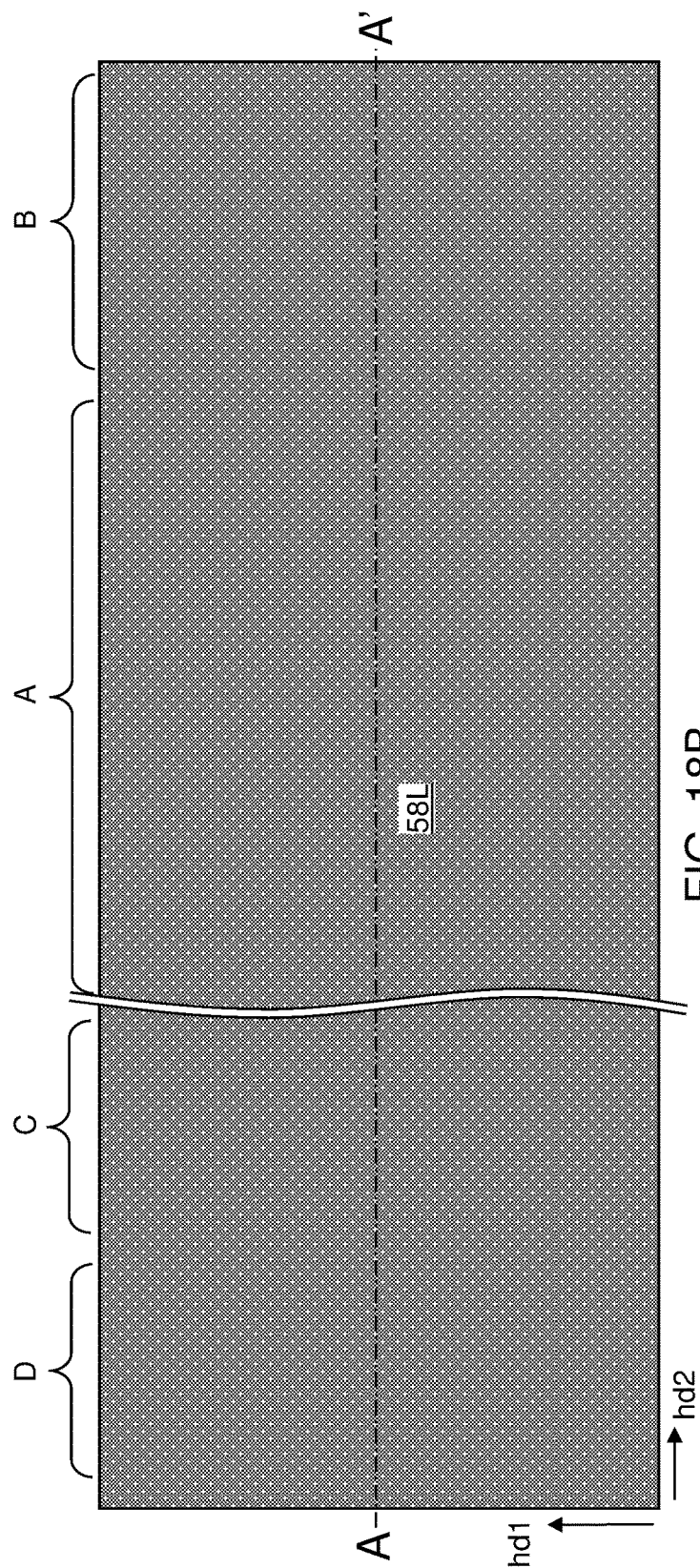
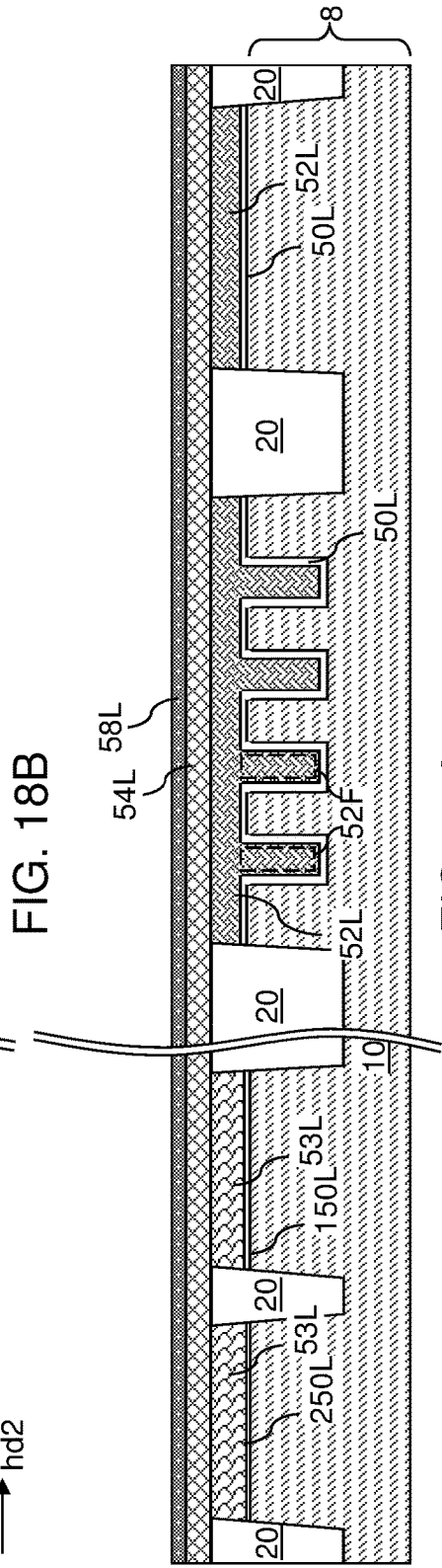
FIG. 18B
FIG. 18A

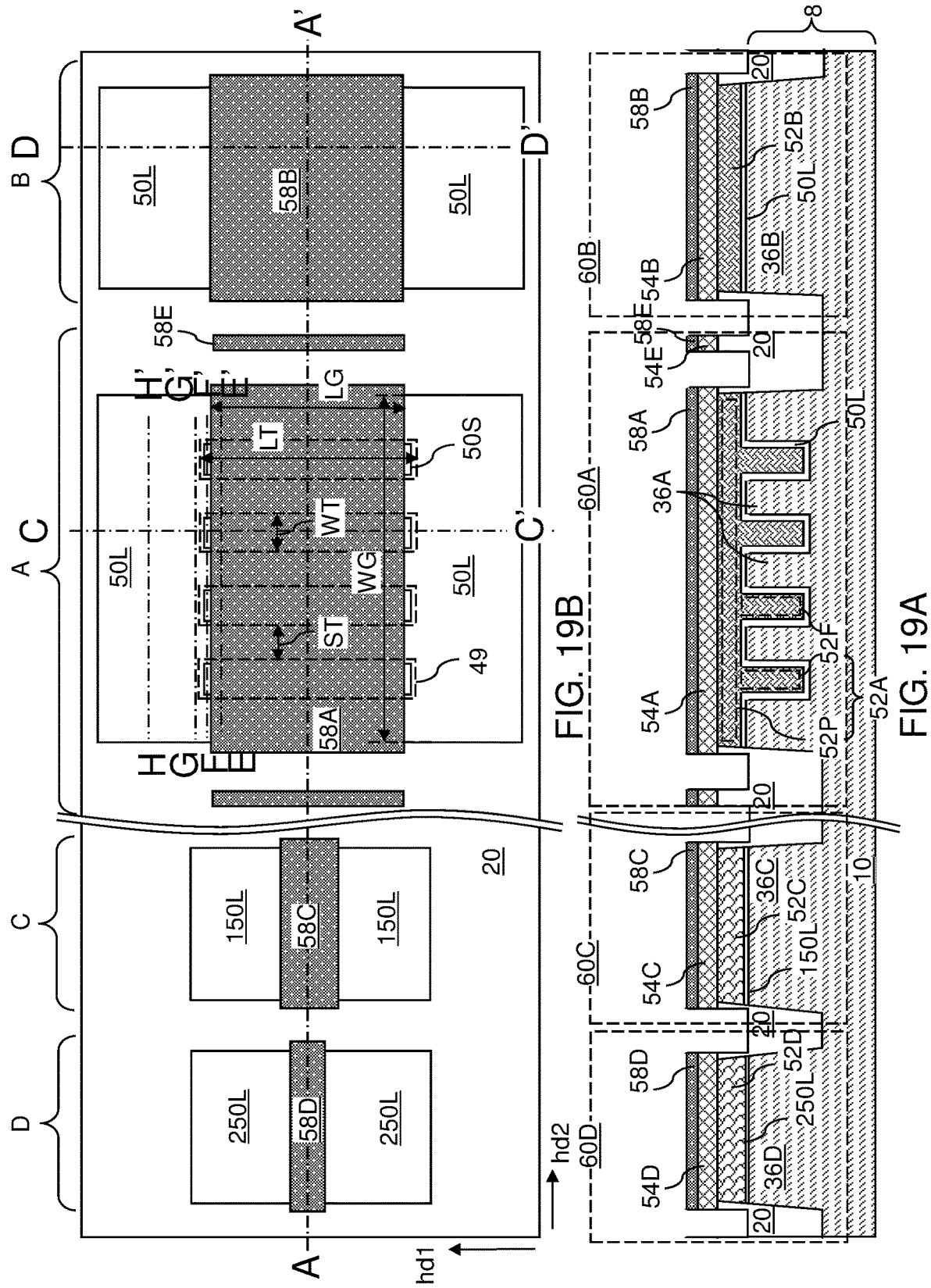

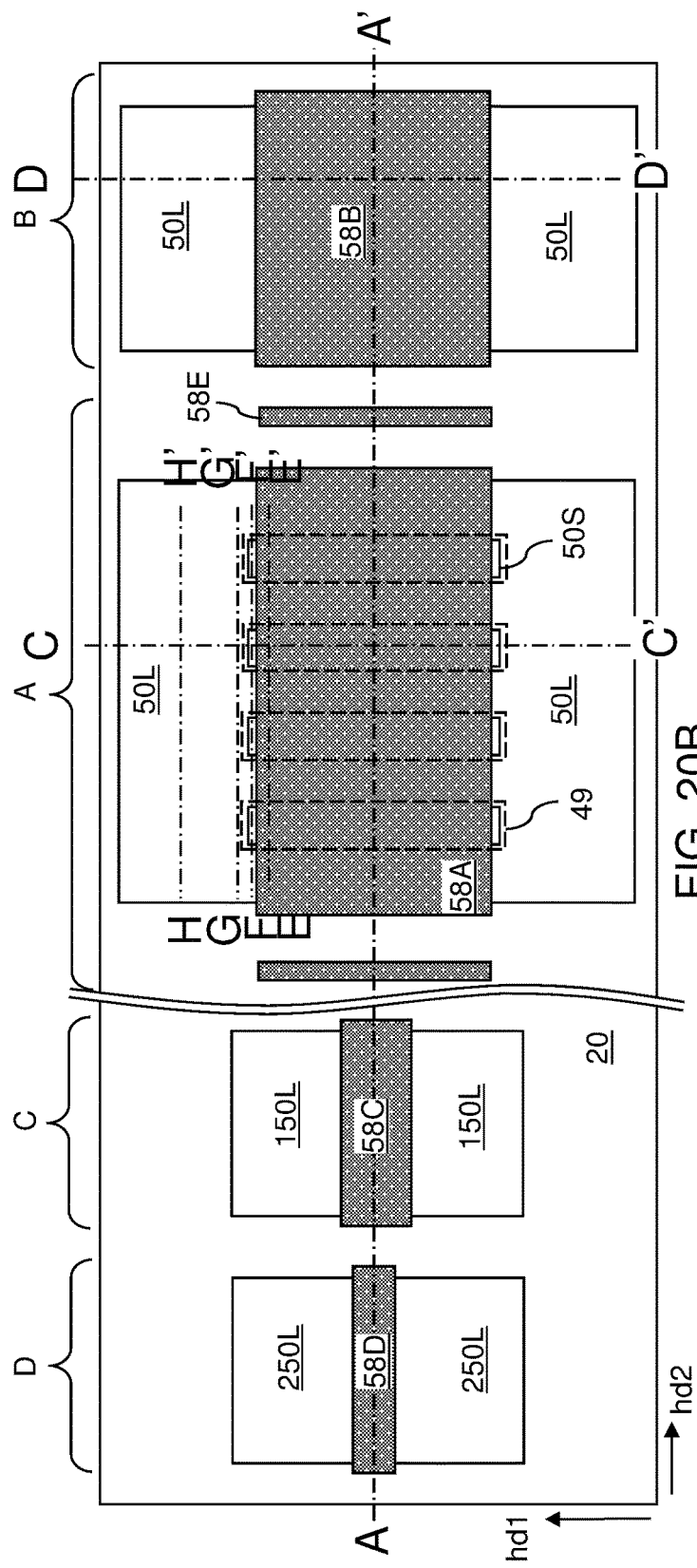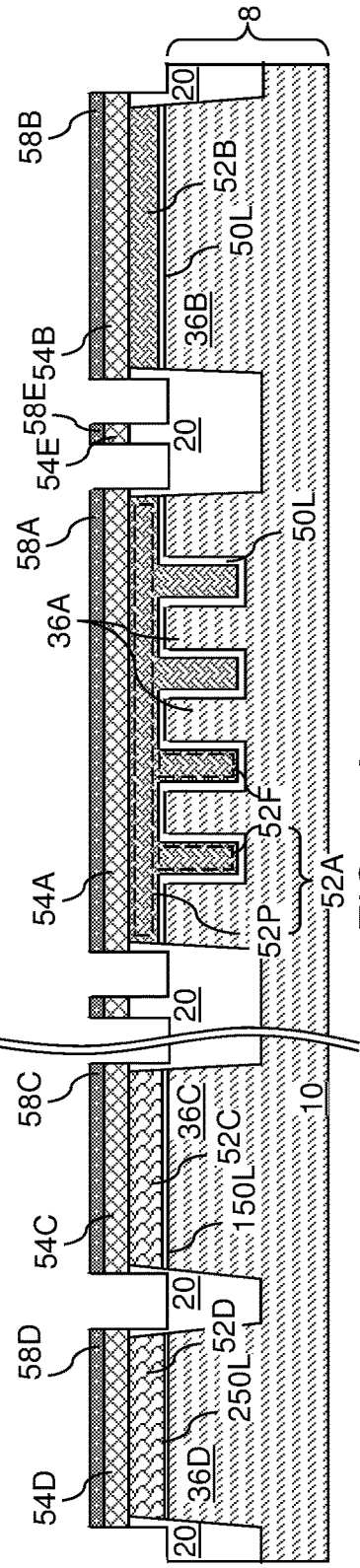

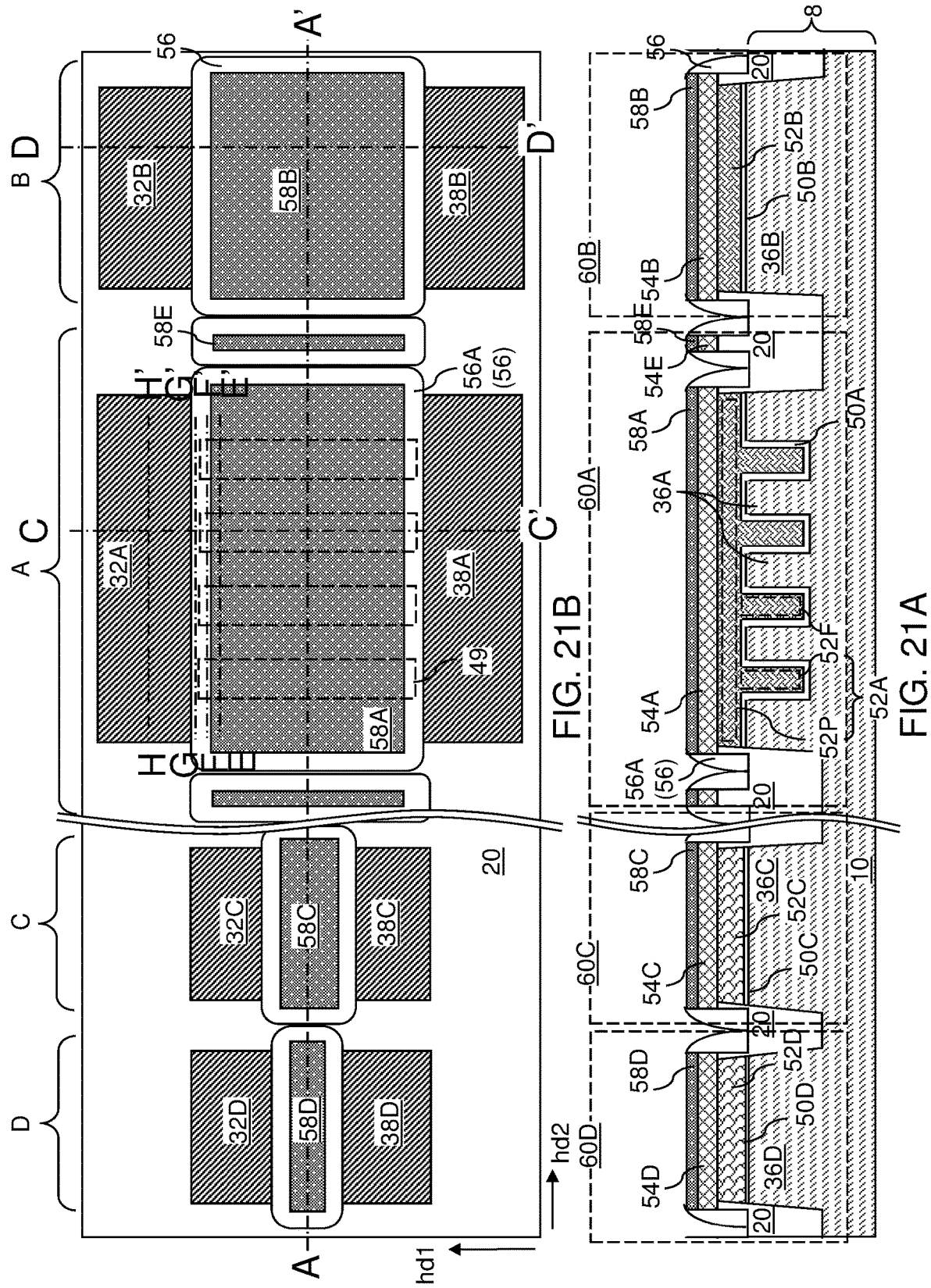

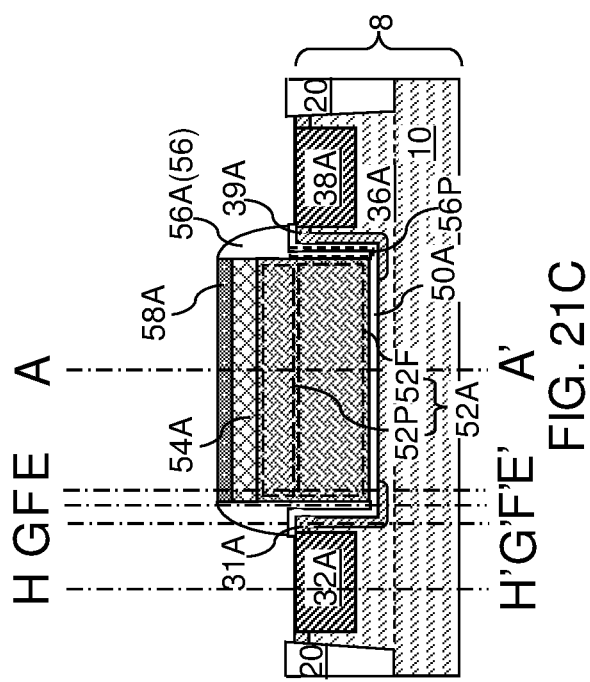
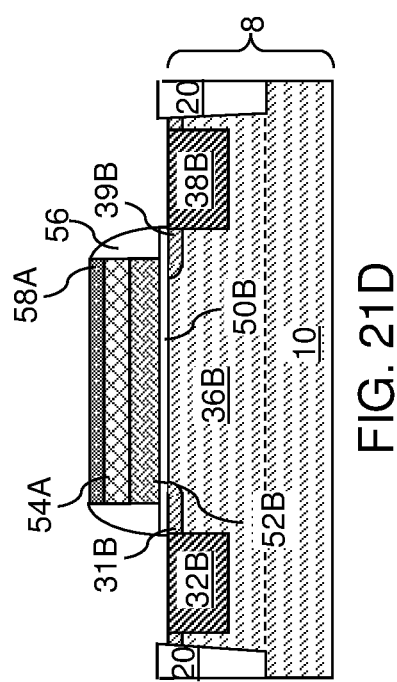
FIG. 21C
FIG. 21D

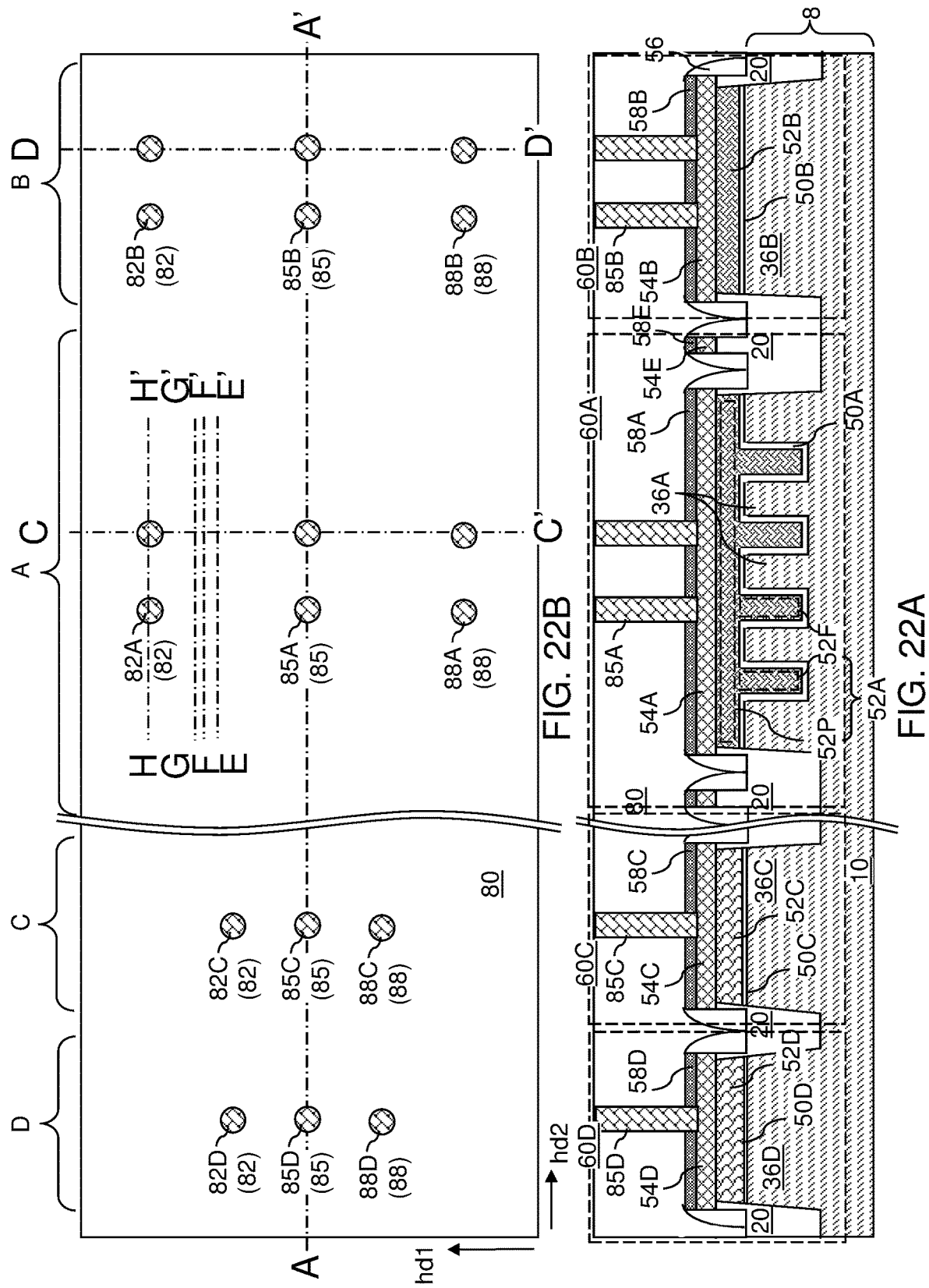

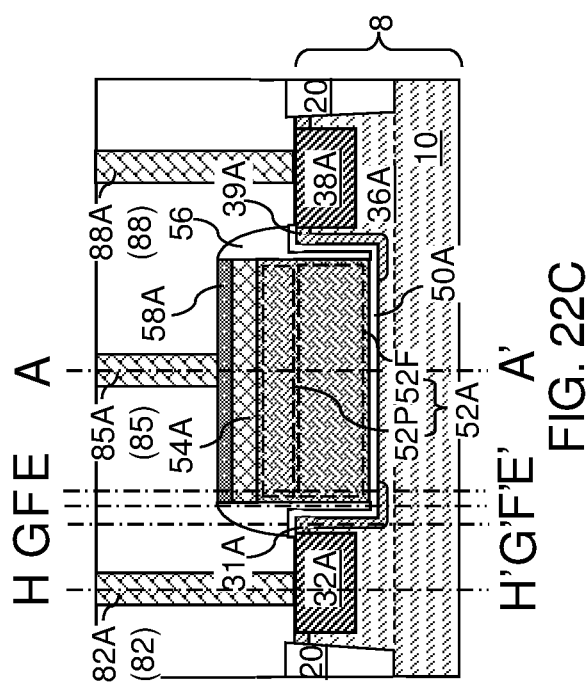
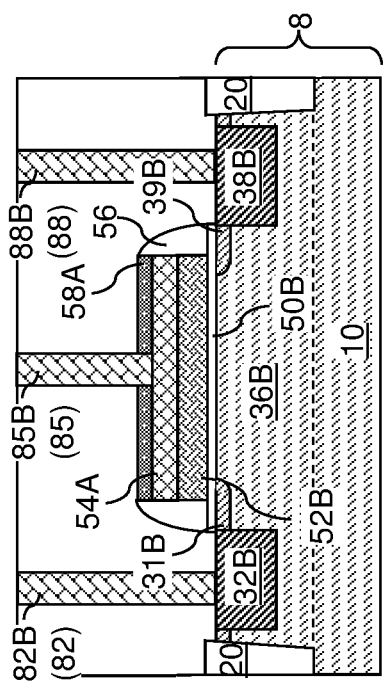
FIG. 22C
FIG. 22D

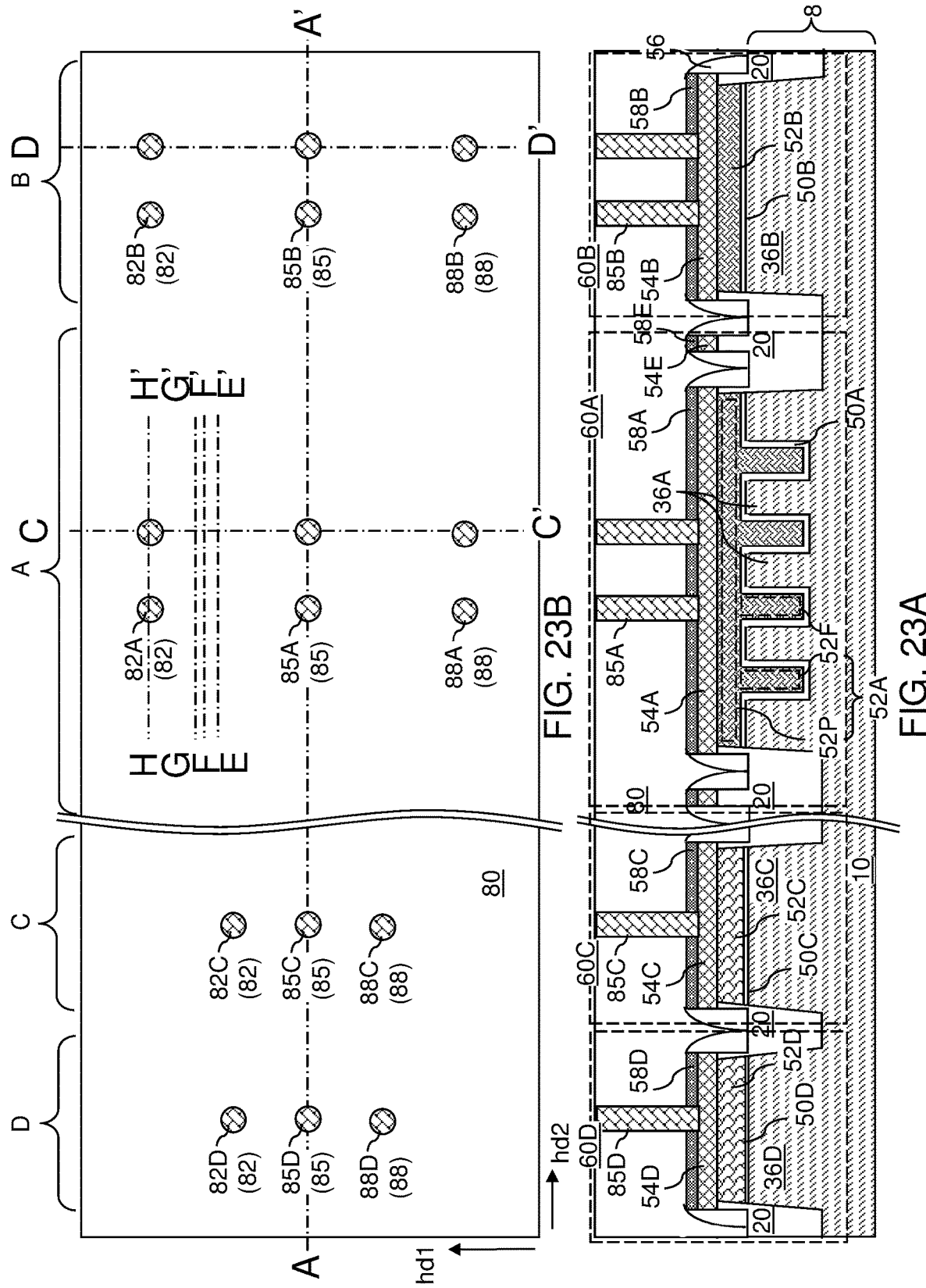

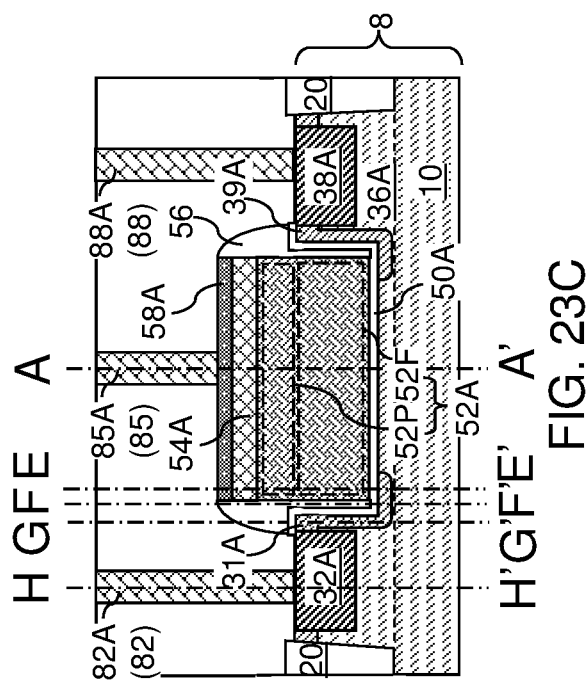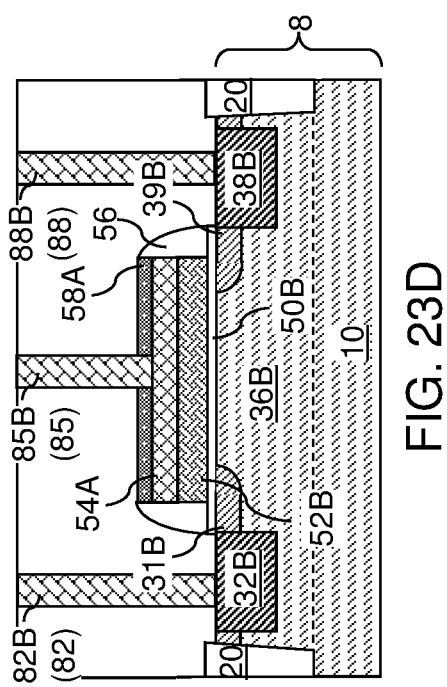
FIG. 23C
FIG. 23D

FIELD EFFECT TRANSISTORS WITH GATE FINS AND METHOD OF MAKING THE SAME

FIELD

The present disclosure relates generally to the field of semiconductor devices and specifically to field effect transistors including gate fins and methods of making the same.

BACKGROUND

Prior art field effect transistors often suffer from surface breakdown voltage. Such transistors often have a complex extended low doped drain (LDD) structure to improve surface breakdown characteristics at the expense of process complexity and increased cost.

SUMMARY

According to an aspect of the present disclosure, a semiconductor structure is provided, which comprises: a semiconductor substrate containing a shallow trench isolation structure that laterally surrounds a first transistor active region that is a portion of the semiconductor substrate; and a first field effect transistor that comprises: at least one line trench extending downward from a top surface of the first transistor active region, laterally extending along a first horizontal direction, and located within the transistor active region; a channel region comprising a portion of the first transistor active region that laterally surrounds or underlies the at least one line trench; a gate dielectric contacting all surfaces of the at least one line trench and comprising a planar gate dielectric portion that extends over an entirety of a top surface of the channel region; a gate electrode comprising a planar gate electrode portion that overlies the planar gate dielectric portion and at least one gate electrode fin portion located within a respective one of the at least one line trench; and a source region and a drain region located in the semiconductor substrate and laterally spaced from each other by the channel region.

According to another aspect of the present disclosure, a method of forming a semiconductor structure is provided, which comprises: forming at least one line trench in a transistor active region of a semiconductor substrate; forming a gate dielectric in the at least one line trench and over a top surface of the transistor active region, wherein the gate dielectric contacts all surfaces of the at least one line trench; forming a gate electrode over the gate dielectric, wherein the gate electrode comprises a planar gate electrode portion that overlies the transistor active region and at least one gate electrode fin portion located within a respective one of the at least one line trench; and forming a source region and a drain region in portions of the transistor active region that are laterally spaced from each other by a channel region in a plan view.

According to an aspect of the present disclosure, a field effect transistor comprises: at least one line trench extending downward from a top surface of a first transistor active region of a substrate, and laterally extending along a first horizontal direction; a gate dielectric contacting a bottom surface and sidewalls of each of the at least one line trench and comprising a planar gate dielectric portion overlying the substrate; a gate electrode comprising a planar gate electrode portion that overlies the planar gate dielectric portion and at least one gate electrode fin portion located within the at least one line trench; and a dielectric gate spacer laterally surrounding the gate electrode and comprising at least one pair of downward-protruding portions vertically extending into the at least one line trench.

According to another aspect of the present disclosure, a method of forming a field effect transistor comprises: forming at least one line trench in a transistor active region in a semiconductor substrate; forming a gate dielectric in the at least one line trench and over a top surface of the semiconductor substrate; forming a gate electrode over the gate dielectric, wherein the gate electrode comprises a planar gate electrode portion that overlies the transistor active region and at least one gate electrode fin portion located within a center portion of the at least one line trench; and forming a dielectric gate spacer around the gate electrode, wherein the dielectric gate spacer comprises downward-protruding portions vertically extending into a respective end portion of the at least one line trench.

BRIEF DESCRIPTION OF THE DRAWINGS

FIG. 1A is a vertical cross-sectional view of a first exemplary structure after formation of line trenches in a substrate according to a first embodiment of the present disclosure.

FIG. 1B is a top-down view of the first exemplary structure of FIG. 1A.

FIG. 2A is a vertical cross-sectional view of the first exemplary structure after formation of a first gate dielectric layer, a first semiconductor gate electrode material layer, a first silicon oxide capping layer, and a first silicon nitride capping layer according to the first embodiment of the present disclosure.

FIG. 2B is a top-down view of the first exemplary structure of FIG. 2A.

FIG. 3A is a vertical cross-sectional view of the first exemplary structure after patterning the first silicon nitride capping layer, the first silicon oxide capping layer, the first semiconductor gate electrode material layer, and the first gate dielectric layer according to the first embodiment of the present disclosure.

FIG. 3B is a top-down view of the first exemplary structure of FIG. 3A.

FIG. 4A is a vertical cross-sectional view of the first exemplary structure after formation of additional gate dielectric layers, a second semiconductor gate electrode material layer, a second silicon oxide capping layer, and a second silicon nitride capping layer according to the first embodiment of the present disclosure.

FIG. 4B is a top-down view of the first exemplary structure of FIG. 4A.

FIG. 5A is a vertical cross-sectional view of the first exemplary structure after patterning the second silicon nitride capping layer and the second silicon oxide capping layer according to the first embodiment of the present disclosure.

FIG. 5B is a top-down view of the first exemplary structure of FIG. 5A.

FIG. 6A is a vertical cross-sectional view of the first exemplary structure after formation of shallow trenches according to the first embodiment of the present disclosure.

FIG. 6B is a top-down view of the first exemplary structure of FIG. 6A.

FIG. 7A is a vertical cross-sectional view of the first exemplary structure after deposition of a dielectric fill material layer according to the first embodiment of the present disclosure.

FIG. 7B is a top-down view of the first exemplary structure of FIG. 7A.

FIG. 8A is a vertical cross-sectional view of the first exemplary structure after deposition of a shallow trench isolation structure according to the first embodiment of the present disclosure.

FIG. 8B is a top-down view of the first exemplary structure of FIG. 8A.

FIG. 10A is a vertical cross-sectional view of the first exemplary structure after formation of a metallic gate electrode material layer and a gate capping dielectric layer according to the first embodiment of the present disclosure.

FIG. 10B is a top-down view of the first exemplary structure of FIG. 10A.

FIG. 12A is a vertical cross-sectional view of the first exemplary structure after formation of dielectric gate spacers and deep source/drain regions according to the first embodiment of the present disclosure.

FIG. 12B is a top-down view of the first exemplary structure of FIG. 12A.

FIG. 12C is a vertical cross-sectional view of the first exemplary structure along the vertical plane C-C' of FIG. 12B.

FIG. 12D is a vertical cross-sectional view of the first exemplary structure along the vertical plane D-D' of FIG. 12B.

FIG. 13A is a vertical cross-sectional view of the first exemplary structure after formation of contact via structures according to the first embodiment of the present disclosure.

FIG. 13B is a top-down view of the first exemplary structure of FIG. 13A.

FIG. 13C is a vertical cross-sectional view of the first exemplary structure along the vertical plane C-C' of FIG. 13B.

FIG. 13D is a vertical cross-sectional view of the first exemplary structure along the vertical plane D-D' of FIG. 13B.

FIG. 14A is a vertical cross-sectional view of a second exemplary structure after formation of line trenches in a substrate according to a second embodiment of the present disclosure.

FIG. 14B is a top-down view of the second exemplary structure of FIG. 1A.

FIG. 15A is a vertical cross-sectional view of the second exemplary structure after formation of a first gate dielectric layer, a first semiconductor gate electrode material layer, a first silicon oxide capping layer, and a first silicon nitride capping layer according to the second embodiment of the present disclosure.

FIG. 15B is a top-down view of the second exemplary structure of FIG. 15A.

FIG. 16A is a vertical cross-sectional view of the second exemplary structure after formation of additional gate dielectric layers, a second semiconductor gate electrode material layer, a second silicon oxide capping layer, and a second silicon nitride capping layer according to the second embodiment of the present disclosure.

FIG. 16B is a top-down view of the second exemplary structure of FIG. 16A.

FIG. 17A is a vertical cross-sectional view of the second exemplary structure after deposition of a shallow trench isolation structure according to the second embodiment of the present disclosure.

FIG. 17B is a top-down view of the second exemplary structure of FIG. 17A.

FIG. 18A is a vertical cross-sectional view of the second exemplary structure after formation of a metallic gate electrode material layer and a gate capping dielectric layer according to the second embodiment of the present disclosure.

FIG. 18B is a top-down view of the second exemplary structure of FIG. 18A.

FIG. 19A is a vertical cross-sectional view of the second exemplary structure after formation of gate stacks according to the second embodiment of the present disclosure.

FIG. 19B is a top-down view of the second exemplary structure of FIG. 19A.

FIG. 20A is a vertical cross-sectional view of the second exemplary structure after formation of source/drain extension regions according to the second embodiment of the present disclosure.

FIG. 20B is a top-down view of the second exemplary structure of FIG. 20A.

FIG. 21A is a vertical cross-sectional view of the second exemplary structure after formation of dielectric gate spacers and deep source/drain regions according to the second embodiment of the present disclosure.

FIG. 21B is a top-down view of the second exemplary structure of FIG. 21A.

FIG. 21C is a vertical cross-sectional view of the second exemplary structure along the vertical plane C-C' of FIG. 21B.

FIG. 21D is a vertical cross-sectional view of the second exemplary structure along the vertical plane D-D' of FIG. 21B.

FIG. 22A is a vertical cross-sectional view of the second exemplary structure after formation of contact via structures according to the second embodiment of the present disclosure.

FIG. 22B is a top-down view of the second exemplary structure of FIG. 22A.

FIG. 22C is a vertical cross-sectional view of the second exemplary structure along the vertical plane C-C' of FIG. 22B.

FIG. 22D is a vertical cross-sectional view of the second exemplary structure along the vertical plane D-D' of FIG. 22B.

FIG. 23A is a vertical cross-sectional view of an alternative embodiment of the second exemplary structure after formation of contact via structures according to the second embodiment of the present disclosure.

FIG. 23B is a top-down view of the second exemplary structure of FIG. 23A.

FIG. 23C is a vertical cross-sectional view of the second exemplary structure along the vertical plane C-C' of FIG. 23B.

FIG. 23D is a vertical cross-sectional view of the second exemplary structure along the vertical plane D-D' of FIG. 23B.

DETAILED DESCRIPTION

Figure 9B:
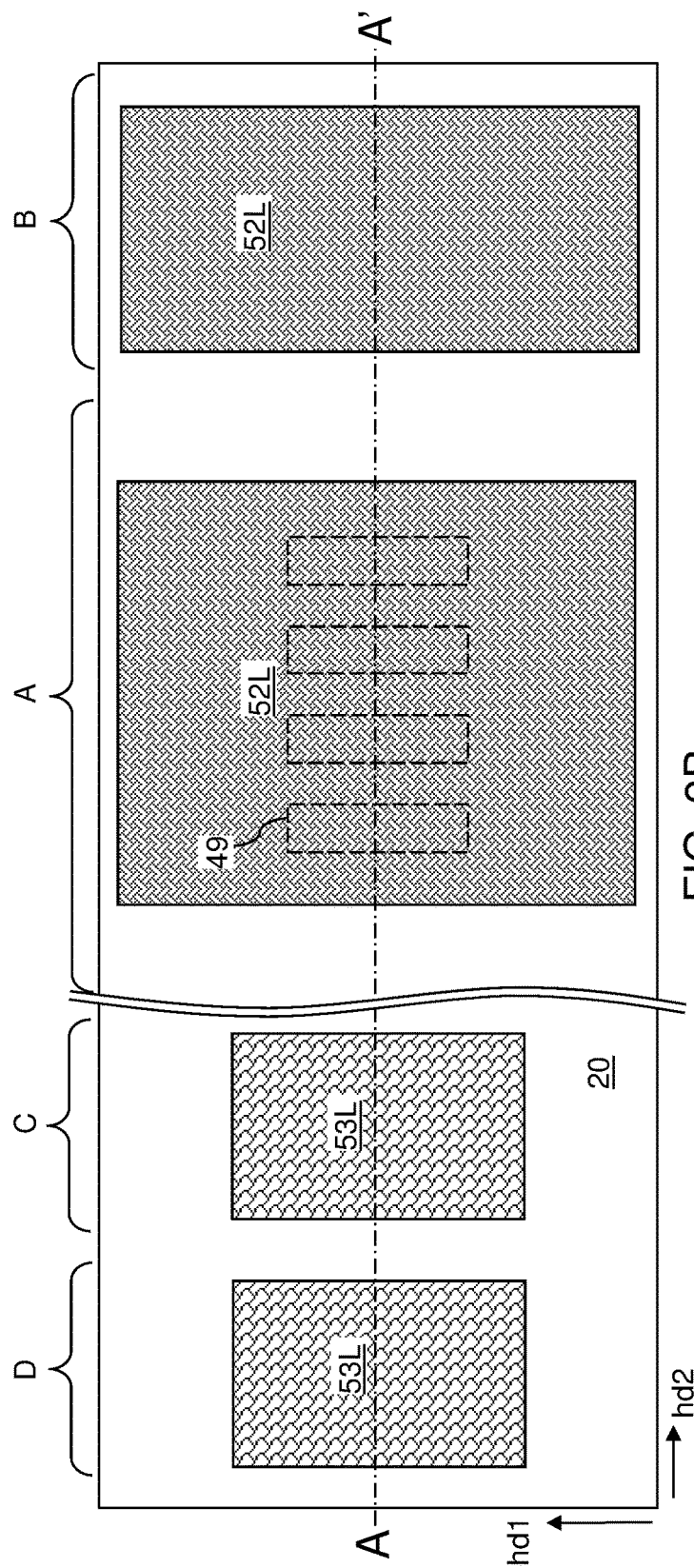
FIG. 9B is a top-down view of the first exemplary structure of FIG. 9A.

Embodiments of the present disclosure are directed to field effect transistors including gate fins and methods of making the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material", "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, a "channel region" refers to a semiconductor region in which mobility of charge carriers is affected by an applied electrical field. A "gate electrode" refers to a conductive material portion that controls electron mobility in the channel region by application of an electrical field. A "deep source region" refers to a doped semiconductor region that supplies charge carriers that flow through the channel region. A "deep drain region" refers to a doped semiconductor region that receives charge carriers supplied by the source region and passes through the channel region. A "deep source/drain region" refers to a deep source region of a field effect transistor or a deep drain region of a field effect transistor. A "source extension region" refers to a doped semiconductor region having a lesser dopant concentration than, and having a same type of doping as, a source region and including a portion disposed between the deep source region and the channel region. A "drain extension region" refers to a doped semiconductor region having a lesser dopant concentration than, and having a same type of doping as, a deep drain region and including a portion disposed between the drain region and the channel region. A "source/drain extension region" refers to a source extension region or a drain extension region. A source region refers to a deep source region and any source extension region that is adjoined to the deep source region. A drain region refers to a deep drain region and any drain extension region that is adjoined to the deep source region. A source/drain region refers to a source region or a drain region.

Referring to FIGS. 1A and 1B, a first exemplary structure according to a first embodiment of the present disclosure is illustrated. The first exemplary structure may include plural device regions, which can include, for example, a first device region A, a second device region B, a third device region C, and a fourth device region D located over a semiconductor substrate 8. As used herein, a "semiconductor substrate" refers to a substrate that includes at least one semiconductor material portion, i.e., at least one portion of a semiconductor material. In one embodiment, a field effect transistor including at least one gate fin and a thick gate dielectric may be formed in the first device region A, a planar field effect transistor including a thick gate dielectric may be formed in the second device region B, a planar field effect transistor including a medium thickness gate dielectric may be formed in the third device region C, and a planar field effect transistor including a thin gate dielectric may be formed in the fourth device region D.

In one embodiment, four device regions A-D may comprise peripheral (i.e., driver) transistor regions of a driver circuit of a three dimensional memory device, such as a three dimensional NAND memory device containing a plurality of vertical NAND strings. The memory device may be grown layer by layer over the driver circuit or may be formed on a separate memory substrate and then bonded to the driver circuit.

The first device region A may comprise a word line switching region containing word line switching transistors which are configured to switch (i.e., turn on and off) the word lines of the memory device. The second through fourth device regions B-D may comprise bit line driver circuit and other peripheral transistors, such as sense amplifier transistors. For example, the second device region B may comprise a high voltage transistor region, the third device region C may comprise a low voltage transistor region and the fourth region D may comprise a very low voltage device region.

While formation of a single transistor in each of the four device regions A-D is described below for illustration, it should be noted that each of the four device regions A-D contains a plurality of transistors of the same or different conductivity types. For example, the third and fourth regions C and D may include p-type and n-type transistors in a CMOS configuration. However, formation of CMOS devices is omitted from the description below for simplicity. Each of the device regions (A, B, C, D) includes a respective portion of the semiconductor substrate 8, which is herein referred to as a respective transistor active region. Generally, a source region, a channel region, and a drain region can be formed within each transistor active region.

The semiconductor substrate 8 includes a semiconductor material layer 10. The semiconductor substrate 8 may optionally include at least one additional material layer at a bottom portion thereof. In one embodiment, the semiconductor substrate 8 can be a bulk semiconductor substrate consisting of the semiconductor material layer 10 (e.g., single crystal silicon wafer), or can be a semiconductor-on-insulator (SOI) substrate including a buried insulator layer (such as a silicon oxide layer) underlying the semiconductor material layer 10, and a handle substrate underlying the buried insulator layer. Alternatively, the semiconductor material layer 10 may comprise an epitaxial semiconductor (e.g., single crystal silicon) layer deposited on a semiconductor substrate (e.g., silicon wafer) 8 or may comprise a doped well (e.g., doped silicon well) in the upper portions of the semiconductor substrate (e.g., silicon wafer) 8.

The semiconductor material layer 10 can include a lightly doped semiconductor material portion (e.g., silicon portion) on which at least one field effect transistor can be formed. In one embodiment, the entirety of the semiconductor material in the semiconductor material layer 10 may include the lightly doped semiconductor material. In another embodiment, the lightly doped semiconductor material can be a semiconductor well embedded within another semiconductor material having a different dopant concentration and optionally, a doping of the opposite conductivity type. The dopant concentration of the lightly doped semiconductor material portion may be optimized for a body region of the at least one field effect transistor to be subsequently formed. For example, the lightly doped semiconductor material portion may include electrical dopants at an atomic concentration in a range from $1.0 \times 10^{14}/cm^3$ to $1.0 \times 10^{18}/cm^3$, such as from $1.0 \times 10^{15}/cm^3$ to $1.0 \times 10^{17}/cm^3$, although lesser and greater atomic concentrations can also be employed. The conductivity type of the portion of the semiconductor material layer 10 to be subsequently employed as a body region of a field effect transistor is herein referred to as a first conductivity type, which may be p-type for an n-type field effect transistor or n-type for a p-type field effect transistor.

The semiconductor material of the semiconductor material layer 10 can be an elemental semiconductor material (such as silicon) or an alloy of at least two elemental semiconductor materials (such as a silicon-germanium alloy), or can be a compound semiconductor material (such as a III-V compound semiconductor material or a II-VI compound semiconductor material), or can be an organic semiconductor material. The thickness of the semiconductor material layer 10 can be in a range from 0.5 mm to 2 mm in case the semiconductor material layer 10 is a bulk semiconductor substrate. In case the semiconductor material layer 10 is a semiconductor-on-insulator substrate, the thickness of the top semiconductor material layer within the semiconductor material layer 10 may be in a range from 100 nm to 1,000 nm, although lesser and greater thicknesses can also be employed.

A photoresist layer (not shown) can be applied over the semiconductor substrate 8, and can be patterned by lithographic exposure and development. The pattern of the openings in the photoresist layer can include at least one rectangular opening, such as a plurality of openings (e.g., 2 to 8, such as 4 to 6 openings) located within the first device region A. Each of the openings may have a pair of lengthwise edges that laterally extend along a first horizontal direction hd1 and a pair of widthwise edges that laterally extend along a second horizontal direction hd2 that is perpendicular to the first horizontal direction hd1.

The pattern in the photoresist layer can be transferred into an upper portion of the transistor active region in the first device region A by performing an anisotropic etch process. Portions of the transistor active region in the first device region A that are not masked by the photoresist layer can be anisotropically etched to form at least one line trench 49. Each of the at least one line trench 49 is formed underneath a respective rectangular opening in the photoresist layer.

The at least one line trench 49 extends downward from the top surface of the first transistor active region, laterally extends along the first horizontal direction hd1, and is located within the transistor active region of the first device region A. In one embodiment, the at least one line trench 49 comprises a plurality of line trenches 49 (e.g., 2 to 8, such as 4 to 6 trenches) including a respective pair of lengthwise sidewalls that laterally extend along the first horizontal direction hd1 and laterally spaced apart along the second horizontal direction hd2. In one embodiment, each of plurality of line trenches 49 comprises a respective upper periphery that coincides with a periphery of a respective opening in the top surface of the transistor active region, which is a portion of the top surface of the semiconductor substrate 8.

In one embodiment, each line trench 49 of the plurality of line trenches 49 may have a trench length LT along the first horizontal direction hd1 and a trench width WT along the second horizontal direction hd2. The trench length LT may be in a range from 10 nm to 1,000 nm, such as from 30 nm to 300 nm, although lesser and greater trench lengths LT may also be employed. The trench width WT may be in a range from 3 nm to 300 nm, such as from 10 nm to 100 nm, although lesser and greater trench widths WT may also be employed. The plurality of the line trenches 49 may be laterally spaced from each other by a trench spacing ST, which is the distance between lengthwise sidewalls of a neighboring pair of line trenches 49 that are laterally spaced apart along the second horizontal direction hd2. The ratio of the trench length LT to the trench width WT may be in a range from 1.0 to 30, such as from 3 to 10, although lesser and greater ratios may also be employed. The trench spacing ST may be in a range from 3 nm to 300 nm, such as from 10 nm to 200 nm, although lesser and greater trench widths WT may also be employed. Each of the line trenches 49 may have a trench depth DT, which may be less than, the same as, or greater than, the depth of the bottom surfaces of the shallow trench isolation structures to be subsequently formed. In one embodiment, the trench depth DT may be in a range from 10 nm to 1,000 nm, such as from 30 nm to 300 nm, although lesser and greater trench lengths LT may also be employed. In case the at least one line trench 49 is formed as a plurality of line trenches 49, the total number of line trenches 49 may be in a range from 2 to 8, such as from 4 to 6, although a greater number of line trenches 49 may also be employed. The widthwise sidewalls of the plurality of line trenches 49 may be aligned along the second horizontal direction hd2. In this case, the widthwise sidewalls of the plurality of line trenches 49 may be located within two vertical planes that laterally extend along the second horizontal direction hd2 and laterally spaced apart along the first horizontal direction by the trench length LT.

Referring to FIGS. 2A and 2B, a first gate dielectric layer 50L, a first semiconductor gate electrode material layer 52L, a first silicon oxide capping layer 42A, and a first silicon nitride capping layer 44A can be sequentially deposited over the semiconductor substrate 8.

The first gate dielectric layer 50L includes a dielectric material having a thickness suitable for operation of a high voltage field effect transistor. The first gate dielectric layer 50L can be conformally formed on all physically exposed surfaces of the semiconductor material layer 10, for example, by thermal oxidation of the physically exposed surface portions of the semiconductor material layer 10. If the semiconductor material layer 10 includes single crystalline silicon, the first gate dielectric layer can consist essentially of thermal silicon oxide. The first gate dielectric layer 50L continuous extends over all surfaces of the at least one line trench 49 and over the top surface of the transistor active regions of the semiconductor substrate 8. In one embodiment, the first gate dielectric layer 50L may consist essentially of a semiconductor oxide of a material of the semiconductor substrate 8, and may have the same thickness throughout. The thickness of the first gate dielectric layer 50L can be in a range from 6 nm to 100 nm, such as from 10 nm to 60 nm, although lesser and greater thicknesses can also be employed.

The first semiconductor gate electrode material layer 52L includes a doped semiconductor material, such as doped polysilicon. The first semiconductor gate electrode material layer 52L can be conformally deposited in remaining volumes of the at least one line trench 49 and over the horizontally-extending portions of the first gate dielectric layer 52L. For example, the first semiconductor gate electrode material layer 52L can be deposited by chemical vapor deposition (CVD). The thickness of the first semiconductor gate electrode material layer 52L can be greater than one half of the trench width WT, and the at least one line trench 49 can be filled with the combination of the first gate dielectric layer 50L and the first semiconductor gate electrode material layer 52L. In one embodiment, the thickness of the first semiconductor gate electrode material layer 52L may be in a range from 30 nm to 300 nm, although lesser and greater thicknesses may also be employed.

Each portion of the first semiconductor gate electrode material layer 52L located within a line trench 49 comprise a gate electrode fin portion 52F, which is a fin-shaped portion of a respective gate electrode to be subsequently formed. Each gate electrode fin portion 52F may have a rectangular horizontal cross-sectional area, and is located within a respective one of the at least one line trench 49.

The first silicon oxide capping layer 42A comprises a silicon oxide material, such as undoped silicate glass. The first silicon oxide capping layer 42A may be deposited, for example, by chemical vapor deposition. The thickness of the first silicon oxide capping layer 42A may be in a range from 10 nm to 100 nm, although lesser and greater thicknesses may also be employed.

The first silicon nitride capping layer 44A comprises silicon nitride. The first silicon nitride capping layer 44A may be deposited, for example, by chemical vapor deposition. The thickness of the first silicon nitride capping layer 44A may be in a range from 30 nm to 300 nm, although lesser and greater thicknesses may also be employed.

Referring to FIGS. 3A and 3B, a photoresist layer (not shown) can be applied over the first silicon nitride capping layer 44A, and can be lithographically patterned to cover the first device region A and the second device region B (i.e., the two high voltage regions), and not to cover the third device region C or the fourth device region D (i.e., the low and very low voltage regions). A sequence of etch processes may be performed to remove unmasked portions of the first silicon nitride capping layer 44A, the first silicon oxide capping layer 42A, the first semiconductor gate electrode material layer 52L, and the first gate dielectric layer 50L. The sequence of etch process may comprise at least one isotropic etch process (such as at least one wet etch process) and/or at least one anisotropic etch process (such as at least one reactive ion etch process). The etch process that removes the unmasked portions of the first gate dielectric layer 50L can be selective to the semiconductor material of the semiconductor substrate 8. The photoresist layer can be subsequently removed, for example, by ashing.

Referring to FIGS. 4A and 4B, additional gate dielectric layers (150L, 250L) can be formed on the top surfaces of the transistor active regions of the third device region C and the fourth device region D. In an illustrative example, a second gate dielectric layer 150L can be formed on the top surfaces of the transistor active regions of the third device region C and the fourth device region D, for example, by thermal oxidation of physically exposed surface regions of the semiconductor substrate 8. Portions of the second gate dielectric layer 150L can be removed from the fourth device region D, and a third gate dielectric layer 250L can be formed on the top surface of the transistor active region of the fourth device region D, for example, by thermal oxidation and/or by deposition of a high dielectric constant gate dielectric material. In one embodiment, the third gate dielectric layer 250L can be thinner than the second gate dielectric layer 150L, and the second gate dielectric layer 150L may be thinner than the first gate dielectric layer 50L.

A second semiconductor gate electrode material layer 53L, a second silicon oxide capping layer 42B, and a second silicon nitride capping layer 44B can be sequentially deposited over the semiconductor substrate 8 and over the first silicon nitride capping layer 44A.

The second semiconductor gate electrode material layer 53L includes a doped semiconductor material, such as doped polysilicon. The second semiconductor gate electrode material layer 53L can be deposited directly on top surfaces of the additional gate dielectric layers (150L, 250L). The material composition and the dopant concentration of the second semiconductor gate electrode material layer 53L can be optimized for performance of the transistors to be subsequently formed in the third device region C and in the fourth device region D. Generally, the second semiconductor gate electrode material layer 53L and the first semiconductor gate electrode material layer 52L may have the same material composition, or may have different material compositions. The thickness of the second semiconductor gate electrode material layer 53L can be about the same as the thickness of the first semiconductor gate electrode material layer 52L. In one embodiment, the thickness of the second semiconductor gate electrode material layer 53L may be in a range from 30 nm to 300 nm, although lesser and greater thicknesses may also be employed.

The second silicon oxide capping layer 42B comprises a silicon oxide material such as undoped silicate glass. The second silicon oxide capping layer 42B may be deposited, for example, by chemical vapor deposition. The thickness of the second silicon oxide capping layer 42B may be about the same as the thickness of the first silicon oxide capping layer 42A, and may be in a range from 10 nm to 100 nm, although lesser and greater thicknesses may also be employed.

The second silicon nitride capping layer 44B comprises silicon nitride. The second silicon nitride capping layer 44A may be deposited, for example, by chemical vapor deposition. The thickness of the second silicon nitride capping layer 44B may be about the same as the thickness of the first silicon nitride capping layer 44A, and may be in a range from 30 nm to 300 nm, although lesser and greater thicknesses may also be employed.

Referring to FIGS. 5A and 5B, a photoresist layer (not shown) can be applied over the first exemplary structure, and can be lithographically patterned to cover the third device region C and the fourth device region D without covering the first device region A or the second device region B. A sequence of etch processes can be performed to remove portions of the second silicon nitride capping layer 44B, the second silicon oxide capping layer 42B, and the second semiconductor gate electrode material layer 53L that overlie the first silicon nitride capping layer 44A in the first device region A and the second device region B. The photoresist layer can be subsequently removed, for example, by ashing.

Referring to FIGS. 6A and 6B, a photoresist layer 17 can be applied over the first exemplary structure, and can be lithographically patterned into discrete photoresist material portions that overlie the area of a respective transistor active region that defines the area of a respective combination of a source region, a channel region, and a drain region of a respective field effect transistor. The patterned portion of the photoresist layer 17 located within the first device region A covers the entirety of the area of the at least one line trench 49.

An anisotropic etch process can be performed to etch shallow trenches 19 that vertically extend through the silicon nitride capping layers (44A, 44B), the silicon oxide capping layers (42A, 42B), the semiconductor gate electrode material layers (52L, 53L), and the gate dielectric layers (50L, 150L, 250L), and into an upper portion of the semiconductor material layer 10. The photoresist layer 17 can be employed as an etch mask layer during the anisotropic etch process. The depth of the shallow trenches 19, as measured from the horizontal plane including the top surface of the semiconductor material layer 10, can be in a range from 100 nm to 2,000 nm, such as from 200 nm to 1,000 nm, although lesser and greater depths may also be employed.

The shallow trenches 19 can be interconnected with each other, and laterally surround each of the transistor active regions. The transistor active regions are portions of the semiconductor material layer 10 that are located above the horizontal plane including the bottom surfaces of the shallow trenches and laterally surrounded by a continuous set of sidewalls of the shallow trenches 19. In other words, each unetched portion of the semiconductor material layer 10 laterally surrounded by the shallow trenches 19 constitutes a transistor active region. The photoresist layer 17 can be subsequently removed, for example, by ashing.

Referring to FIGS. 7A and 7B, at least one dielectric fill material can be deposited in the shallow trenches 19 to form a dielectric fill material layer 20L. The at least one dielectric fill material may include undoped silicate glass. The at least one dielectric fill material may be deposited by a conformal deposition process, such as a chemical vapor deposition process.

Referring to FIGS. 8A and 8B, a chemical mechanical planarization process can be performed to remove portions of the dielectric fill material layer 20L from above the horizontal plane including the top surfaces of the silicon nitride capping layers (44A, 44B). Remaining portions of the dielectric fill material layer 20L constitute a shallow trench isolation structure 20. The shallow trench isolation structure 20 can be subsequently vertically recessed so that the top surface of the shallow trench isolation structure 20 are formed at about the horizontal plane including the bottom surfaces of the silicon nitride capping layers (44A, 44B).

Figure 9A:
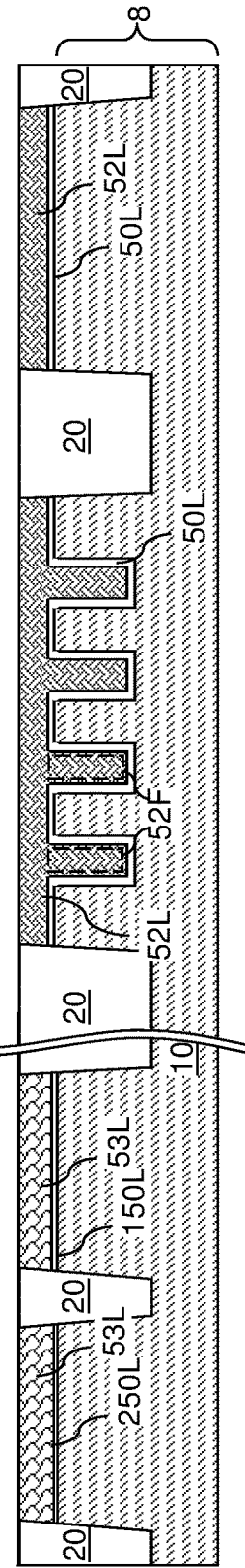
FIG. 9A is a vertical cross-sectional view of the first exemplary structure after removal of the silicon nitride capping layers and the silicon oxide capping layers according to the first embodiment of the present disclosure.
Figure 11B:
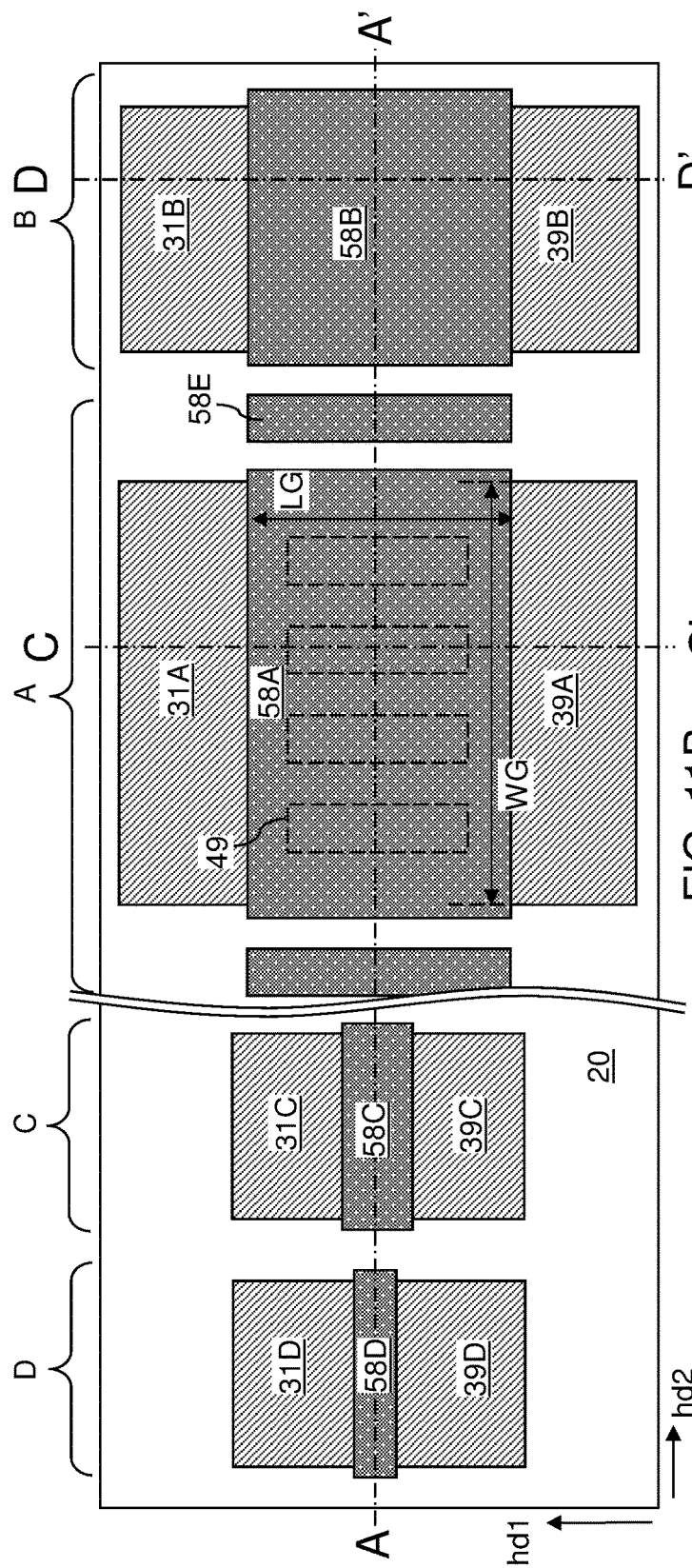
FIG. 11B is a top-down view of the first exemplary structure of FIG. 11A.
Figure 11A:
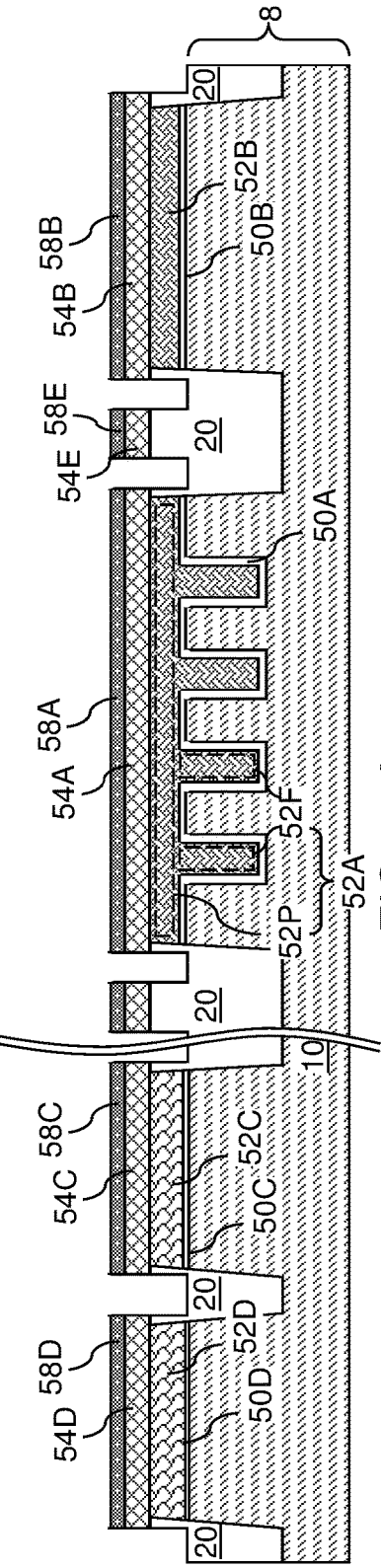
FIG. 11A is a vertical cross-sectional view of the first exemplary structure after formation of gate stacks and source/drain extension regions according to the first embodiment of the present disclosure.
Figure 11C:
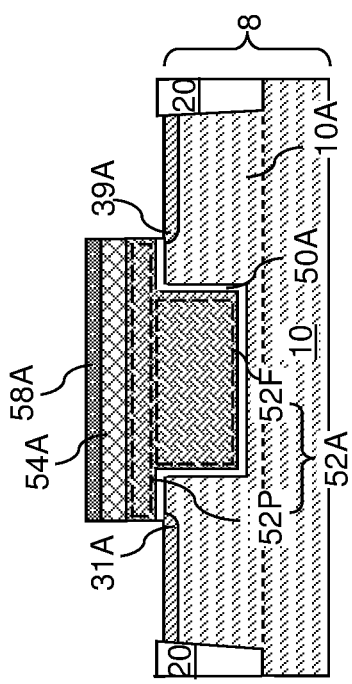
FIG. 11C is a vertical cross-sectional view of the first exemplary structure along the vertical plane C-C' of FIG. 11B.
Figure 11D:
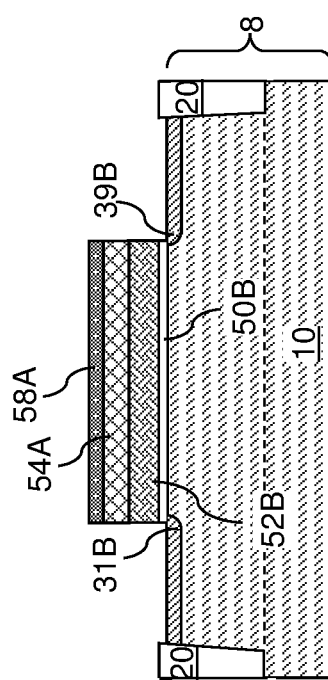
FIG. 11D is a vertical cross-sectional view of the first exemplary structure along the vertical plane D-D' of FIG. 11B.
Figure 13E:
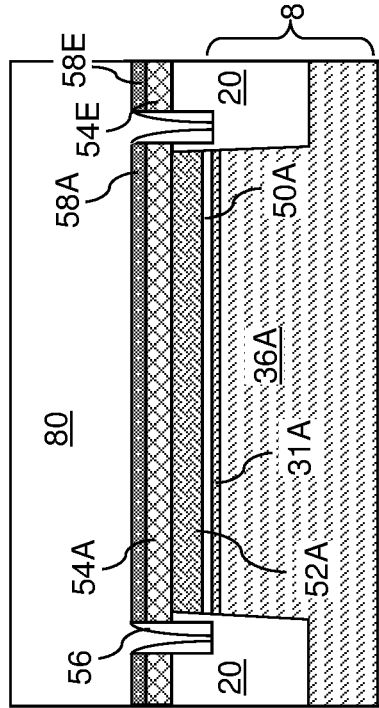
FIG. 13E is a vertical cross-sectional view of the first exemplary structure along the vertical plane E-E' of FIG. 13B.
Figure 13F:
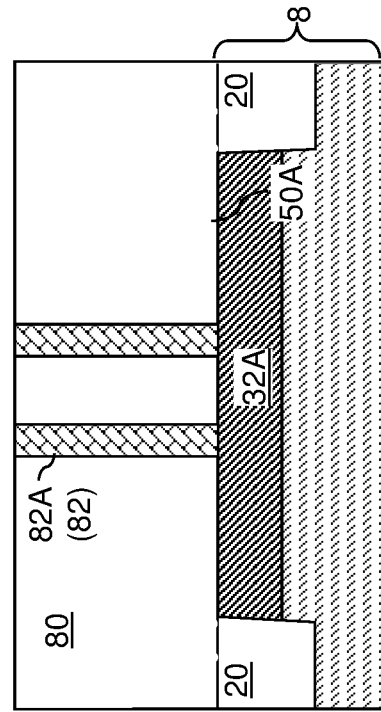
FIG. 13F is a vertical cross-sectional view of the first exemplary structure along the vertical plane F-F' of FIG. 13B.
Figure 13G:
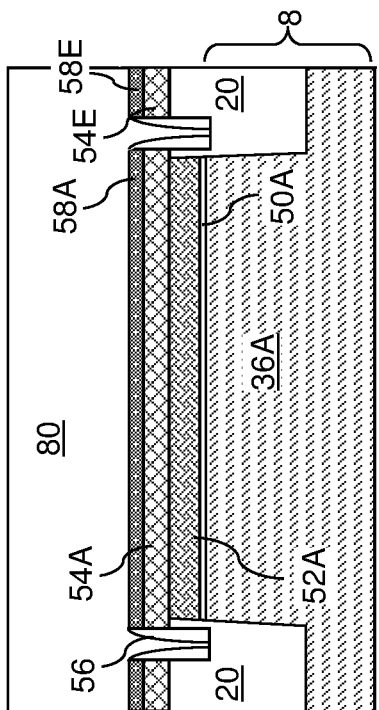
FIG. 13G is a vertical cross-sectional view of the first exemplary structure along the vertical plane G-G' of FIG. 13B.
Figure 13H:
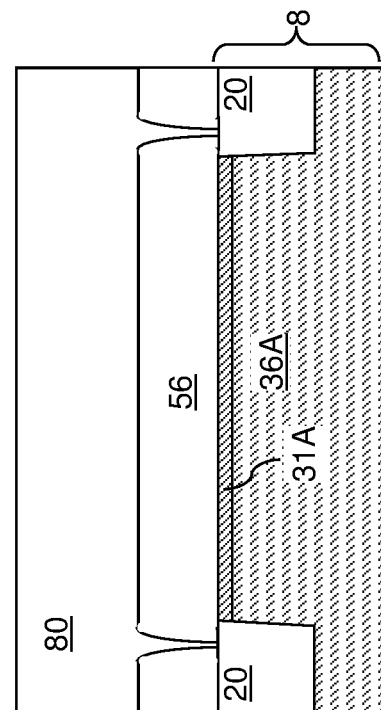
FIG. 13H is a vertical cross-sectional view of the first exemplary structure along the vertical plane H-H' of FIG. 13B.

Referring to FIGS. 9A and 9B, the silicon nitride capping layers (44A, 44B) can be removed selective to the shallow trench isolation structure 20 and the silicon oxide capping layers (42A, 42B). For example, a wet etch process employing hot phosphoric acid can be performed to remove the silicon nitride capping layers (44A, 44B). Subsequently, an etch process that etches the silicon oxide material of the silicon oxide capping layers (42A, 42B) can be performed to remove the silicon oxide capping layers (42A, 42B) selective to the materials of the semiconductor gate electrode material layers (52L, 53L). In one embodiment, the etch process may comprise a wet etch process employing dilute hydrofluoric acid. The top surface of the shallow trench isolation structure 20 can be collaterally vertically recessed during the etch process. In one embodiment, the top surface of the shallow trench isolation structure 20 can be located about the height of the top surfaces of the semiconductor gate electrode material layers (52L, 53L). The shallow trench isolation structure 20 can be formed through the semiconductor gate electrode material layers (52L, 53L) and the gate dielectric material layers (50L, 150L, 250L) and into an upper portion of the semiconductor substrate 8.

Referring to FIGS. 10A and 10B, a metallic (i.e., electrically conductive) gate electrode material layer 54L can be deposited directly on top surfaces of the semiconductor gate electrode material layers (52L, 53L). The metallic gate electrode material layer 54L comprises metallic material such as a transition metal, a conductive metallic nitride material (such as TiN, TaN, or WN), or metal silicide material. The metallic gate electrode material layer 54L may be deposited by physical vapor deposition and/or chemical vapor deposition. The metallic gate electrode material layer 54L can have a thickness in a range from 50 nm to 150 nm, although lesser and greater thicknesses may also be employed.

A gate capping dielectric layer 58L can be subsequently deposited over the metallic gate electrode material layer 54L. The gate capping dielectric layer 58L can include a passivation dielectric material, such as silicon nitride. The gate capping dielectric layer 58L can be deposited, for example, by chemical vapor deposition. The thickness of the gate capping dielectric layer 58L can be in a range from 10 nm to 100 nm, such as from 20 nm to 60 nm, although lesser and greater thicknesses may also be employed.

Referring to FIGS. 11A-11D, a photoresist layer (not shown) can be applied over the gate capping dielectric layer 58L, and can be patterned into discrete photoresist material portions by lithographic exposure and development. Each patterned photoresist material portion can have a shape of a respective gate stack to be subsequently formed. In one embodiment, the transistor active regions may have a respective rectangular horizontal cross-sectional shape having a respective pair of lengthwise sidewalls along the first horizontal direction hd1 and a respective pair of widthwise sidewalls along the second horizontal direction hd2. In this case, each patterned photoresist material portion may have a rectangular horizontal cross-sectional shape having a lesser dimension along the first horizontal direction hd1 than the length of a respective underlying transistor active region, and having a greater dimension along the second horizontal direction hd2 than the width of the respective underlying transistor active region.

A first gate stack (50A, 52A, MA, 58A) can be formed in the first device region A. A second gate stack (50B, 52B, MB, 58B) can be formed in the second device region B. A third gate stack (50C, 52C, MC, 58C) can be formed in the third device region C. A fourth gate stack (50D, 52D, MD, 58D) can be formed in the fourth device region D. The first gate stack (50A, 52A, MA, 58A) includes a first gate dielectric 50A that is a first patterned portion of the first gate dielectric layer 50L, a first semiconductor gate electrode portion 52A that is a patterned portion of the first semiconductor gate electrode material layer 52L including a planar semiconductor gate electrode portion 52P and at least one gate electrode fin portions 52F, a first metallic gate electrode portion MA that is a patterned portion of the metallic gate electrode material layer ML, and a first gate capping dielectric 58A that is a patterned portion of the gate capping dielectric layer 58L. The second gate stack (50B, 52B, MB, 58B) includes a second gate dielectric 50B that is a second patterned portion of the first gate dielectric layer SOL, a second semiconductor gate electrode portion 52B that is a patterned portion of the first semiconductor gate electrode material layer 52L, a second metallic gate electrode portion MB that is a patterned portion of the metallic gate electrode material layer ML, and a second gate capping dielectric 58B that is a patterned portion of the gate capping dielectric layer 58L. The third gate stack (50C, 52C, 54C, 58C) includes a third gate dielectric 50C that is a patterned portion of the second gate dielectric layer 150L, a third semiconductor gate electrode portion 52C that is a patterned portion of the second semiconductor gate electrode material layer 53L, a third metallic gate electrode portion 54C that is a patterned portion of the metallic gate electrode material layer 54L, and a third gate capping dielectric 58C that is a patterned portion of the gate capping dielectric layer 58L. The fourth gate stack (50D, 52D, 54D, 58D) includes a fourth gate dielectric 50D that is a patterned portion of the third gate dielectric layer 250L, a fourth semiconductor gate electrode portion 52D that is a patterned portion of the second semiconductor gate electrode material layer 53L, a fourth metallic gate electrode portion 54C that is a patterned portion of the metallic gate electrode material layer 54L, and a fourth gate capping dielectric 58D that is a patterned portion of the gate capping dielectric layer 58L. Dummy gate stacks (54E, 58E) may be optionally formed over areas of the shallow trench isolation structure 20. In this case, each dummy gate stack (54E, 58E) may comprise a stack of a dummy metallic gate electrode 54E and a dummy gate capping dielectric 58E.

The combination of the first semiconductor gate electrode portion 52A and the first metallic gate electrode portion 54A constitutes a first gate electrode (52A, 54A). The combination of the second semiconductor gate electrode portion 52B and the second metallic gate electrode portion 54B constitutes a second gate electrode (52B, 54B). The combination of the third semiconductor gate electrode portion 52C and the third metallic gate electrode portion MC constitutes a third gate electrode (52C, MC). The combination of the fourth semiconductor gate electrode portion 52D and the fourth metallic gate electrode portion MD constitutes a fourth gate electrode (52D, MD).

The first gate dielectric 50A comprises vertically-extending portions and a horizontally-extending portion adjoined to an upper end of each of the vertically-extending portions. The first gate dielectric 50A is formed on and directly contacts the at least one line trench 49 and a segment of a top surface of the first transistor active region located in the first device region A. In one embodiment, the first gate dielectric 50A contacts all surfaces of the at least one line trench 49, such as the plurality of line trenches 49.

The first semiconductor gate electrode portion 52A comprises a planar semiconductor gate electrode portion 52P and at least one gate electrode fin portion 52F (such as a plurality of gate electrode fin portions 52F). The first gate electrode (52A, MA) comprises a planar gate electrode portion (52P, MA) that overlies the first transistor active region, and at least one gate electrode fin portion 52F located within a respective one of the at least one line trench 49. In one embodiment, the planar gate electrode portion (52P, MA) comprises a pair of lengthwise sidewalls that laterally extend along the first horizontal direction hd1, and a pair of widthwise sidewalls that laterally extend along the second horizontal direction hd2.

In one embodiment, the at least one line trench 49 comprises a plurality of line trenches 49 having a respective pair of lengthwise sidewalls that laterally extend along the first horizontal direction hd1 and laterally spaced from each other along a second horizontal direction hd2 that is perpendicular to the first horizontal direction hd1. In one embodiment, each of the plurality of line trenches 49 has a same length along the first horizontal direction hd1 (such as the trench length LT shown in FIG. 1B) and a same width along the second horizontal direction hd2 (such as the trench width WT shown in FIG. 1B). In one embodiment, the line trenches 49 within the plurality of line trenches 49 may be spaced from each other by a same trench spacing ST (shown in FIG. 1B).

The first gate electrode (52A, MA) comprises a planar gate electrode portion (52P, MA) that overlies the top surface of the semiconductor substrate 8 and at least one gate electrode fin portion 52F located within a respective one of the at least one line trench 49. In one embodiment, each of the plurality of line trenches 49 may be located entirely within an area of the planar gate electrode portion (52P, MA) in a plan view along a vertical direction that is perpendicular to the top surface of the semiconductor substrate 8. In one embodiment, the planar gate electrode portion (52P, MA) can have a rectangular horizontal cross-sectional shape. For example, the planar gate electrode portion (52P, MA) may have a gate length LG along the first horizontal direction hd1, and may have a gate width WG along the second horizontal direction hd2.

At least one implantation mask layer, such as at least one patterned photoresist layer, can be formed over the first exemplary structure. Electrical dopants can be implanted into unmasked portions of the semiconductor material layer 10 that are not masked by a respective combination of an implantation mask layer and the gate stacks to form various source/drain extension regions (31A, 39A, 31B, 39B, 31C, 39C, 31D, 39D). The various source/drain extension regions (31A, 39A, 31B, 39B, 31C, 39C, 31D, 39D) may include, for example, a first source extension region 31A, a first drain extension region 39A, a second source extension region 31B, a second drain extension region 39B, a third source extension region 31C, a third drain extension region 39C, a fourth source extension region 31D, and a fourth drain extension region 39D. Generally, each of the source/drain extension regions (31A, 39A, 31B, 39B, 31C, 39C, 31D, 39D) can have a doping of an opposite conductivity type than the conductivity type of a remaining portion of the transistor active region on which the respective one of the source/drain extension regions (31A, 39A, 31B, 39B, 31C, 39C, 31D, 39D) is formed. For example, if a transistor active region has a doping of a first conductivity type, the source/drain extension regions (31A, 39A, 31B, 39B, 31C, 39C, 31D, 39D) that are formed within surface regions of the transistor active region has a doping of a second conductivity type that is the opposite of the first conductivity type. For example, if the first conductivity type is p-type, the second conductivity type is n-type, and vice versa. The atomic concentration of dopants in the source/drain extension regions (31A, 39A, 31B, 39B, 31C, 39C, 31D, 39D)

may be in a range from $1.0\times10^{17}/cm^3$ to $1.0\times10^{20}/cm^3$, although lesser and greater dopant concentrations may also be employed.

Referring to FIGS. 12A-12D, at least one dielectric spacer material layer can be conformally deposited, and an anisotropic etch process can be performed to remove horizontally-extending portions of the at least one dielectric spacer material layer. The at least one dielectric spacer material layer includes a dielectric material, such as silicon oxide and/or silicon nitride, and may be formed by at least one chemical vapor deposition process such as at least one low pressure chemical vapor deposition (LPCVD) process. Remaining portion of the at least one dielectric spacer material layer comprise dielectric gate spacers 56 that laterally surround a respective one of the gate stacks or a respective one of the dummy gate stacks. For example, one of the dielectric gate spacers 56 laterally surrounds the first gate stack (50A, 52A, 54A, 58A).

At least one implantation mask layer, such as at least one patterned photoresist layer, can be formed over the first exemplary structure. Electrical dopants can be implanted into unmasked portions of the semiconductor material layer 10 that are not masked by a respective combination of an implantation mask layer, the gate stacks, and the dielectric gate spacers 56 to form various deep source/drain regions (32A, 38A, 32B, 38B, 32C, 38C, 32D, 38D). The various source/deep drain regions (32A, 38A, 32B, 38B, 32C, 38C, 32D, 38D) may include, for example, a first deep source region 32A, a first deep drain region 38A, a second deep source region 32B, a second deep drain region 38B, a third deep source region 32C, a third deep drain region 38C, a fourth deep source region 32D, and a fourth deep drain region 38D. Generally, each of the deep source/drain regions (32A, 38A, 32B, 38B, 32C, 38C, 32D, 38D) can have the same conductivity type as the conductivity type of a respective source/drain extension region (31A, 39A, 31B, 39B, 31C, 39C, 31D, 39D) on which the respective deep source/drain region (32A, 38A, 32B, 38B, 32C, 38C, 32D, 38D) is formed. Generally, the atomic concentration of dopants in the deep source/drain region (32A, 38A, 32B, 38B, 32C, 38C, 32D, 38D) is greater than the atomic concentration of dopants in the source/drain extension regions (31A, 39A, 31B, 39B, 31C, 39C, 31D, 39D). As such, volumes of the source/drain extension regions (31A, 39A, 31B, 39B, 31C, 39C, 31D, 39D) that overlap with volumes of the deep source/drain region (32A, 38A, 32B, 38B, 32C, 38C, 32D, 38D) are incorporated into a respective one of the deep source/drain region (32A, 38A, 32B, 38B, 32C, 38C, 32D, 38D). In one embodiment, the atomic concentration of dopants in the deep source/drain regions (32A, 38A, 32B, 38B, 32C, 38C, 32D, 38D) may be in a range from $5.0\times10^{18}/cm^3$ to $2.0\times10^{21}/cm^3$, although lesser and greater dopant concentrations may also be employed.

Unimplanted portions of each transistor active region constitutes a respective channel region (36A, 36B, 36C, 36D). Each channel region may have a dopant concentration of the first conductivity type in a range from $1.0\times10^{14}/cm^3$ to $1.0\times10^{18}/cm^3$, although lesser and greater dopant concentrations may also be employed. The plurality of line trenches 49 extend through the first channel region 36A in the first device region A. Thus, the gate electrode fin portions 52F may protrude vertically (i.e., perpendicular to the major surface of the substrate 8) into the first channel region 36A, such that the bottom surfaces of the gate electrode fin portions 52F are located below the top surface of the first channel region 36A. However, the line trenches may be absent in the second, third and fourth channel regions (36B, 36C, 36D) in the second, third and fourth device regions B, C and D.

Each contiguous combination of a respective one of source/drain extension regions (31A, 39A, 31B, 39B, 31C, 39C, 31D, 39D) and a respective one of the deep source/drain region (32A, 38A, 32B, 38B, 32C, 38C, 32D, 38D) constitutes a source/drain region, which may be a source region including a combination of a source extension region and a deep source region, or may be drain region including a combination of a drain extension region and a deep drain region. Each respective channel region (36A, 36B, 36C, 36D) is located between a respective source region and a respective drain region along the first horizontal direction hd1.

Generally, a source region and a drain region can be formed in portions of each transistor active region that are laterally spaced from each other by a respective channel region a plan view. For example, a first source region (31A, 32A) and a first drain region (39A, 38A) can be formed in portions of the first transistor active region that are laterally spaced from each other by the first channel region 36A in the plan view. The first channel region 36 comprises a portion of the first transistor active region and laterally surrounds and underlies each of the plurality of line trenches 49. The first gate dielectric 50A contacts all surfaces of the line trenches 49, and comprises a planar gate dielectric portion that extends over the entirety of the top surface of the first channel region 36A and gate electrode fin portions 52F which are located in the line trenches 49 and extend into the first channel region 36A.

In one embodiment, the planar gate electrode portion (52P, MA) of the first gate electrode (52A, MA) comprises a vertical stack including a planar semiconductor gate electrode portion 52P that is adjoined to the at least one gate electrode fin portion 52F, and a planar metallic gate electrode portion MA that overlies the planar semiconductor gate electrode portion 52P. In one embodiment, the planar semiconductor gate electrode portion 52P and the at least one gate electrode fin portion 52F consist of a same doped semiconductor material.

In one embodiment, the planar gate dielectric portion (52P, MA) of the first gate electrode (52A, MA) comprises a first pair of lengthwise sidewalls that are sidewalls of the planar semiconductor gate electrode portion 52P, and a second pair of lengthwise sidewalls that are sidewalls of the metallic gate electrode portion MA. The first pair of lengthwise sidewalls and the second pair of lengthwise sidewalls laterally extend along the first horizontal direction hd1. The first pair of lengthwise sidewalls (which are sidewalls of the planar semiconductor gate electrode portion 52P) contact a respective sidewall segment of the shallow trench isolation structure 20.

In one embodiment, a top surface of the planar semiconductor gate electrode portion 52P is located within a horizontal plane including a top surface of the shallow trench isolation structure 20. In one embodiment, the planar metallic gate electrode portion MA has a same lateral extent as the planar semiconductor gate electrode portion 52P along the first horizontal direction hd1, and the planar metallic gate electrode portion MA has a greater lateral extent than the planar semiconductor gate electrode portion 52P along a second horizontal direction hd2 that is perpendicular to the first horizontal direction hd1 and contacts surface segments of a top surface of the shallow trench isolation structure 20.

Generally, a source region and a drain region of each field effect transistor can be embedded in the semiconductor substrate 8, and can be laterally spaced from each other by a respective channel region. In one embodiment, the channel region, the source region, and the drain region of each field effect transistor comprise a respective portion of a single crystalline semiconductor material within the semiconductor substrate 8. The semiconductor gate electrode portions (52A, 52B, 52C, 52D) may include a respective doped polycrystalline semiconductor material portion. Thus, the at least one gate electrode fin 52F may comprise a respective doped polycrystalline semiconductor material portion.

A first field effect transistor 60A formed in the first device region A. The first field effect transistor 60A may be a high voltage word line switching transistor for a three dimensional NAND memory device. In the first field effect transistor 60A, the first channel region 36A can have a doping of a first conductivity type, and the source region (31A, 32A) and the drain region (39A, 38A) can have a doping a second conductivity type that is an opposite of the first conductivity type. All surfaces of the at least one line trench 49 may be surfaces of the first channel region 36A.

A second field effect transistor 60B can be provided in the second device region B. A second transistor active region that comprises an additional portion of the semiconductor substrate 8 can be provided in the second device region B. The second field effect transistor 60B can be located on the second transistor active region, and can an additional gate dielectric (such as the second gate dielectric 50B) that consists of an additional planar gate dielectric portion that contacts a top surface of the second transistor active region, and having the same thickness and the same material composition as the first gate dielectric 50A. The first gate dielectric 50A and the second gate dielectric 50B may consist of a semiconductor oxide of the material of the semiconductor substrate 8 (such as thermal silicon oxide) and may have a same thickness throughout. A third field effect transistor 60C can be provided in the third device region C, and a fourth field effect transistor 60D can be provided in the fourth device region D. In one embodiment, the first field effect transistor and the second field effect transistor may be high voltage field effect transistors, the third field effect transistor may be a low voltage field effect transistor, and the fourth field effect transistor may be a very low voltage field effect transistor.

Referring to FIGS. 13A-13H, at least one dielectric liner (not shown) can be optionally formed over the physically exposed surfaces of the first exemplary structure by at least one conformal deposition process. The at least one dielectric liner, if present, may comprise, for example, a stack of a silicon oxide liner and a silicon nitride liner. A contact-level dielectric layer 80 can be deposited over the gate stacks, the source/drain regions, the shallow trench isolation structure 20, and the optional at least one dielectric liner. The contact-level dielectric layer 80 comprises a dielectric material, such as silicon oxide. A planarization process such as a chemical mechanical planarization process can be optionally performed to planarize the top surface of the contact-level dielectric layer 80. The vertical distance between the top surface of the contact-level dielectric layer 80 and the top surfaces of the gate capping dielectrics (58A, 58B, 58C, 58D) may be in a range from 50 nm to 500 nm, although lesser and greater vertical distances may also be employed.

Contact via voids can be formed through the contact-level dielectric layer 80, and can be filled with at least one conductive material. Excess portions of the at least one conductive material can be removed from above the horizontal plane including the top surface of the contact-level dielectric layer 80 by a planarization process, which may include a recess etch process and/or a chemical mechanical planarization process. Each remaining portion of the at least one conductive material constitutes a contact via structure (82, 85, 88). The contact via structures (82, 85, 88) may comprise source contact via structures 82 contacting a respective one of the source regions, drain contact via structures 88 contacting a respective one of the drain regions, and gate contact via structures 85 contacting a respective one of the gate electrodes. The source contact via structures 82 may comprise a first source contact via structure 82A contacting a first deep source region 32A, a second source contact via structure 82B contacting a second deep source region 32B, a third source contact via structure 82C contacting a third deep source region 32C, and a fourth source contact via structure 82D contacting a fourth deep source region 32D. The drain contact via structures 88 may comprise a first drain contact via structure 88A contacting a first deep drain region 38A, a second drain contact via structure 88B contacting a second deep drain region 38B, a third drain contact via structure 88C contacting a third deep drain region 38C, and a fourth drain contact via structure 88D contacting a fourth deep drain region 38D. The gate contact via structures 85 may comprise at least one first gate contact via structure 85A contacting the first metallic gate electrode portion 54A, at least one second gate contact via structure 85B contacting the second metallic gate electrode portion 54B, a third gate contact via structure 85C contacting the third metallic gate electrode portion 54C, and a fourth gate contact via structure 85D contacting the fourth metallic gate electrode portion 54D.

Referring to FIGS. 14A and 14B, a second exemplary structure according to a second embodiment of the present disclosure can be derived from the first exemplary illustrated in FIGS. 1A and 1B by increasing the length of the at least one line trench 49 along the first horizontal direction hd1, i.e., by increasing the trench length LT of each of the at least one line trench 49. Specifically, the trench length LT can be selected so that the trench length LT is greater than the gate length (i.e., the length of the gate electrode to be subsequently formed) of the first field effect transistor to be subsequently formed in the first device region A, and is less than the sum of the gate length and twice the base with of a dielectric gate spacer to be subsequently formed in the first device region A.

Generally, at least one line trench 49 can be formed in a transistor active region of a semiconductor substrate 8 in the first device region A. Each of the at least one line trench 49 extends downward from the top surface of a first transistor active region in the first device region A, and laterally extends along the first horizontal direction hd1. In one embodiment, the at least one line trench 49 comprises a plurality of line trenches 49 including a respective pair of lengthwise sidewalls that laterally extend along the first horizontal direction hd1 and laterally spaced apart along the second horizontal direction hd2. In one embodiment, each of plurality of line trenches 49 comprises a respective upper periphery that coincides with a periphery of a respective opening in the top surface of the semiconductor substrate 8.

Referring to FIGS. 15A and 15B, the processing steps of FIGS. 2A and 2B can be performed to form a layer stack including a first gate dielectric layer 50L, a first semiconductor gate electrode material layer 52L, a first silicon oxide capping layer 42A, and a first silicon nitride capping layer 44A over the semiconductor substrate 8. In one embodiment, the first gate dielectric layer 50L can contact all surfaces of the at least one line trench 49.

Referring to FIGS. 16A and 16B, the processing steps of FIGS. 3A and 3B can be performed to remove portions of the layer stack of the first gate dielectric layer 50L, the first semiconductor gate electrode material layer 52L, the first silicon oxide capping layer 42A, and the first silicon nitride capping layer 44A from the third device region C and from the fourth device region D. The processing steps of FIGS. 4A and 4B can be performed to form additional gate dielectric layers (150L, 250L), a second semiconductor gate electrode material layer 53L, a second silicon oxide capping layer 42B, and a second silicon nitride capping layer 44B. The processing steps of FIGS. 5A and 5B can be performed to remove portions of the second silicon nitride capping layer 44B, the second silicon oxide capping layer 42B, and the second semiconductor gate electrode material layer 53L that overlie the first silicon nitride capping layer 44A in the first device region A and the second device region B.

Referring to FIGS. 17A and 17B, the processing steps of FIGS. 6A and 6B can be performed to form shallow trenches 19. The processing steps of FIGS. 7A and 7B can be performed to form a dielectric fill material layer 20L. The processing steps of FIGS. 8A and 8B can be performed to form a shallow trench isolation structure 20. The shallow trench isolation structure 20 can be subsequently vertically recessed so that the top surface of the shallow trench isolation structure 20 is formed at about the horizontal plane including the bottom surfaces of the silicon nitride capping layers (44A, 44B). Subsequently, the processing steps of FIGS. 9A and 9B can be performed to remove the silicon nitride capping layers (44A, 44B) selective to the shallow trench isolation structure 20 and the silicon oxide capping layers (42A, 42B). In one embodiment, the top surface of the shallow trench isolation structure 20 can be located about the height of the top surfaces of the semiconductor gate electrode material layers (52L, 53L). The shallow trench isolation structure 20 can be formed through the semiconductor gate electrode material layers (52L, 53L) and the gate dielectric material layers (SOL, 150L, 250L) and into an upper portion of the semiconductor substrate 8.

Referring to FIGS. 18A and 18B, the processing steps of FIGS. 10A and 10B can be performed to form a metallic gate electrode material layer 54L directly on top surfaces of the semiconductor gate electrode material layers (52L, 53L). The metallic gate electrode material layer 54L comprises metallic material such as a transition metal, a conductive metallic nitride material (such as TiN, TaN, or WN), or metal silicide material. The metallic gate electrode material layer 54L may be deposited by physical vapor deposition and/or chemical vapor deposition. The metallic gate electrode material layer 54L can have a thickness in a range from 50 nm to 150 nm, although lesser and greater thicknesses may also be employed.

A gate capping dielectric layer 58L can be subsequently deposited over the metallic gate electrode material layer 54L. The gate capping dielectric layer 58L can include a passivation dielectric material, such as silicon nitride. The gate capping dielectric layer 58L can be deposited, for example, by chemical vapor deposition. The thickness of the gate capping dielectric layer 58L can be in a range from 10 nm to 100 nm, such as from 20 nm to 60 nm, although lesser and greater thicknesses may also be employed.

Referring to FIGS. 19A-19H, a photoresist layer (not shown) can be applied over the gate capping dielectric layer 58L, and can be patterned into discrete photoresist material portions by lithographic exposure and development. Each patterned photoresist material portion can have a shape of a respective gate stack to be subsequently formed. In one embodiment, the transistor active regions may have a respective rectangular horizontal cross-sectional shape having a respective pair of lengthwise sidewalls along the first horizontal direction hd1 and a respective pair of widthwise sidewalls along the second horizontal direction hd2. In this case, each patterned photoresist material portion may have a rectangular horizontal cross-sectional shape having a lesser dimension along the first horizontal direction hd1 than the length of a respective underlying transistor active region, and having a greater dimension along the second horizontal direction hd2 than the width of the respective underlying transistor active region.

According to an aspect of the present disclosure, a patterned photoresist material portion can be formed in the first device region A such that the patterned photoresist material portion has a rectangular horizontal cross-sectional shape. The patterned photoresist material portion in the first device region A can have a first gate length along the first horizontal direction hd1 that is less than the trench length LT of the at least one line trench 49 along the first horizontal direction, and a first gate width along the second horizontal direction hd2 that is greater than the width of the first transistor active region within the first device region A. The patterned photoresist material portion in the first device region A can be positioned such that end portions of each line trench 49 are not covered by the patterned photoresist material portion in the first device region A. In one embodiment, a first end portion and a second end portion of each line trench 49 that are laterally spaced apart along the first horizontal direction hd1 are not covered by the patterned photoresist material portion in the first device region A.

The gate capping dielectric layer 58L and the at least one gate electrode material layer (ML, 52L) can be patterned by performing an anisotropic etch process that etches unmasked portions of the gate capping dielectric layer 58L and the at least one gate electrode material layer (ML, 52L) selective to the gate dielectric layers (50L, 150L, 250L). Each patterned portion of the gate capping dielectric layer 58L constitutes a gate capping dielectric (58A, 58B, 58C, 58D). Each patterned portion of the at least one gate electrode material layer (ML, 52L) constitutes a gate electrode {(52A, MA), (52B, MB), (52C, MC), (52D, MD). Dummy gate stacks (ME, 58E) may be optionally formed over areas of the shallow trench isolation structure 20. In this case, each dummy gate stack (ME, 58E) may comprise a stack of a dummy metallic gate electrode ME and a dummy gate capping dielectric 58E.

The combination of the first semiconductor gate electrode portion 52A and the first metallic gate electrode portion MA constitutes a first gate electrode (52A, MA). The combination of the second semiconductor gate electrode portion 52B and the second metallic gate electrode portion MB constitutes a second gate electrode (52B, MB). The combination of the third semiconductor gate electrode portion 52C and the third metallic gate electrode portion MC constitutes a third gate electrode (52C, MC). The combination of the fourth semiconductor gate electrode portion 52D and the fourth metallic gate electrode portion MD constitutes a fourth gate electrode (52D, MD).

The first gate electrode (52A, MA) comprises a first semiconductor gate electrode portion 52A and a first metallic gate electrode portion MA. The first semiconductor gate electrode portion 52A is a patterned portion of the first semiconductor gate electrode material layer 52L including a planar semiconductor gate electrode portion 52P and at least one gate electrode fin portion 52F. The first metallic gate electrode portion MA that is a patterned portion of the metallic gate electrode material layer ML. The second gate electrode (52B, MB) comprises a second semiconductor gate electrode portion 52B and a second metallic gate electrode portion MB. The second semiconductor gate electrode portion 52B is a patterned portion of the second semiconductor gate electrode material layer 52L. The second metallic gate electrode portion MB that is a patterned portion of the metallic gate electrode material layer ML. The third gate electrode (52C, MC) comprises a third semiconductor gate electrode portion 52C and a third metallic gate electrode portion MC. The third semiconductor gate electrode portion 52C is a patterned portion of the second semiconductor gate electrode material layer 53L. The third metallic gate electrode portion MC is a patterned portion of the metallic gate electrode material layer ML. The fourth gate electrode (52D, MD) comprises a fourth semiconductor gate electrode portion 52D and a fourth metallic gate electrode portion MD. The fourth semiconductor gate electrode portion 52D is a patterned portion of the second semiconductor gate electrode material layer 53L. The fourth metallic gate electrode portion MC is a patterned portion of the metallic gate electrode material layer ML.

In one embodiment, the first semiconductor gate electrode portion 52A comprises a planar semiconductor gate electrode portion 52P and at least one gate electrode fin portion 52F (such as a plurality of gate electrode fin portions 52F). The first gate electrode (52A, MA) comprises a planar gate electrode portion (52P, MA) that overlies the first transistor active region, and at least one gate electrode fin portion 52F located within a respective one of the at least one line trench 49. In one embodiment, the planar gate electrode portion (52P, MA) comprises a pair of lengthwise sidewalls that laterally extend along the first horizontal direction hd1, and a pair of widthwise sidewalls that laterally extend along the second horizontal direction hd2.

In one embodiment, the at least one line trench 49 comprises a plurality of line trenches 49 having a respective pair of lengthwise sidewalls that laterally extend along the first horizontal direction hd1 and laterally spaced from each other along a second horizontal direction hd2 that is perpendicular to the first horizontal direction hd1. In one embodiment, each of the plurality of line trenches 49 has a same length along the first horizontal direction hd1 (such as the trench length LT) and a same width along the second horizontal direction hd2 (such as the trench width WT). In one embodiment, the line trenches 49 within the plurality of line trenches 49 may be spaced from each other by a same trench spacing ST.

The first gate electrode (52A, MA) comprises a planar gate electrode portion (52P, MA) that overlies the top surface of the semiconductor substrate 8 and at least one gate electrode fin portion 52F located within a respective one of the at least one line trench 49. In one embodiment, each of the plurality of line trenches 49 may be located entirely within an area of the planar gate electrode portion (52P, MA) in a plan view along a vertical direction that is perpendicular to the top surface of the semiconductor substrate 8. In one embodiment, the planar gate electrode portion (52P, MA) can have a rectangular horizontal cross-sectional shape. For example, the planar gate electrode portion (52P, MA) may have a gate length LG along the first horizontal direction hd1, and may have a gate width WG along the second horizontal direction hd2.

Figure 19C:
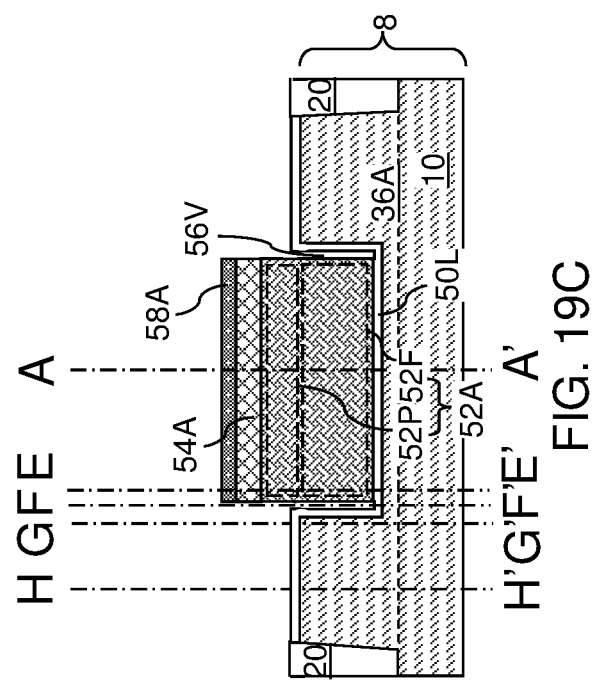
FIG. 19C is a vertical cross-sectional view of the second exemplary structure along the vertical plane C-C' of FIG. 19B.
Figure 19D:
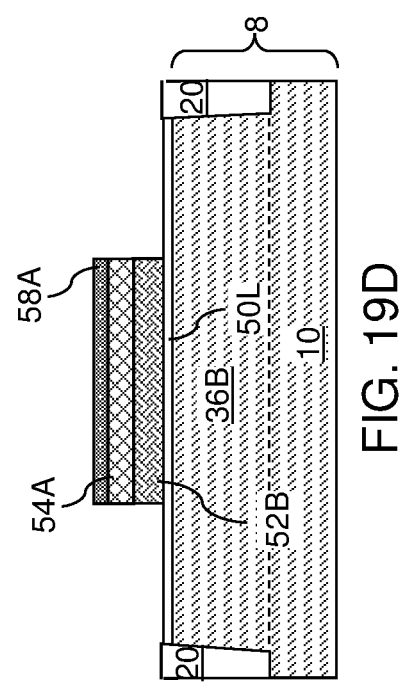
FIG. 19D is a vertical cross-sectional view of the second exemplary structure along the vertical plane D-D' of FIG. 19B.
Figure 19E:
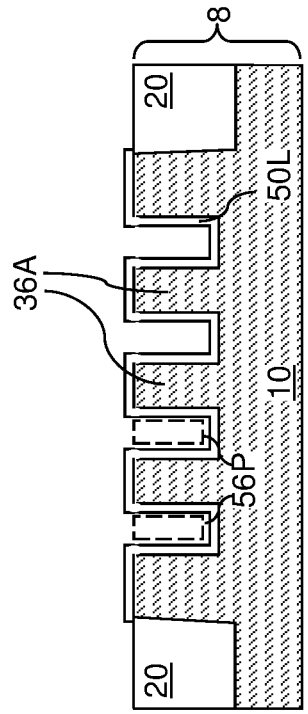
FIG. 19E is a vertical cross-sectional view of the second exemplary structure along the vertical plane E-E' of FIG. 19B.
Figure 19F:
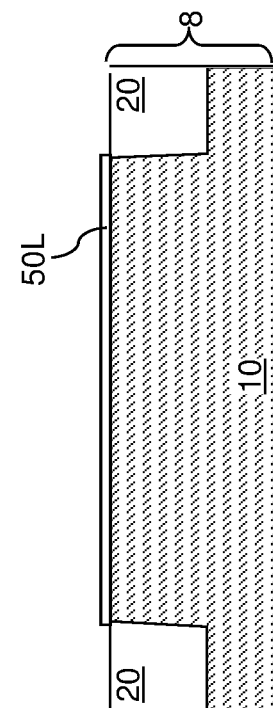
FIG. 19F is a vertical cross-sectional view of the second exemplary structure along the vertical plane F-F' of FIG. 19B.
Figure 19G:
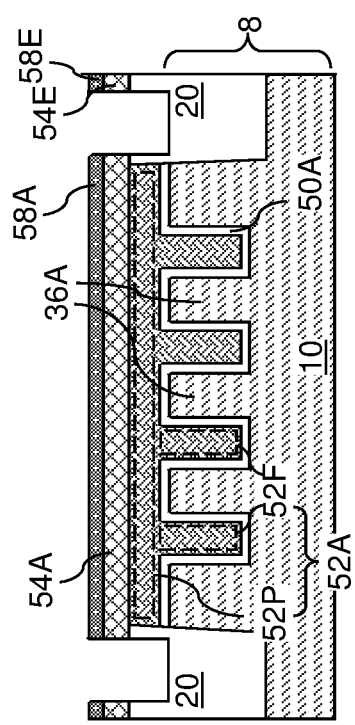
FIG. 19G is a vertical cross-sectional view of the second exemplary structure along the vertical plane G-G' of FIG. 19B.
Figure 19H:
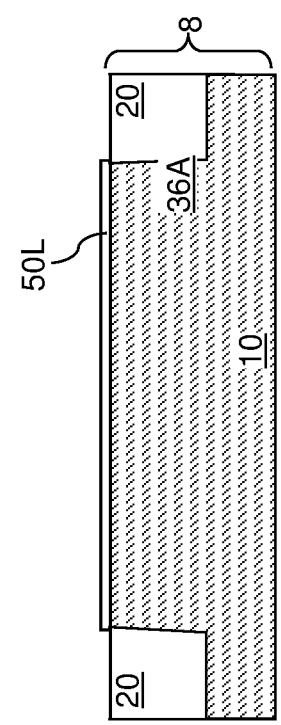
FIG. 19H is a vertical cross-sectional view of the second exemplary structure along the vertical plane H-H' of FIG. 19B.

According to an embodiment of the present disclosure shown in FIG. 19C, a pair of voids 56V can be formed within each line trench 49. In this case, the gate length LG is less than the trench length LT by a length difference that is greater than twice the thickness of the first gate dielectric layer 50L. Each void 56V vertically extends from the horizontal plane including the topmost surface of the first gate dielectric layer 50L to a horizontal plane including the top surface segments of each horizontally-extending portion of the first gate dielectric layer 50L that contacts a respective bottom surface of the at least one line trench 49. Thus, the depth of each void 56V can be the same as the depth of each line trench 49. An inner sidewall of the first gate dielectric layer 50L, a pair of end segments of sidewalls of the first gate dielectric layer 50L, and an end surface of a gate electrode fin portion 56F can be exposed around each void 56V in a respective line trench 49. The lateral dimension of each void 56V along the first horizontal direction may be about one half of the dimension that is the trench length LT less the gate length LG less twice the thickness of the first gate dielectric layer 50L.

The first gate dielectric layer 50L contacts the bottom surface and the sidewalls of each of the at least one line trench 49. The first gate dielectric layer 50L can contact all surfaces of the at least one line trench 49. The first gate electrode (52A, MA) comprises planar gate electrode portion (52P, MA) that overlies the horizontally-extending portion of the first gate dielectric layer 50L that overlies the top surface of the semiconductor substrate 8, and comprises at least one gate electrode fin portion 52F located within the at least one line trench 49. Widthwise gate sidewalls of the planar gate electrode portion (52P, MA) can be perpendicular to the first horizontal direction hd1 (and thus, can be parallel to the second horizontal direction hd2), and physically exposed end surfaces of each gate electrode fin portion 52F (also referred to as widthwise fin sidewalls) can be perpendicular to the first horizontal direction hd1. The widthwise gate sidewalls of the planar gate electrode portion (52P, MA) can be laterally spaced apart along the first horizontal direction by the gate length LG, and the physically exposed end surfaces of each gate electrode fin portion 52F can be laterally spaced apart along the first horizontal direction by the gate length LG. The physically exposed end surfaces of each gate electrode fin portion 52F can be vertically coincident with the widthwise gate sidewalls of the planar gate electrode portion (52P, MA), i.e., can be located within the same pair of vertical planes that are perpendicular to the first horizontal direction hd1. Thus, each of the widthwise fin sidewalls of each gate electrode fin portion 52F can be vertically coincident with a respective one of the widthwise gate sidewalls of the planar gate electrode portion (52P, MA).

Referring to FIGS. 20A-20H, electrical dopants can be implanted into portions of the semiconductor material layer 10 that are not masked by the gate stacks to form various source/drain extension regions (31A, 39A, 31B, 39B, 31C, 39C, 31D, 39D). The various source/drain extension regions (31A, 39A, 31B, 39B, 31C, 39C, 31D, 39D) may include, for example, a first source extension region 31A, a first drain extension region 39A, a second source extension region 31B, a second drain extension region 39B, a third source extension region 31C, a third drain extension region 39C, a fourth source extension region 31D, and a fourth drain extension region 39D. Generally, each of the source/drain extension regions (31A, 39A, 31B, 39B, 31C, 39C, 31D, 39D) can have a doping of an opposite conductivity type than the conductivity type of a remaining portion of the transistor active region on which the respective one of the source/drain extension regions (31A, 39A, 31B, 39B, 31C, 39C, 31D, 39D) is formed. For example, if a transistor active region has a doping of a first conductivity type, the source/ drain extension regions (31A, 39A, 31B, 39B, 31C, 39C, 31D, 39D) that are formed within surface regions of the transistor active region has a doping of a second conductivity type that is the opposite of the first conductivity type. For example, if the first conductivity type is p-type, the second conductivity type is n-type, and vice versa. The atomic concentration of dopants in the source/drain extension regions (31A, 39A, 31B, 39B, 31C, 39C, 31D, 39D) may be in a range from $1.0 \times 10^{17}/cm^3$ to $1.0 \times 10^{20}/cm^3$, although lesser and greater dopant concentrations may also be employed.

According to an aspect of the present disclosure, the first source extension region 31A is in contact with end segments of the bottom surface and the sidewalls of each of the at least one line trench 49, and is in contact with a segment of the horizontally-extending portion of the first gate dielectric layer 50L that overlies the top surface of the semiconductor substrate 8. The first drain extension region 39B is in contact with additional end segments of the bottom surface and the sidewalls of each of the at least one line trench 49, and is in contact with another segment of the horizontally-extending portion of the first gate dielectric layer 50L that overlies the top surface of the semiconductor substrate 8. The thickness of each horizontally-extending portion of the source/drain extension regions (31A, 39A, 31B, 39B, 31C, 39C, 31D, 39D) may be in a range from 5 nm to 100 nm, such as from 10 nm to 50 nm, although lesser and greater vertical distances may also be employed. Thus, the thickness of the horizontally-extending portions of the first source/drain extension regions (31A, 39A) that underlie the bottom surface of each line trench 49 may be in a range from 5 nm to 100 nm, such as from 10 nm to 50 nm, although lesser and greater vertical distances may also be employed.

Figure 20C:
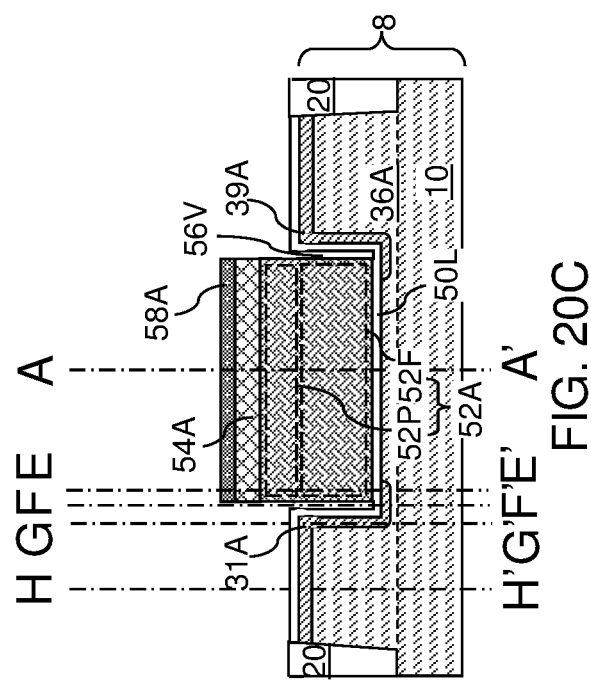
FIG. 20C is a vertical cross-sectional view of the second exemplary structure along the vertical plane C-C' of FIG. 20B.
Figure 20D:
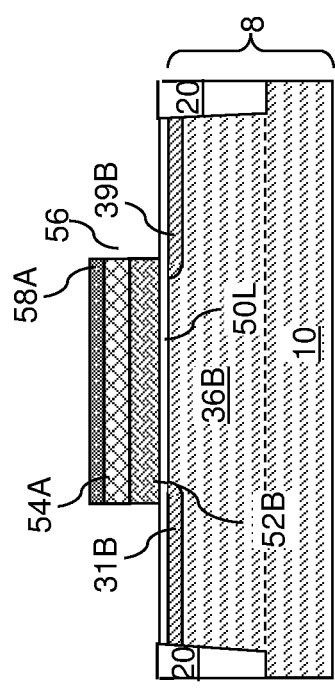
FIG. 20D is a vertical cross-sectional view of the second exemplary structure along the vertical plane D-D' of FIG. 20B.
Figure 20E:
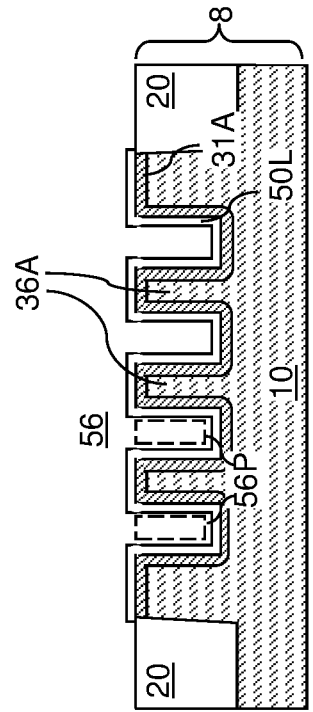
FIG. 20E is a vertical cross-sectional view of the second exemplary structure along the vertical plane E-E' of FIG. 20B.
Figure 20F:
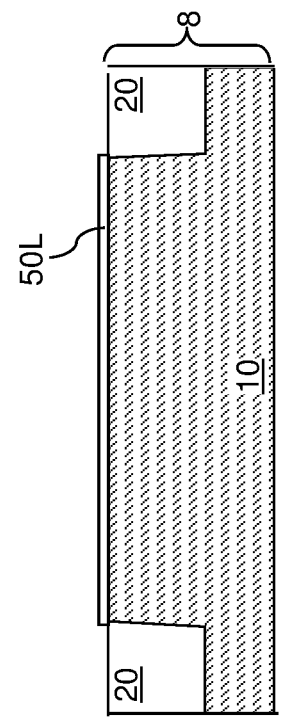
FIG. 20F is a vertical cross-sectional view of the second exemplary structure along the vertical plane F-F' of FIG. 20B.
Figure 20G:
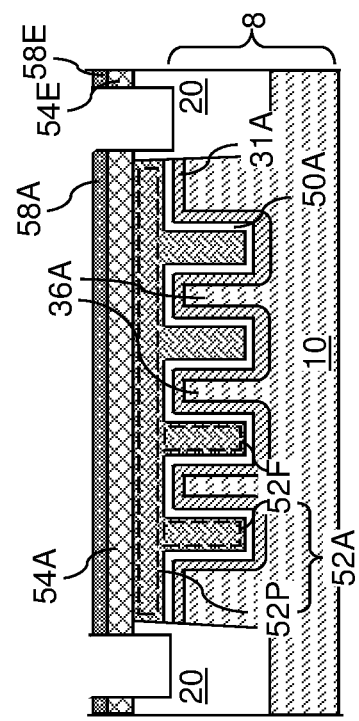
FIG. 20G is a vertical cross-sectional view of the second exemplary structure along the vertical plane G-G' of FIG. 20B.
Figure 20H:
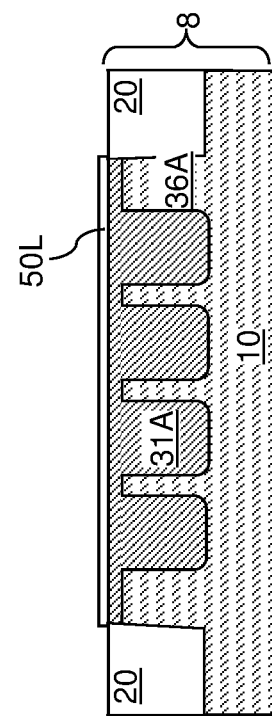
FIG. 20H is a vertical cross-sectional view of the second exemplary structure along the vertical plane H-H' of FIG. 20B.
Figure 21E:
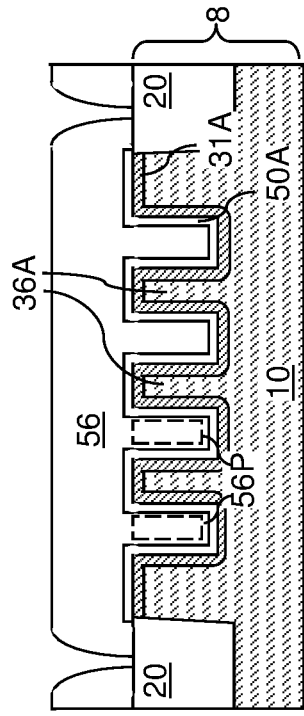
FIG. 21E is a vertical cross-sectional view of the second exemplary structure along the vertical plane E-E' of FIG. 21B.
Figure 21F:
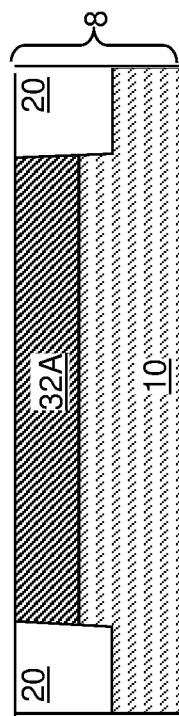
FIG. 21F is a vertical cross-sectional view of the second exemplary structure along the vertical plane F-F' of FIG. 21B.
Figure 21G:
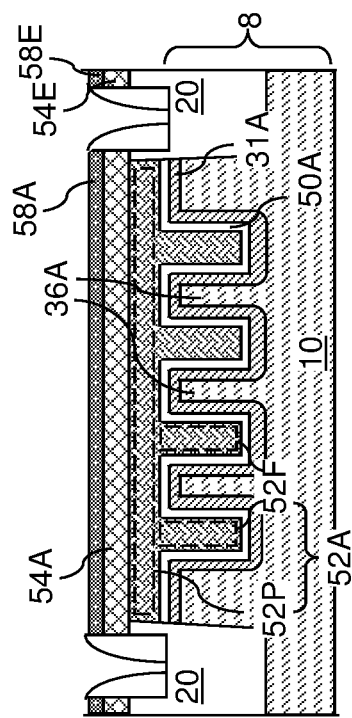
FIG. 21G is a vertical cross-sectional view of the second exemplary structure along the vertical plane G-G' of FIG. 21B.
Figure 21H:
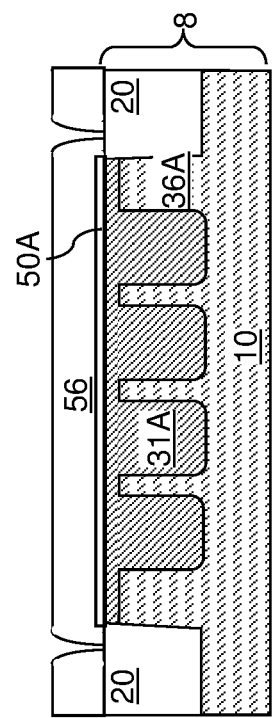
FIG. 21H is a vertical cross-sectional view of the second exemplary structure along the vertical plane H-H' of FIG. 21B.
Figure 22E:
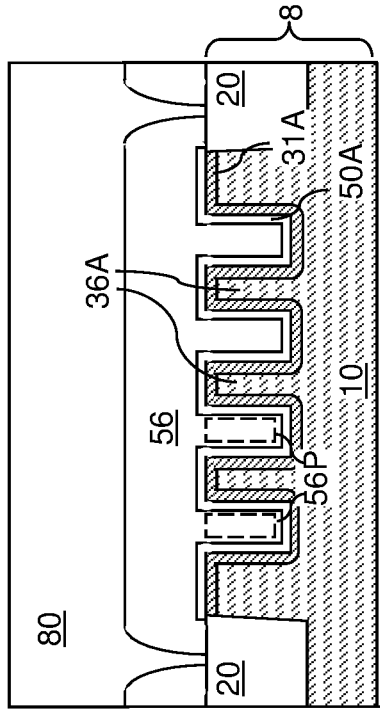
FIG. 22E is a vertical cross-sectional view of the second exemplary structure along the vertical plane E-E' of FIG. 22B.
Figure 22F:
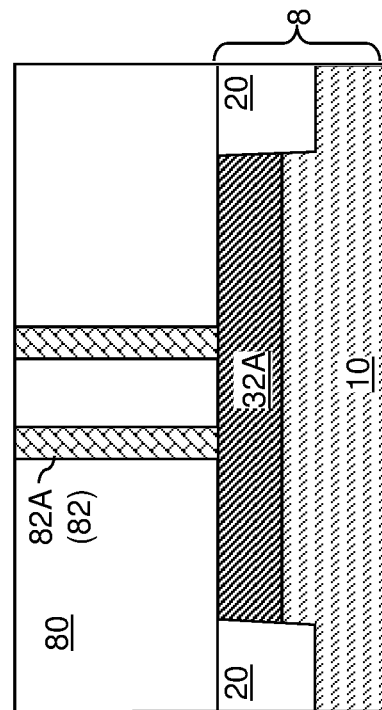
FIG. 22F is a vertical cross-sectional view of the second exemplary structure along the vertical plane F-F' of FIG. 22B.
Figure 22G:
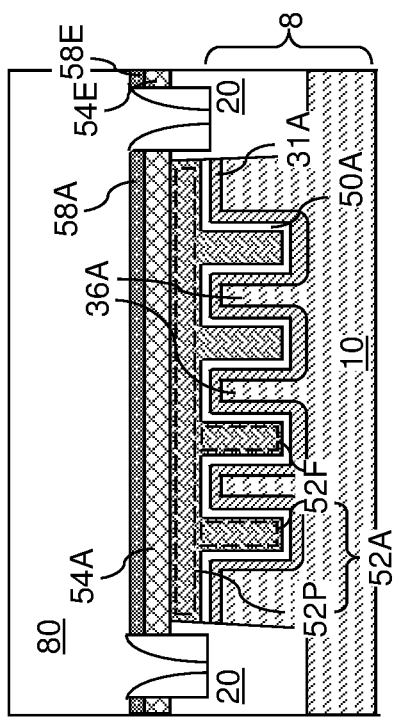
FIG. 22G is a vertical cross-sectional view of the second exemplary structure along the vertical plane G-G' of FIG. 22B.
Figure 22H:
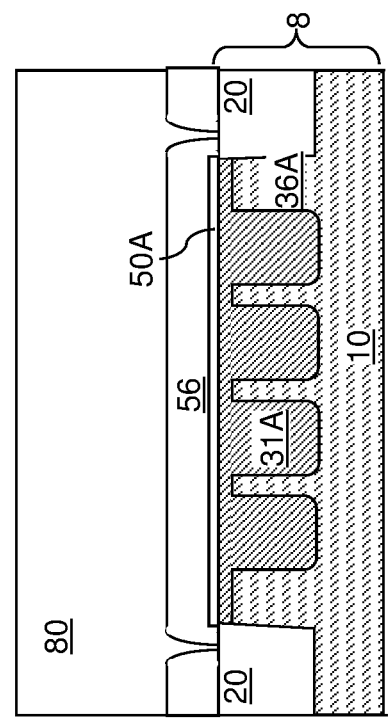
FIG. 22H is a vertical cross-sectional view of the second exemplary structure along the vertical plane H-H' of FIG. 22B.

Generally, straggle of the implanted ions causes the lateral extent of each of the source/drain extension regions (31A, 39A, 31B, 39B, 31C, 39C, 31D, 39D) to extend underneath a periphery of the gate electrodes {(52A, 54A), (52B, 54B), (52C, 54C), (52D, 54D)}, thereby providing a lateral overlap with peripheral portions of the gate electrodes {(52A, 54A), (52B, 54B), (52C, 54C), (52D, 54D)} and the source/drain extension regions (31A, 39A, 31B, 39B, 31C, 39C, 31D, 39D) in a plan view. As shown in FIG. 20G, the lateral straggle of the implanted ions may also cause the implanted ions to by implanted into portions of the semiconductor material layer 10 which form the sidewalls of the line trenches 49 along the second horizontal direction hd2.

Referring to FIGS. 21A-21H, at least one dielectric spacer material layer can be conformally deposited. The at least one dielectric spacer material layer includes a dielectric material, such as silicon oxide and/or silicon nitride, and may be formed by at least one chemical vapor deposition process such as at least one low pressure chemical vapor deposition (LPCVD) process. The at least one dielectric spacer material layer is deposited in the voids 56V in the at least one line trench 49. The voids 56V can be filled with the at least one dielectric spacer material layer.

An anisotropic etch process can be performed to remove horizontally-extending portions of the at least one dielectric spacer material layer. Remaining portion of the at least one dielectric spacer material layer comprise dielectric gate spacers 56 that laterally surround a respective one of the gate electrodes {(52A, 54A), (52B, 54B), (52C, 54C), (52D, 54D)} or a respective one of the dummy gate stacks. For example, one of the dielectric gate spacers 56 (which is herein referred to as a first dielectric gate spacer 56A) laterally surrounds the first gate stack (50A, 52A, MA, 58A). The anisotropic etch process can be continued to remove portions of the gate dielectric layers (SOL, 150L, 250L) that are not masked by the dielectric gate spacers 56. The remaining portions of the first gate dielectric layer SOL comprise a first gate dielectric 50A that is formed in the first device region A, and a second gate dielectric 50B that is formed in the second device region B. A remaining portion of the second gate dielectric layer 150L includes a third gate dielectric 50C that remains in the third device region C. A remaining portion of the third gate dielectric layer 250L include a fourth gate dielectric 50D that remains in the fourth device region D.

The first dielectric gate spacer 56A is formed around the first gate electrode (52A, 54A). As shown in FIG. 21C, the first dielectric gate spacer 56A laterally surrounds the first gate electrode (52A, 54A), and may comprise downward-protruding portions 56P vertically extending into the voids 56V at the respective end portion of the at least one line trench 49. Each of the at least one line trench 49 contains a respective electrode fin portion 52F, and a respective pair of downward-protruding portions 56P of the first dielectric gate spacer 56A.

The first gate dielectric 50A comprises a planar gate dielectric portion located above the horizontal plane including the top surface of the semiconductor substrate 8, and vertically-extending portions that are located within a respective line trench 49. In one embodiment, the first dielectric gate spacer 56A contacts a segment of a top surface of the planar gate dielectric portion of the first gate dielectric 50A and contacts sidewalls of the vertically-extending portions of the first gate dielectric 50A that are located in the at least one line trench 49.

The first dielectric gate spacer 56A comprises at least one pair of downward-protruding portions 56P, which may be a plurality of pairs of downward-protruding portions 56P. The total number of pairs of downward-protruding portions 56P of the first dielectric gate spacer 56A may be the same as the total number of the line trenches 49. Bottom surfaces of the at least one pair of downward-protruding portions 56P of the first dielectric gate spacer 56A can be located within a same horizontal plane as a bottom surface of each of the at least one gate electrode fin portion 56F. In one embodiment, the at least one pair of downward-protruding portions 56P of the first dielectric gate spacer 56A can contact sidewalls of each of the at least one gate electrode fin portion 52F, i.e., the end surfaces of each of the at least one gate electrode fin portion 52F that are perpendicular to the first horizontal direction hd1. In one embodiment, interfaces between the at least one pair of downward-protruding portions 56P of the first dielectric gate spacer 56A and each of the at least one gate electrode fin portion 52F are perpendicular to the first horizontal direction hd1.

A first gate stack (50A, 52A, MA, 58A) can be formed in the first device region A. A second gate stack (50B, 52B, MB, 58B) can be formed in the second device region B. A third gate stack (50C, 52C, MC, 58C) can be formed in the third device region C. A fourth gate stack (50D, 52D, MD, 58D) can be formed in the fourth device region D. The first gate stack (50A, 52A, MA, 58A) includes a first gate dielectric 50A that is a first patterned portion of the first gate dielectric layer 50L, a first semiconductor gate electrode portion 52A that is a patterned portion of the first semiconductor gate electrode material layer 52L and the fin portions 52F, a first metallic gate electrode portion MA that is a patterned portion of the metallic gate electrode material layer ML, and a first gate capping dielectric 58A that is a patterned portion of the gate capping dielectric layer 58L. The second gate stack (50B, 52B, 54B, 58B) includes a second gate dielectric 50B that is a second patterned portion of the first gate dielectric layer 50L, a second semiconductor gate electrode portion 52B that is a patterned portion of the first semiconductor gate electrode material layer 52L, a second metallic gate electrode portion 54B that is a patterned portion of the metallic gate electrode material layer 54L, and a second gate capping dielectric 58B that is a patterned portion of the gate capping dielectric layer 58L. The third gate stack (50C, 52C, 54C, 58C) includes a third gate dielectric 50C that is a patterned portion of the second gate dielectric layer 150L, a third semiconductor gate electrode portion 52C that is a patterned portion of the second semiconductor gate electrode material layer 53L, a third metallic gate electrode portion 54C that is a patterned portion of the metallic gate electrode material layer 54L, and a third gate capping dielectric 58C that is a patterned portion of the gate capping dielectric layer 58L. The fourth gate stack (50D, 52D, 54D, 58D) includes a fourth gate dielectric 50D that is a patterned portion of the third gate dielectric layer 250L, a fourth semiconductor gate electrode portion 52D that is a patterned portion of the second semiconductor gate electrode material layer 53L, a fourth metallic gate electrode portion 54C that is a patterned portion of the metallic gate electrode material layer 54L, and a fourth gate capping dielectric 58D that is a patterned portion of the gate capping dielectric layer 58L.

The first gate dielectric 50A comprises vertically-extending portions and a horizontally-extending portion adjoined to an upper end of each of the vertically-extending portions. The first gate dielectric 50A is formed on and directly contacts the at least one line trench 49 and a segment of a top surface of the first transistor active region located in the first device region A. In one embodiment, the first gate dielectric 50A contacts all surfaces of the at least one line trench 49, such as the plurality of line trenches 49.

In one embodiment, the planar gate electrode portion (52P, 54A) of the first gate electrode (52A, 54A) has widthwise gate sidewalls that are perpendicular to the first horizontal direction hd1 and laterally spaced apart along the first horizontal direction hd1 by the gate length LG, each of the at least one gate electrode fin portion 52F has respective widthwise fin sidewalls (i.e., end surfaces) that are perpendicular to the first horizontal direction hd1 and laterally spaced apart along the first horizontal direction hd1 by the gate length LG. Each of the widthwise fin sidewalls is vertically coincident with a respective one of the widthwise gate sidewalls of the planar gate electrode portion (52P, MA) of the first gate electrode (52A, MA). In one embodiment, the planar gate electrode portion (52P, MA) comprises a pair of lengthwise sidewalls that laterally extend along the first horizontal direction hd1, and a pair of widthwise sidewalls that laterally extend along the second horizontal direction hd2 and having a respective bottom edge that coincides with a top edge of a respective sidewall of a planar horizontally-extending portion of the first gate dielectric 50A that overlies the top surface of the semiconductor substrate 8.

Electrical dopants can be implanted into unmasked portions of the semiconductor material layer 10 that are not masked the gate stacks and the dielectric gate spacers 56 to form various deep source/drain regions (32A, 38A, 32B, 38B, 32C, 38C, 32D, 38D). The various source/deep drain regions (32A, 38A, 32B, 38B, 32C, 38C, 32D, 38D) may include, for example, a first deep source region 32A, a first deep drain region 38A, a second deep source region 32B, a second deep drain region 38B, a third deep source region 32C, a third deep drain region 38C, a fourth deep source region 32D, and a fourth deep drain region 38D. Generally, each of the deep source/drain regions (32A, 38A, 32B, 38B, 32C, 38C, 32D, 38D) can have the same conductivity type as the conductivity type of a respective source/drain extension region (31A, 39A, 31B, 39B, 31C, 39C, 31D, 39D) on which the respective deep source/drain region (32A, 38A, 32B, 38B, 32C, 38C, 32D, 38D) is formed. Generally, the atomic concentration of dopants in the deep source/drain region (32A, 38A, 32B, 38B, 32C, 38C, 32D, 38D) is greater than the atomic concentration of dopants in the source/drain extension regions (31A, 39A, 31B, 39B, 31C, 39C, 31D, 39D). As such, volumes of the source/drain extension regions (31A, 39A, 31B, 39B, 31C, 39C, 31D, 39D) that overlap with volumes of the deep source/drain region (32A, 38A, 32B, 38B, 32C, 38C, 32D, 38D) are incorporated into a respective one of the deep source/drain region (32A, 38A, 32B, 38B, 32C, 38C, 32D, 38D). In one embodiment, the atomic concentration of dopants in the deep source/drain regions (32A, 38A, 32B, 38B, 32C, 38C, 32D, 38D) may be in a range from $5.0 \times 10^{18}/cm^3$ to $2.0 \times 10^{21}/cm^3$, although lesser and greater dopant concentrations may also be employed.

Unimplanted portions of each transistor active region constitutes a respective channel region (36A, 36B, 36C, 36D). Each channel region may have a dopant concentration of the first conductivity type in a range from $1.0 \times 10^{14}/cm^3$ to $1.0 \times 10^{18}/cm^3$, although lesser and greater dopant concentrations may also be employed. The plurality of line trenches 49 extend through the first channel region 36A in the first device region A. Thus, the gate electrode fin portions 52F may protrude vertically (i.e., perpendicular to the major surface of the substrate 8) into the first channel region 36A, such that the bottom surfaces of the gate electrode fin portions 52F are located below the top surface of the first channel region 36A. However, the line trenches may be absent in the second, third and fourth channel regions (36B, 36C, 36D) in the second, third and fourth device regions B, C and D.

Each contiguous combination of a respective one of source/drain extension regions (31A, 39A, 31B, 39B, 31C, 39C, 31D, 39D) and a respective one of the deep source/drain region (32A, 38A, 32B, 38B, 32C, 38C, 32D, 38D) constitutes a source/drain region, which may be a source region including a combination of a source extension region and a deep source region, or may be drain region including a combination of a drain extension region and a deep drain region. Each respective channel region (36A, 36B, 36C, 36D) is located between a respective source region and a respective drain region along the first horizontal direction hd1.

Generally, a first source region (31A, 32A) and a first drain region (39A, 38A) can be formed in the semiconductor substrate 8 by implanting electrical dopants. The first source region (31A, 32A) comprises a first source extension region 31A having a bottommost surface that underlies a horizontal plane including each bottom surface of the at least one line trench 49. The first drain region (39A, 38A) comprises a first drain extension region 39A having a bottommost surface that underlies the horizontal plane including each bottom surface of the at least one line trench 49. The first deep source region 32A and the first deep drain region 38A can be located in the semiconductor substrate 8, and can be laterally spaced from each other by the at least one line trench 49. The first source extension region 31A is adjoined to the first deep source region 32A to provide a first source region (31A, 32A). The first drain extension region 39A is adjoined to the first deep drain region 38A to provide a first drain region (39A, 38A).

In one embodiment, a bottommost surface of the first source extension region 31A is located at a greater depth than a bottom surface of the deep source region 32A from a horizontal plane including an interface between the semiconductor substrate 8 and the planar gate dielectric portion of the first gate dielectric 50A. In one embodiment, a bottommost surface of the first drain extension region 39A is located at a greater depth than a bottom surface of the deep drain region 38A from the horizontal plane including the interface between the semiconductor substrate 8 and the planar gate dielectric portion of the first gate dielectric 50A. In one embodiment, a bottom surface of a horizontally-extending portion of the first source extension region 31A can be laterally offset from the at least one line trench 49, and can be located at a lesser depth than the bottom surface of the first deep source region 32A from the horizontal plane including the interface between the semiconductor substrate 8 and the planar gate dielectric portion of the first gate dielectric 50A. In one embodiment, a bottom surface of a horizontally-extending portion of the first drain extension region 39A can be laterally offset from the at least one line trench 49, and can be located at a lesser depth than the bottom surface of the first deep drain region 38A from the horizontal plane including the interface between the semiconductor substrate 8 and the planar gate dielectric portion of the first gate dielectric 50A.

Generally, a source region and a drain region can be formed in portions of each transistor active region that are laterally spaced from each other by a respective channel region a plan view. For example, a first source region (31A, 32A) and a first drain region (39A, 38A) can be formed in portions of the first transistor active region that are laterally spaced from each other by the first channel region 36A in the plan view. The first channel region 36A comprises a portion of the first transistor active region and laterally surrounds and underlies each of the plurality of line trenches 49. The first gate dielectric 50A contacts all surfaces of the line trenches 49, and comprises a planar gate dielectric portion that extends over the entirety of the top surface of the first channel region 36A and gate electrode fin portions 52F which are located in the line trenches 49 and extend into the first channel region 36A.

In one embodiment, the planar gate electrode portion (52P, MA) of the first gate electrode (52A, MA) comprises a vertical stack including a planar semiconductor gate electrode portion 52P that is adjoined to the at least one gate electrode fin portion 52F, and a planar metallic gate electrode portion MA that overlies the planar semiconductor gate electrode portion 52P. In one embodiment, the planar semiconductor gate electrode portion 52P and the at least one gate electrode fin portion 52F consist of a same doped semiconductor material.

In one embodiment, the planar gate dielectric portion (52P, MA) of the first gate electrode (52A, MA) comprises a first pair of lengthwise sidewalls that are sidewalls of the planar semiconductor gate electrode portion 52P, and a second pair of lengthwise sidewalls that are sidewalls of the metallic gate electrode portion MA. The first pair of lengthwise sidewalls and the second pair of lengthwise sidewalls laterally extend along the first horizontal direction hd1. The first pair of lengthwise sidewalls (which are sidewalls of the planar semiconductor gate electrode portion 52P) contact a respective sidewall segment of the shallow trench isolation structure 20.

In one embodiment, a top surface of the planar semiconductor gate electrode portion 52P is located within a horizontal plane including a top surface of the shallow trench isolation structure 20. In one embodiment, the planar metallic gate electrode portion MA has a same lateral extent as the planar semiconductor gate electrode portion 52P along the first horizontal direction hd1, and the planar metallic gate electrode portion MA has a greater lateral extent than the planar semiconductor gate electrode portion 52P along a second horizontal direction hd2 that is perpendicular to the first horizontal direction hd1 and contacts surface segments of a top surface of the shallow trench isolation structure 20.

Generally, a source region and a drain region of each field effect transistor can be embedded in the semiconductor substrate 8, and can be laterally spaced from each other by a respective channel region. In one embodiment, the channel region, the source region, and the drain region of each field effect transistor comprise a respective portion of a single crystalline semiconductor material within the semiconductor substrate 8. The semiconductor gate electrode portions (52A, 52B, 52C, 52D) may include a respective doped polycrystalline semiconductor material portion. Thus, the at least one gate electrode fin 52F may comprise a respective doped polycrystalline semiconductor material portion.

A first field effect transistor 60A is formed in the first device region A. The first field effect transistor 60A may be a high voltage word line switching transistor for a three dimensional NAND memory device. In the first field effect transistor 60A, the first channel region 36A can have a doping of a first conductivity type, and the source region (31A, 32A) and the drain region (39A, 38A) can have a doping a second conductivity type that is an opposite of the first conductivity type. All surfaces of the at least one line trench 49 may be surfaces of the first channel region 36A.

A second field effect transistor 60B can be provided in the second device region B. A second transistor active region that comprises an additional portion of the semiconductor substrate 8 can be provided in the second device region B. The second field effect transistor 60B can be located on the second transistor active region, and can an additional gate dielectric (such as the second gate dielectric 50B) that consists of an additional planar gate dielectric portion that contacts a top surface of the second transistor active region, and having the same thickness and the same material composition as the first gate dielectric 50A. The first gate dielectric 50A and the second gate dielectric 50B may consist of a semiconductor oxide of the material of the semiconductor substrate 8 (such as thermal silicon oxide) and may have a same thickness throughout. A third field effect transistor 60C can be provided in the third device region C, and a fourth field effect transistor 60D can be provided in the fourth device region D. In one embodiment, the first field effect transistor and the second field effect transistor may be high voltage field effect transistors, the third field effect transistor may be a low voltage field effect transistor, and the fourth field effect transistor may be a very low voltage field effect transistor.

FIGS. 22A-22H, at least one dielectric liner (not shown) can be optionally formed over the physically exposed surfaces of the second exemplary structure by at least one conformal deposition process. The at least one dielectric liner, if present, may comprise, for example, a stack of a silicon oxide liner and a silicon nitride liner. A contact-level dielectric layer 80 can be deposited over the gate stacks, the source/drain regions, the shallow trench isolation structure 20, and the optional at least one dielectric liner. The contact-level dielectric layer 80 comprises a dielectric material, such as silicon oxide. A planarization process such as a chemical mechanical planarization process can be optionally performed to planarize the top surface of the contact-level dielectric layer 80. The vertical distance between the top surface of the contact-level dielectric layer 80 and the top surfaces of the gate capping dielectrics (58A, 58B, 58C, 58D) may be in a range from 50 nm to 500 nm, although lesser and greater vertical distances may also be employed.

Contact via voids can be formed through the contact-level dielectric layer 80, and can be filled with at least one conductive material. Excess portions of the at least one conductive material can be removed from above the horizontal plane including the top surface of the contact-level dielectric layer 80 by a planarization process, which may include a recess etch process and/or a chemical mechanical planarization process. Each remaining portion of the at least one conductive material constitutes a contact via structure (82, 85, 88). The contact via structures (82, 85, 88) may comprise source contact via structures 82 contacting a respective one of the source regions, drain contact via structures 88 contacting a respective one of the drain regions, and gate contact via structures 85 contacting a respective one of the gate electrodes. The source contact via structures 82 may comprise a first source contact via structure 82A contacting a first deep source region 32A, a second source contact via structure 82B contacting a second deep source region 32B, a third source contact via structure 82C contacting a third deep source region 32C, and a fourth source contact via structure 82D contacting a fourth deep source region 32D. The drain contact via structures 88 may comprise a first drain contact via structure 88A contacting a first deep drain region 38A, a second drain contact via structure 88B contacting a second deep drain region 38B, a third drain contact via structure 88C contacting a third deep drain region 38C, and a fourth drain contact via structure 88D contacting a fourth deep drain region 38D. The gate contact via structures 85 may comprise at least one first gate contact via structure 85A contacting the first metallic gate electrode portion 54A, at least one second gate contact via structure 85B contacting the second metallic gate electrode portion 54B, a third gate contact via structure 85C contacting the third metallic gate electrode portion 54C, and a fourth gate contact via structure 85D contacting the fourth metallic gate electrode portion 54D.

The second exemplary structure can be derived from the first exemplary structure described above by altering the relative dimensions of the planar gate electrode portion (52P, 54A) and the at least one gate electrode fin portion 52F along the first horizontal direction hd1. Specifically, the planar gate electrode portion (52P, 54A) of the first field effect transistor 60A can have a gate length along the first horizontal direction hd1 (i.e., the distance between a pair of sidewalls that are perpendicular to the first horizontal direction hd1) that is less than the length of the at least one gate electrode fin portion 52F along the first horizontal direction hd1. The lateral thickness of each dielectric gate spacer 56 can be selected such that the a first dielectric gate spacer 56 that laterally surrounds the planar gate electrode portion (52P, 54A) of the first field effect transistor 60A covers all segments of the top surface of the at least one gate electrode fin portion 52F that is not covered by the planar gate electrode portion (52P, 54A). Thus, the entire area of the at least one gate electrode fin portion 52F can be covered by the combination of the planar gate electrode portion (52P, 54A) and the first dielectric gate spacer 56. In one embodiment, each portion of the semiconductor substrate 8 that the first dielectric gate spacer 56 contacts may comprise a first source extension region 31A or a first drain extension region 39A. In case a plurality of gate electrode fin portions 52F are formed, portions of the first source extension region 31A may protrude between neighboring pairs of first end segments of the plurality of gate electrode fin portions 52F, and portions of the first drain extension region 39A may protrude between neighboring pairs of second end segments of the plurality of gate electrode fin portions 52F. Lengthening the at least one gate electrode fin portion 52F along the first horizontal direction hd1 relative to the gate length of the planar gate electrode portion (52P, MA) along the first horizontal direction hd1 provides the advantage of the channel length being controlled by the length of the at least one gate electrode fin portion 52F for the first channel region 36A.

Figure 23E:
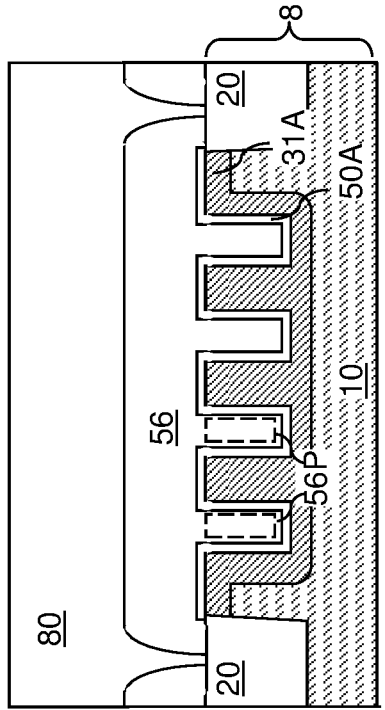
FIG. 23E is a vertical cross-sectional view of the second exemplary structure along the vertical plane E-E' of FIG. 23B.
Figure 23F:
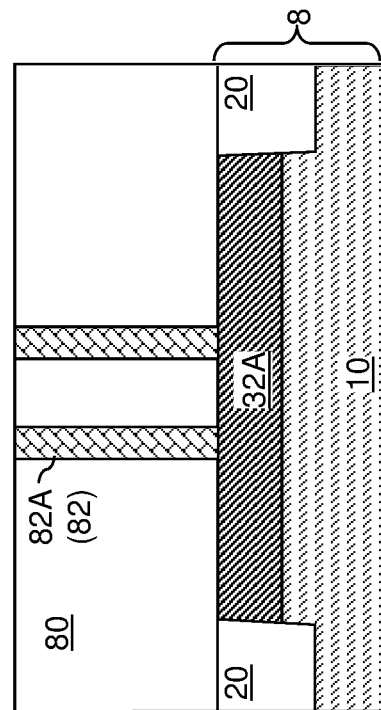
FIG. 23F is a vertical cross-sectional view of the second exemplary structure along the vertical plane F-F' of FIG. 23B.
Figure 23G:
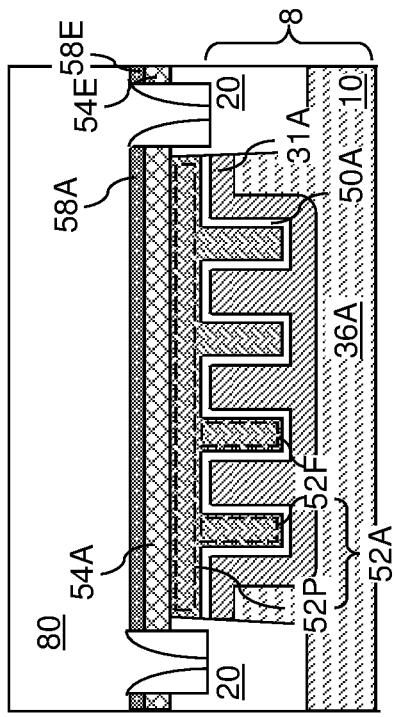
FIG. 23G is a vertical cross-sectional view of the second exemplary structure along the vertical plane G-G' of FIG. 23B.
Figure 23H:
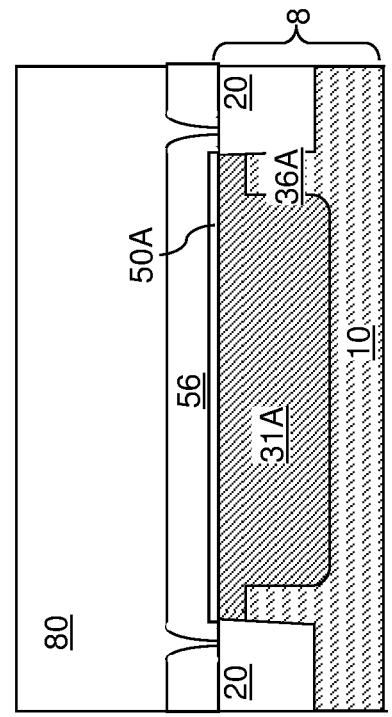
FIG. 23H is a vertical cross-sectional view of the second exemplary structure along the vertical plane H-H' of FIG. 23B.

Referring to FIGS. 23A-23H, an alternative embodiment of the second exemplary structure can be derived from the second exemplary structure by altering the trench spacing ST such that the trench spacing ST is less than twice the lateral straggle range of the source/drain extension regions (31A, 31B, 31C, 31D, 39A, 39B, 39C, 39D). In this case, vertically-extending portions of the first source extension region 31A that are located on sidewalls of the line trenches 49 may merge, and the portion of the first channel region 36A located between neighboring pairs of the line trenches 49 may be eliminated, as shown in FIGS. 23E-23G. Thus, the first channel region 36A is only located below the line trenches 49. The first source-extension region 31A may comprise a bottom surface that continuously extends underneath first end portions of a plurality of line trenches 49. Likewise, vertically-extending portions of the first drain extension region 39A that are located on sidewalls of the line trenches 49 may merge, and the portion of the first channel region 36A located between neighboring pairs of the line trenches 49 may be eliminated. The first drain-extension region 39A may comprise a bottom surface that continuously extends underneath first end portions of a plurality of line trenches 49.

Figure 24:
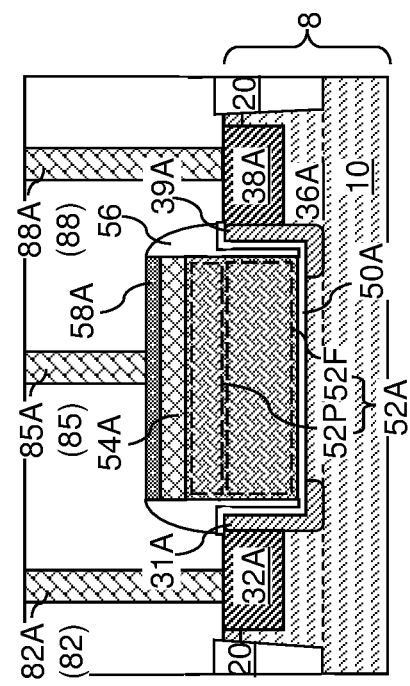
FIG. 24 is a vertical cross-sectional view of another alternative embodiment of the second exemplary structure after formation of contact via structures according to the second embodiment of the present disclosure.

Referring to FIG. 24, another alternative embodiment of the second exemplary structure can be derived from the second exemplary structure of FIGS. 22A-22H or from the alternative embodiment of the second exemplary structure of FIGS. 23A-23H by selecting the width of the gate spacers 56 such that a vertically-extending sidewall of the first source extension region 31A contacts a sidewalls of the first deep source region 32A, and a vertically-extending sidewall of the first drain extension region 39A contacts a sidewalls of the first deep drain region 38A.

Referring to all drawings and according to the first and second embodiments of the present disclosure, a semiconductor structure is provided, which comprises: a semiconductor substrate 8 containing a shallow trench isolation structure 20 that laterally surrounds a first transistor active region that is a portion of the semiconductor substrate 8; and a first field effect transistor comprising: at least one line trench 49 extending downward from a top surface of the first transistor active region, laterally extending along a first horizontal direction hd1, and located within the transistor active region; a channel region 36A comprising a portion of the first transistor active region that laterally surrounds or underlies the at least one line trench 49; a gate dielectric (such as a first gate dielectric 50A) contacting all surfaces of the at least one line trench 49 and comprising a planar gate dielectric portion that extends over an entirety of a top surface of the channel region; a gate electrode (such as the first gate electrode (52A, 54A) comprising a planar gate electrode portion (52P, 54A) that overlies the top surface of the planar gate dielectric portion and at least one gate electrode fin portion 52F located within the at least one line trench 49; and a source region (31A, 32A) and a drain region (39A, 38A) located in the semiconductor substrate 8 and laterally spaced from each other by the channel region 36A. The planar gate electrode portion 52P physically contacts at least one gate electrode fin portion 52F. For example, the planar gate electrode portion 52P may physically contact and electrically connect tops of a plurality of the gate electrode fin portions 52F.

According to the second embodiment of the present disclosure, a field effect transistor 60A comprise: at least one line trench 49 extending downward from a top surface of a first transistor active region in a substrate, and laterally extending along a first horizontal direction hd1; a gate dielectric 50A contacting a bottom surface and sidewalls of each of the at least one line trench 49 and comprising a planar gate dielectric portion overlying the substrate; a gate electrode (52A, MA) comprising a planar gate electrode portion (52P, MA) that overlies the planar gate dielectric portion and at least one gate electrode fin portion 52F located within the at least one line trench 49; and a dielectric gate spacer 56A laterally surrounding the gate electrode (52A, MA) and comprising at least one pair of downward-protruding portions 56P vertically extending into the at least one line trench 49.

Embodiments of the present disclosure can be employed to provide a high voltage field effect transistor with gate fins (such as the gate electrode fin portion 52F). The line trenches and the gate electrode fin portions 52F has the effect of increasing the channel area per unit device area as seen in a plan view. Therefore, the width of the first field effect transistor 60A along the second horizontal direction may be reduced by at least 30%, such as 30 to 40% without a corresponding increase in the substrate bias threshold voltage increase. Furthermore, the smaller width does not reduce the channel surface area, which in turn does not negatively change the gate dielectric capacitance. The smaller width increases the device density. Furthermore, the substrate sensitivity of the first field effect transistor 60A may be reduced without reducing the depletion width.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
a semiconductor substrate containing a shallow trench isolation structure that laterally surrounds a first transistor active region that is a portion of the semiconductor substrate; and
a first field effect transistor comprising:
at least one line trench extending downward from a top surface of the first transistor active region, laterally extending along a first horizontal direction, and located within the first transistor active region;
a channel region comprising a portion of the first transistor active region that laterally surrounds or underlies the at least one line trench;
a gate dielectric contacting all surfaces of the at least one line trench and comprising a planar gate dielectric portion that extends over an entirety of a top surface of the channel region;
a gate electrode comprising a planar gate electrode portion that overlies the planar gate dielectric portion and at least one gate electrode fin portion located within the at least one line trench; and
a source region and a drain region located in the semiconductor substrate and laterally spaced from each other by the channel region;
wherein the planar gate dielectric portion comprises a pair of sidewalls that laterally extend along the first horizontal direction and contacting a respective sidewall segment of the shallow trench isolation structure.

2. A semiconductor structure, comprising:
a semiconductor substrate containing a shallow trench isolation structure that laterally surrounds a first transistor active region that is a portion of the semiconductor substrate; and
a first field effect transistor comprising:
at least one line trench extending downward from a top surface of the first transistor active region, laterally extending along a first horizontal direction, and located within the first transistor active region;
a channel region comprising a portion of the first transistor active region that laterally surrounds or underlies the at least one line trench;
a gate dielectric contacting all surfaces of the at least one line trench and comprising a planar gate dielectric portion that extends over an entirety of a top surface of the channel region;
a gate electrode comprising a planar gate electrode portion that overlies the planar gate dielectric portion and at least one gate electrode fin portion located within the at least one line trench; and
a source region and a drain region located in the semiconductor substrate and laterally spaced from each other by the channel region;
wherein the planar gate electrode portion comprises a vertical stack including:
a planar semiconductor gate electrode portion that is adjoined to the at least one gate electrode fin portion; and
a planar metallic gate electrode portion that overlies the planar semiconductor gate electrode portion; and
wherein a top surface of the planar semiconductor gate electrode portion is located within a horizontal plane including a top surface of the shallow trench isolation structure.

3. A semiconductor structure, comprising:
a semiconductor substrate containing a shallow trench isolation structure that laterally surrounds a first transistor active region that is a portion of the semiconductor substrate; and
a first field effect transistor comprising:
at least one line trench extending downward from a top surface of the first transistor active region, laterally extending along a first horizontal direction, and located within the first transistor active region;
a channel region comprising a portion of the first transistor active region that laterally surrounds or underlies the at least one line trench;
a gate dielectric contacting all surfaces of the at least one line trench and comprising a planar gate dielectric portion that extends over an entirety of a top surface of the channel region;

a gate electrode comprising a planar gate electrode portion that overlies the planar gate dielectric portion and at least one gate electrode fin portion located within the at least one line trench; and a source region and a drain region located in the semiconductor substrate and laterally spaced from each other by the channel region;

wherein the planar gate electrode portion comprises a vertical stack including:

a planar semiconductor gate electrode portion that is adjoined to the at least one gate electrode fin portion; and a planar metallic gate electrode portion that overlies the planar semiconductor gate electrode portion;

wherein:

the planar metallic gate electrode portion has a same lateral extent as the planar semiconductor gate electrode portion along the first horizontal direction; and the planar metallic gate electrode portion has a greater lateral extent than the planar semiconductor gate electrode portion along a second horizontal direction that is perpendicular to the first horizontal direction and contacts surface segments of a top surface of the shallow trench isolation structure.

\* \* \* \* \*